(12) United States Patent
Lin et al.

(10) Patent No.: US 11,688,643 B2
(45) Date of Patent: Jun. 27, 2023

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Chih-Han Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 96 days.

(21) Appl. No.: 17/245,537

(22) Filed: Apr. 30, 2021

(65) Prior Publication Data

US 2022/0352031 A1    Nov. 3, 2022

(51) Int. Cl.
*H01L 21/8234*    (2006.01)
*H01L 27/088*    (2006.01)

(52) U.S. Cl.
CPC .......... *H01L 21/823456* (2013.01); *H01L 21/823431* (2013.01); *H01L 21/823468* (2013.01); *H01L 27/0886* (2013.01)

(58) Field of Classification Search
CPC ..... H01L 21/823456; H01L 21/823431; H01L 27/0886
See application file for complete search history.

(56) References Cited

U.S. PATENT DOCUMENTS

| | | | |
|---|---|---|---|
| 2018/0175172 A1* | 6/2018 | Chang | H01L 29/267 |
| 2018/0277534 A1* | 9/2018 | Huang | H01L 29/785 |
| 2019/0371674 A1* | 12/2019 | Wu | H01L 21/823431 |
| 2021/0125875 A1* | 4/2021 | Tsai | H01L 27/0886 |

* cited by examiner

*Primary Examiner* — Christine A Enad
(74) *Attorney, Agent, or Firm* — Foley & Lardner LLP

(57) ABSTRACT

A semiconductor device may be formed by forming a first fin and a second fin in a first area and a second area of a substrate, respectively; which may be followed by forming of a first dummy gate structure and a second dummy gate structure straddling the first fin and second fin, respectively and forming a sacrificial layer extending along a bottom portion of the second dummy gate structure. The first dummy gate structure may be replaced with a first metal gate structure, while the second dummy gate structure and the sacrificial layer may be replaced with a second metal gate structure.

16 Claims, 47 Drawing Sheets

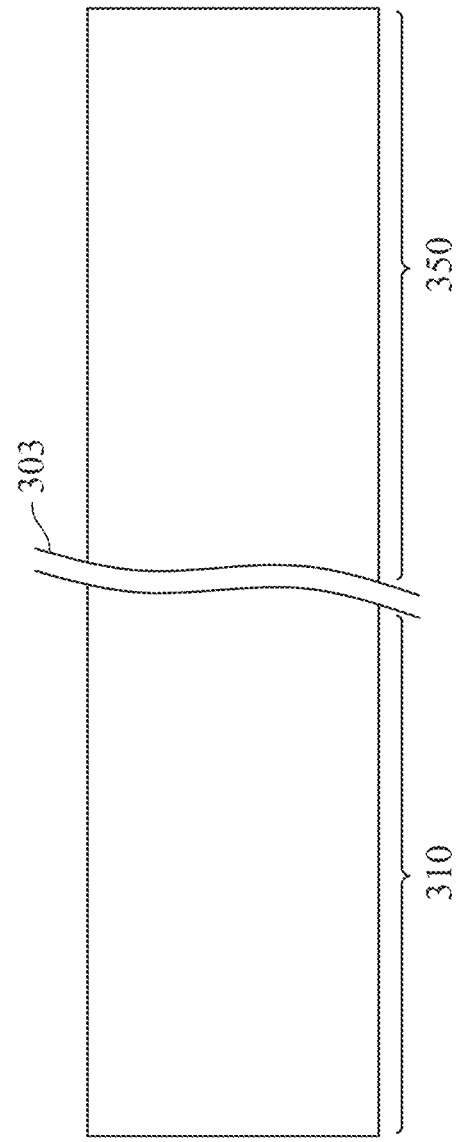

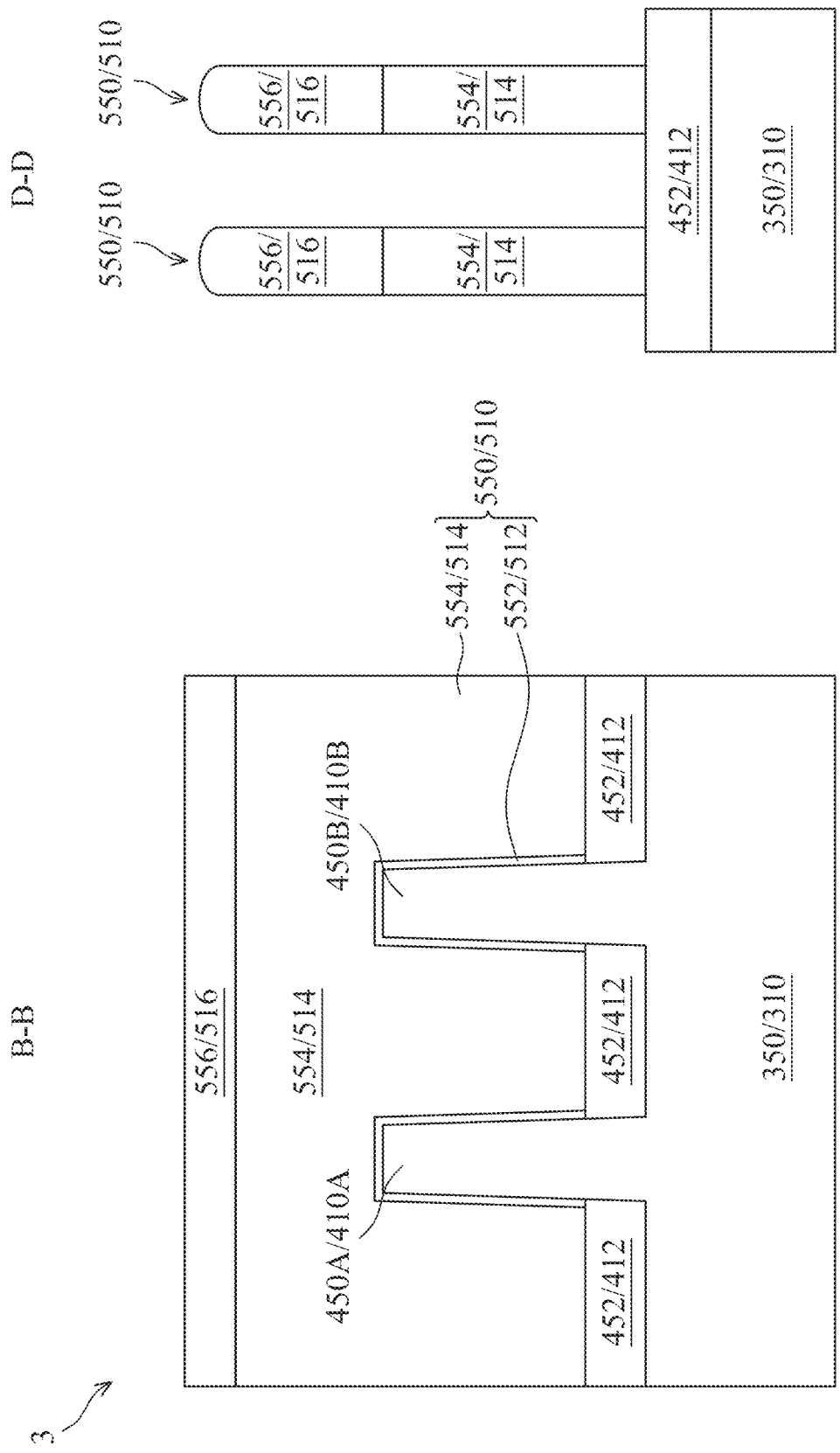

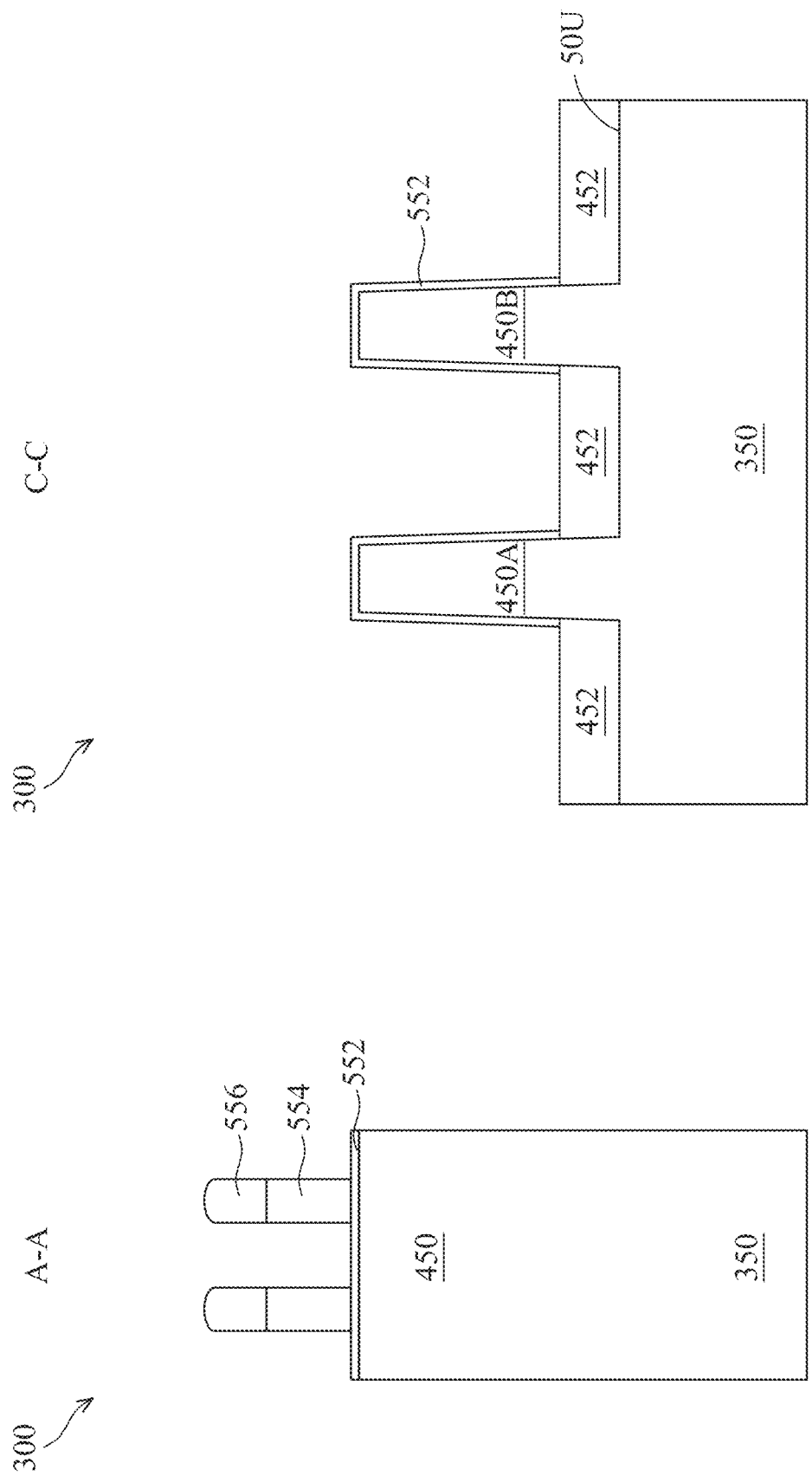

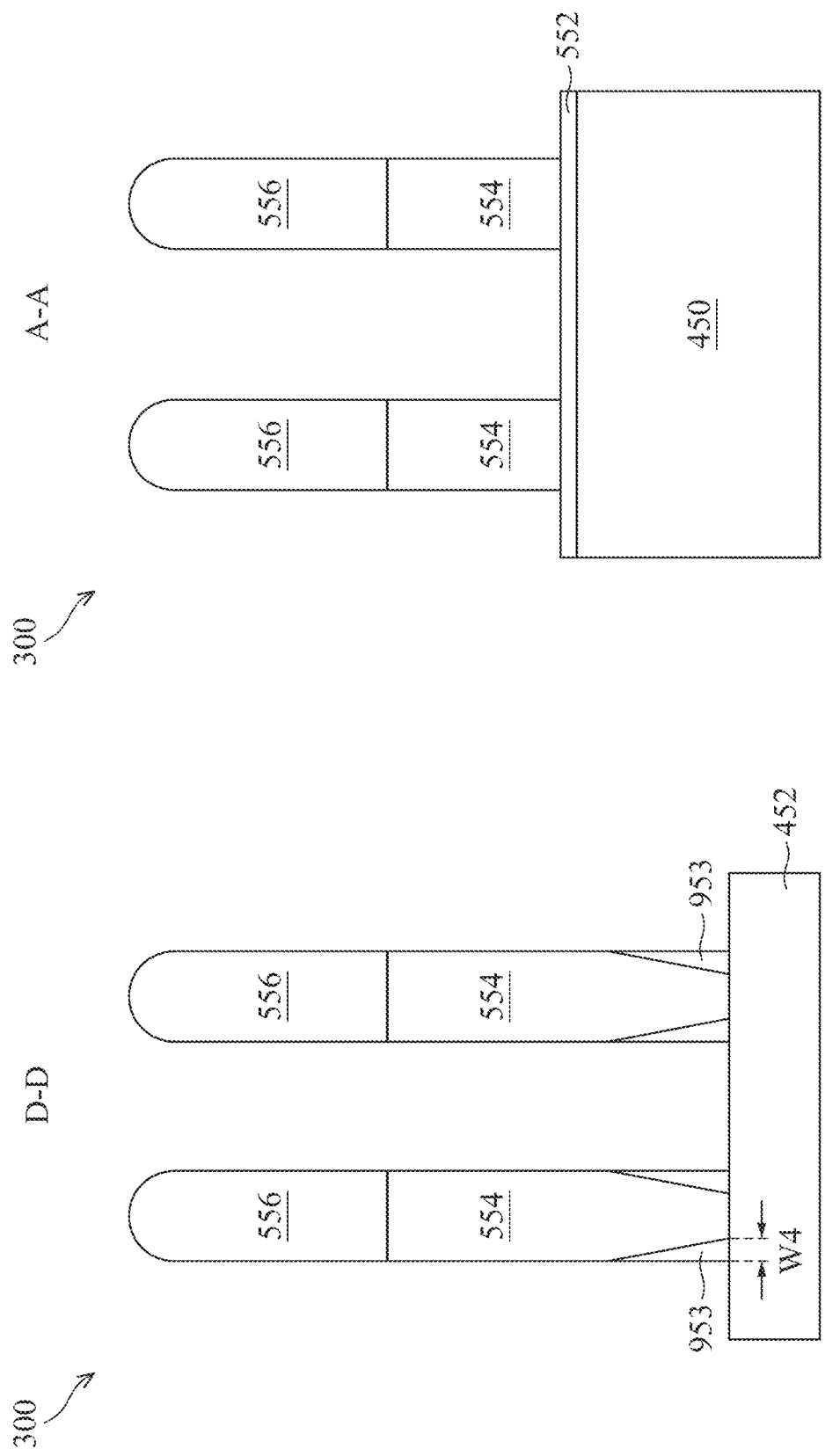

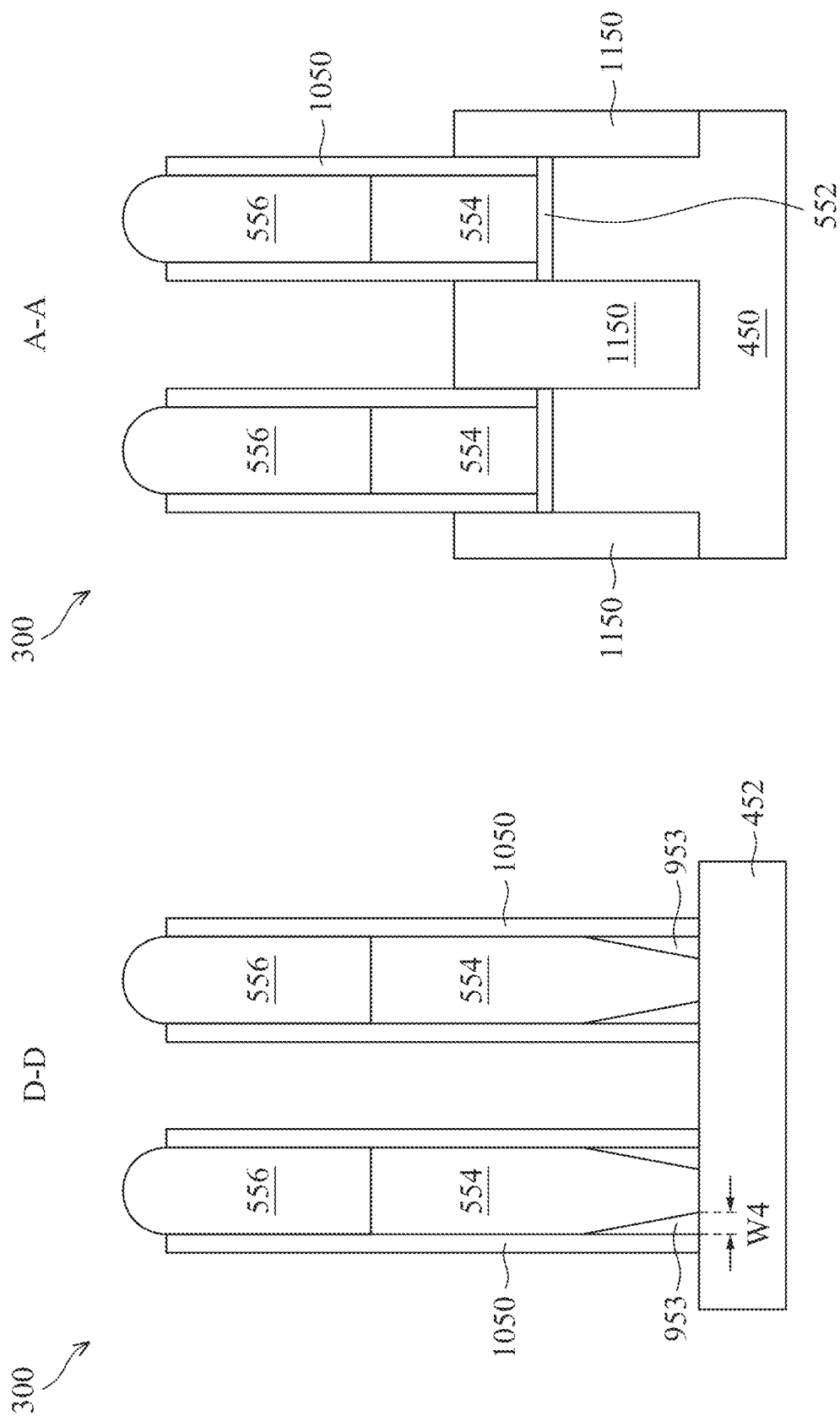

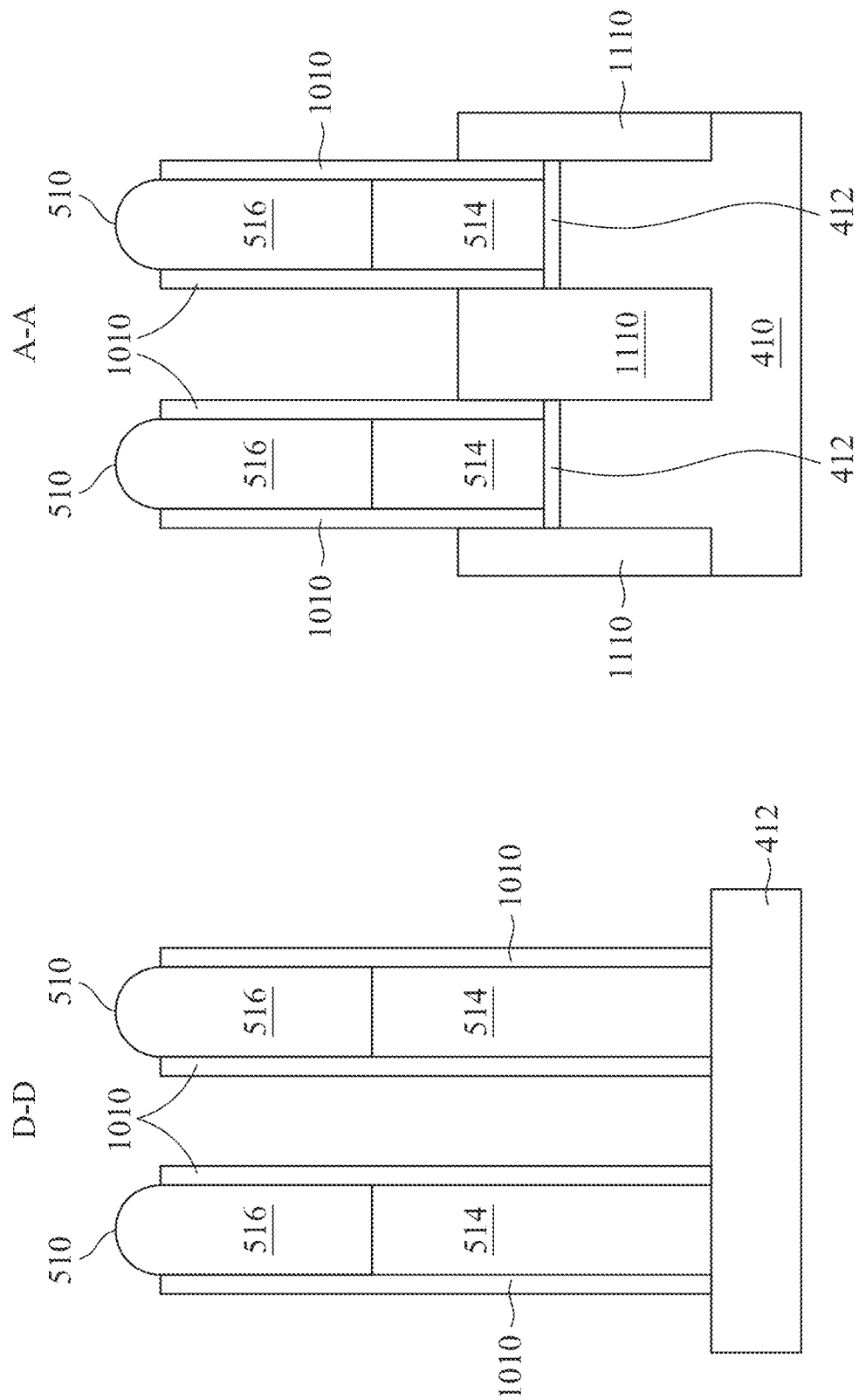

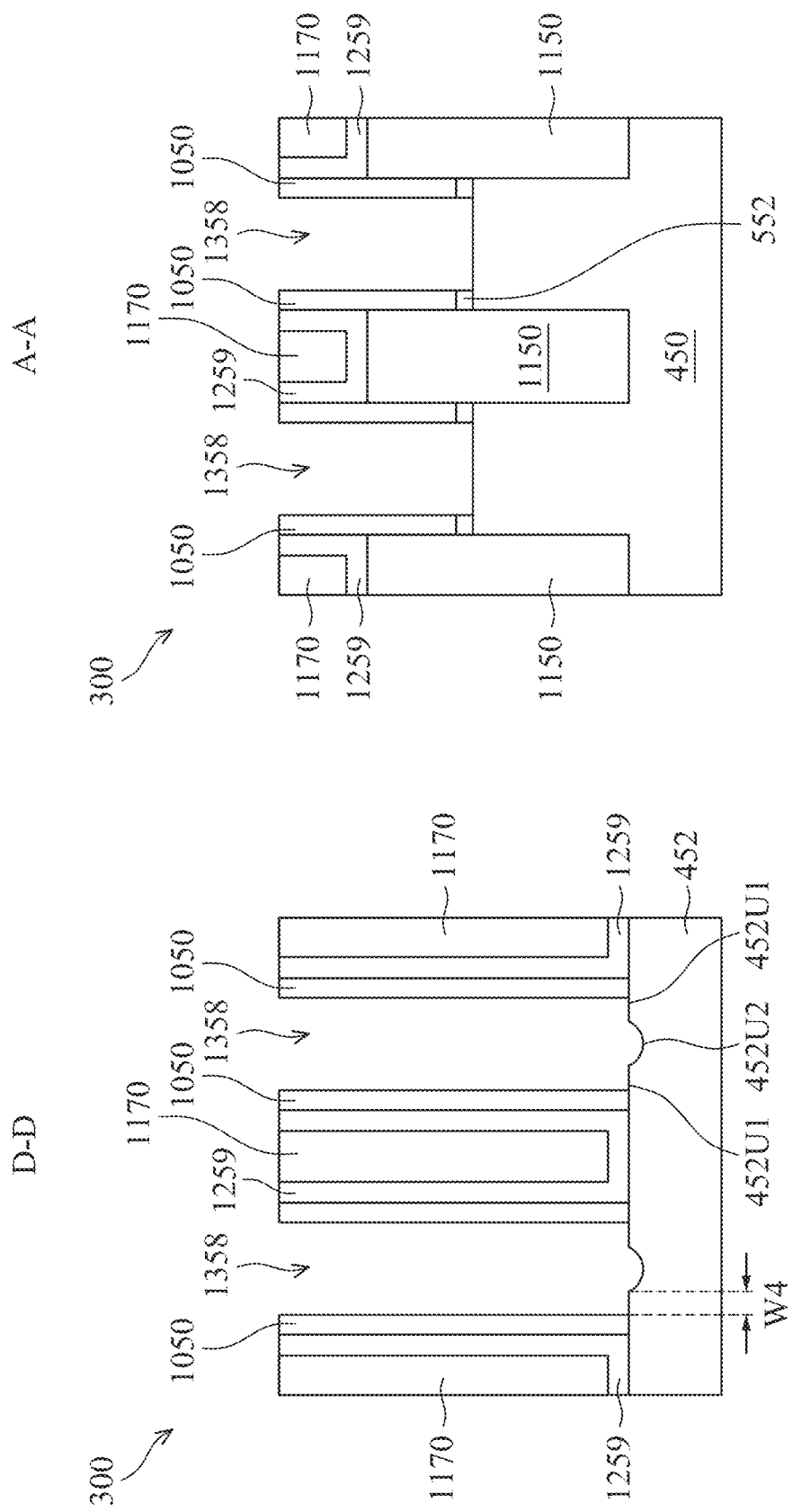

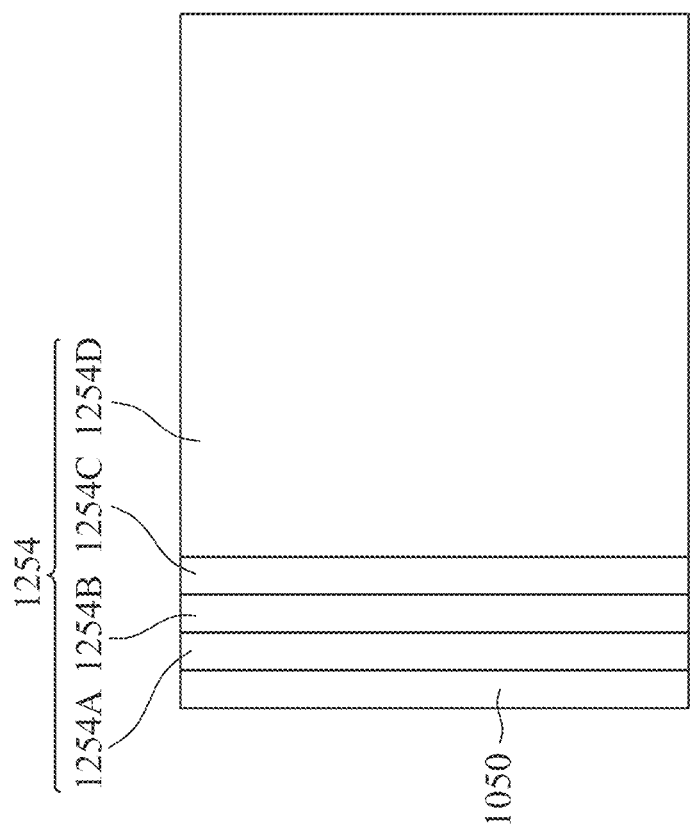

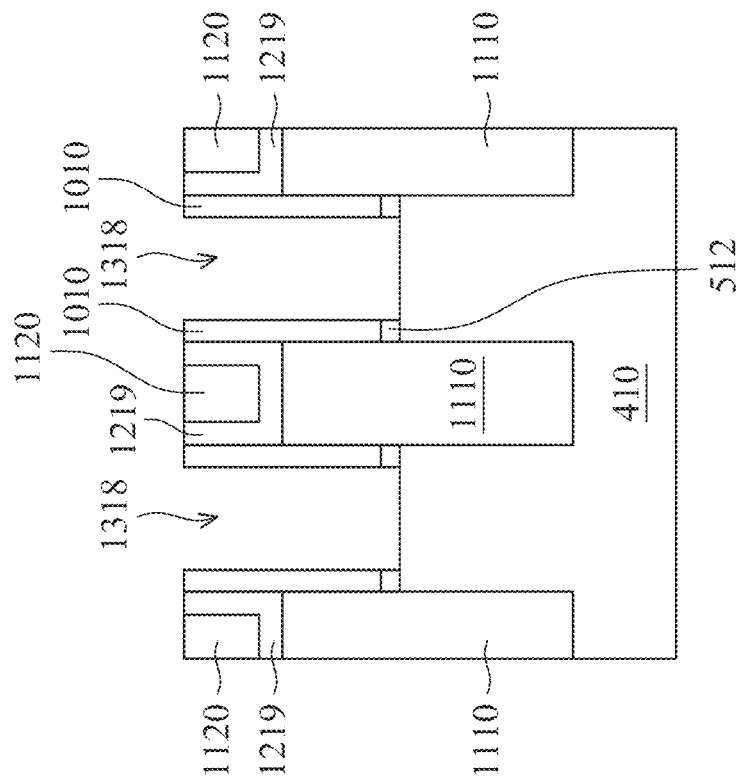
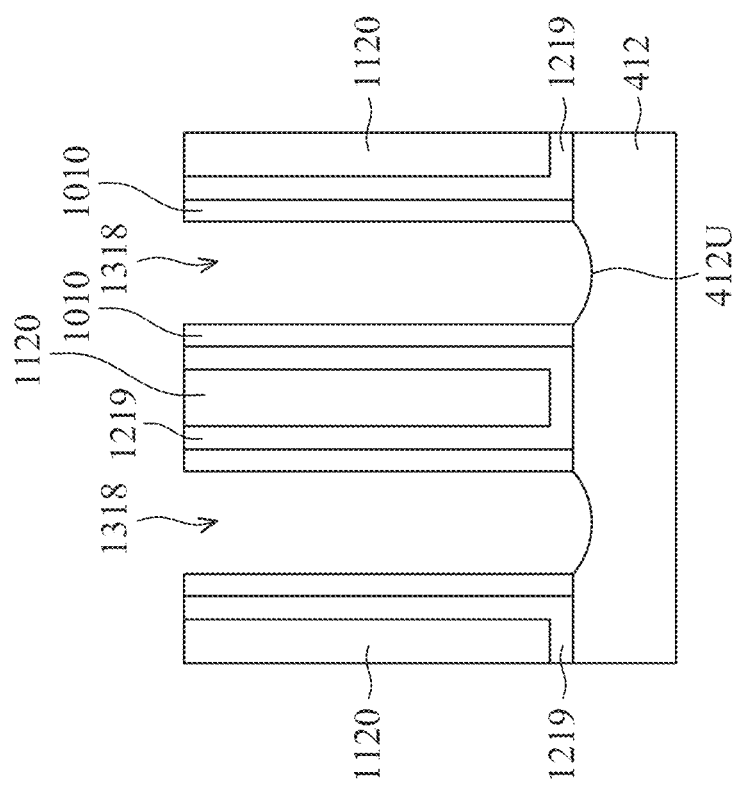
Figure 20B
Figure 20A

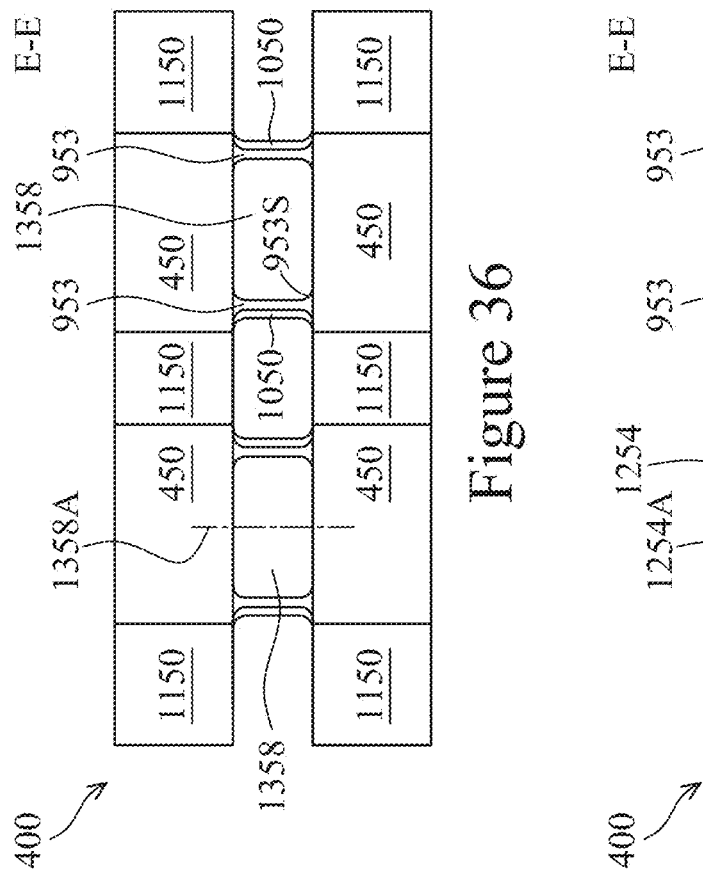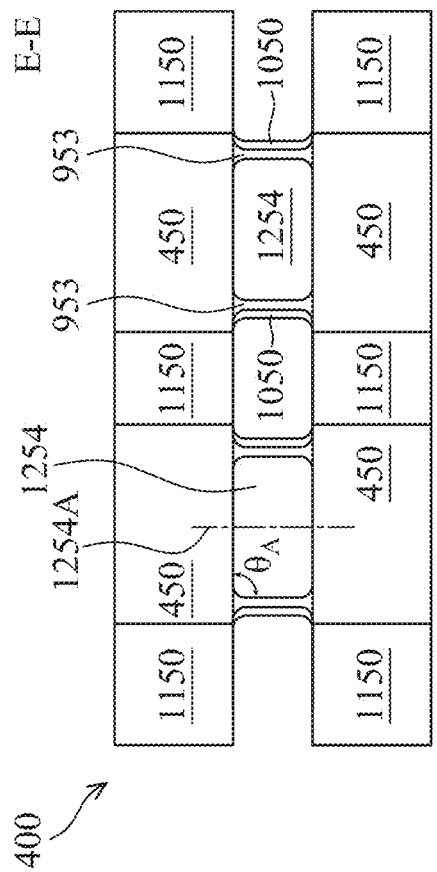
Figure 36
Figure 37

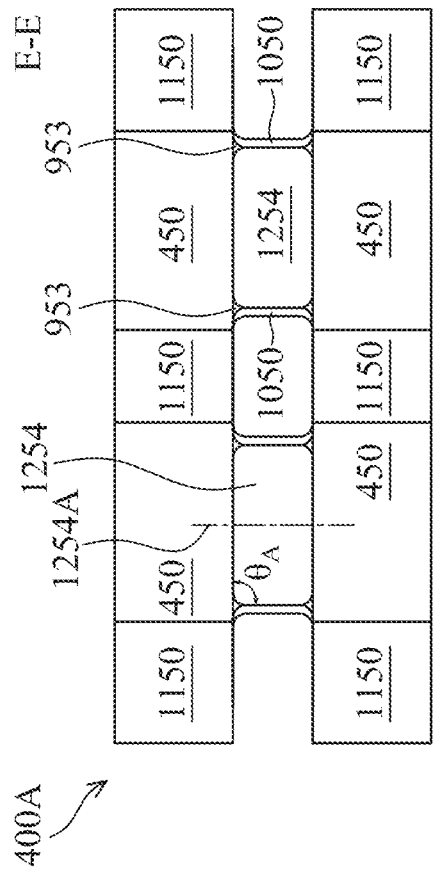
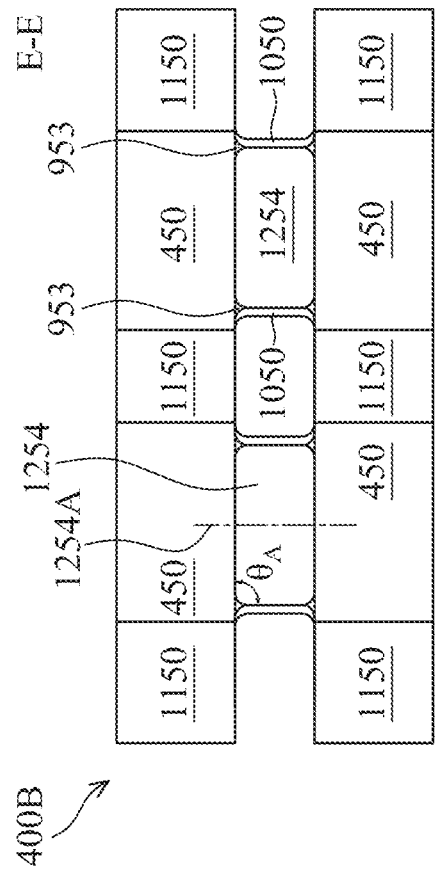
Figure 38
Figure 39

SEMICONDUCTOR DEVICES AND METHODS OF MANUFACTURING THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 and 4 may be associated with cross-sectional views of operations, which may be common for methods 200A and 200B.

FIGS. 5A-B, 7A-B, 14A-B, 16A-B, 20A-B, 21A-B, 22A-B, 40-43, 44A-B, 45A-B, 46A,-B, 47A-C illustrate operations of method 200A.

FIGS. 6A-B, 8, 9A-D, 10A-B, 11A-B, 12A-B, 13A-B, 15A-B, 17A-B, 18A-B, 19A-C, 23A-B, 24A-B, 25A-25B, 26A-B, 27A-B, 28A-B, 29A-B, 30A-C, 31A-C, and 32-39 illustrate operations of method 200B.

DETAILED DESCRIPTION

Figure 1:
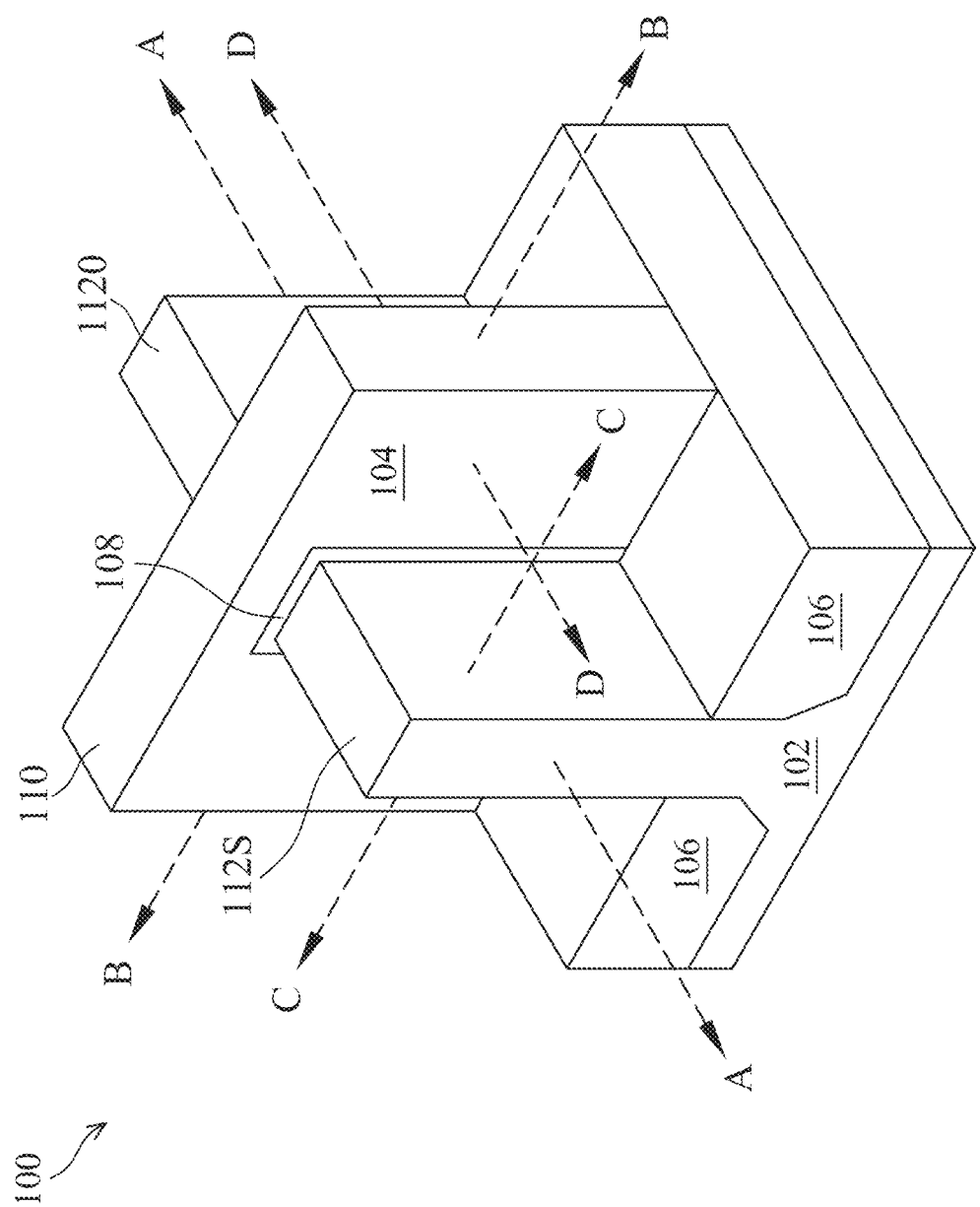
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is discussed in the context of forming a Fin Field-Effect Transistor (FinFET) device, which includes an area with a higher density of individual FinFETs ("a high density area") and an area with a lower density of individual FinFETs ("a low density area"). Existing technology may not provide a desired control over critical dimensions for an active gate of a FinFET in the low density area. Specifically, existing technology may result in an active gate, which may have a profile with small critical dimensions in the low density area. Such profile may unfavorably decrease performance of a FinFET device.

The present disclosure provides a FinFET device with a profile of an active gate in the low density area which may avoid such issues. In some embodiments, the present disclosure may also provide a FinFET device with an advantageous profile of an active gate in the high density area.

FIG. 1 illustrates a perspective view of an example FinFET 100 of a FinFET device. The FinFET 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of a portion of the fin 104, and a gate 110 is over the gate dielectric 108. Source structure 112S and drain structure 112D are in (or extended from) the fin 104 and on opposing sides of the gate dielectric 108 and the gate 110. In the following discussions, the gate dielectric 108 and gate 110, collectively, may sometimes be referred to as a dummy gate structure, or an active gate structure that replaces the dummy gate structure. FIG. 1 is provided as a reference to illustrate a number of cross-sections in subsequent figures. For example, cross-section B-B extends along a longitudinal axis of the gate 110 of the FinFET device 100; cross-section A-A is perpendicular to cross-section B-B and is along a longitudinal axis of the fin 104 and in a direction of, for example, a current flow between the source/drain structures 112S/112D; cross-section C-C is parallel to cross-section B-B and is across the source/drain structures, such as structures 112S or 112D; and cross-section D-D is parallel to cross-section A-A and extends across a portion of the gate dielectric 108 and the gate 110 that is not over the fin 104. For example, cross-section D-D may correspond to an area outside the fin 104, such as an area between two adjacent fins. Subsequent figures refer to these reference cross-sections for clarity.

Figure 2A:
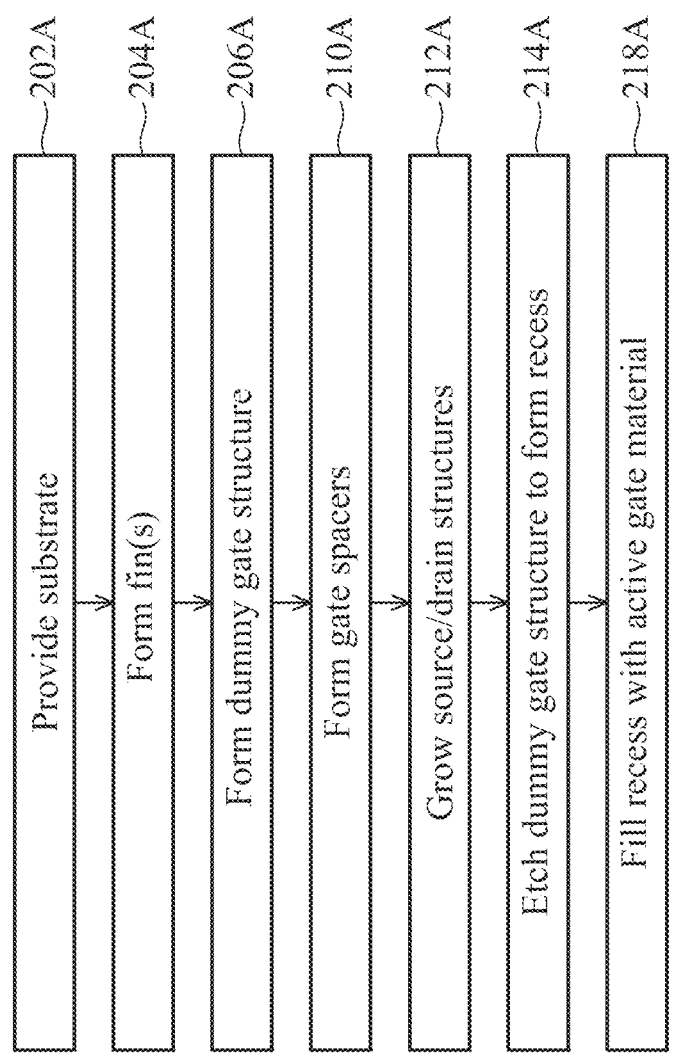
FIGS. 2A and 2B flow charts of example methods for making a non-planar transistor device in accordance with some embodiments.
Figure 2B:
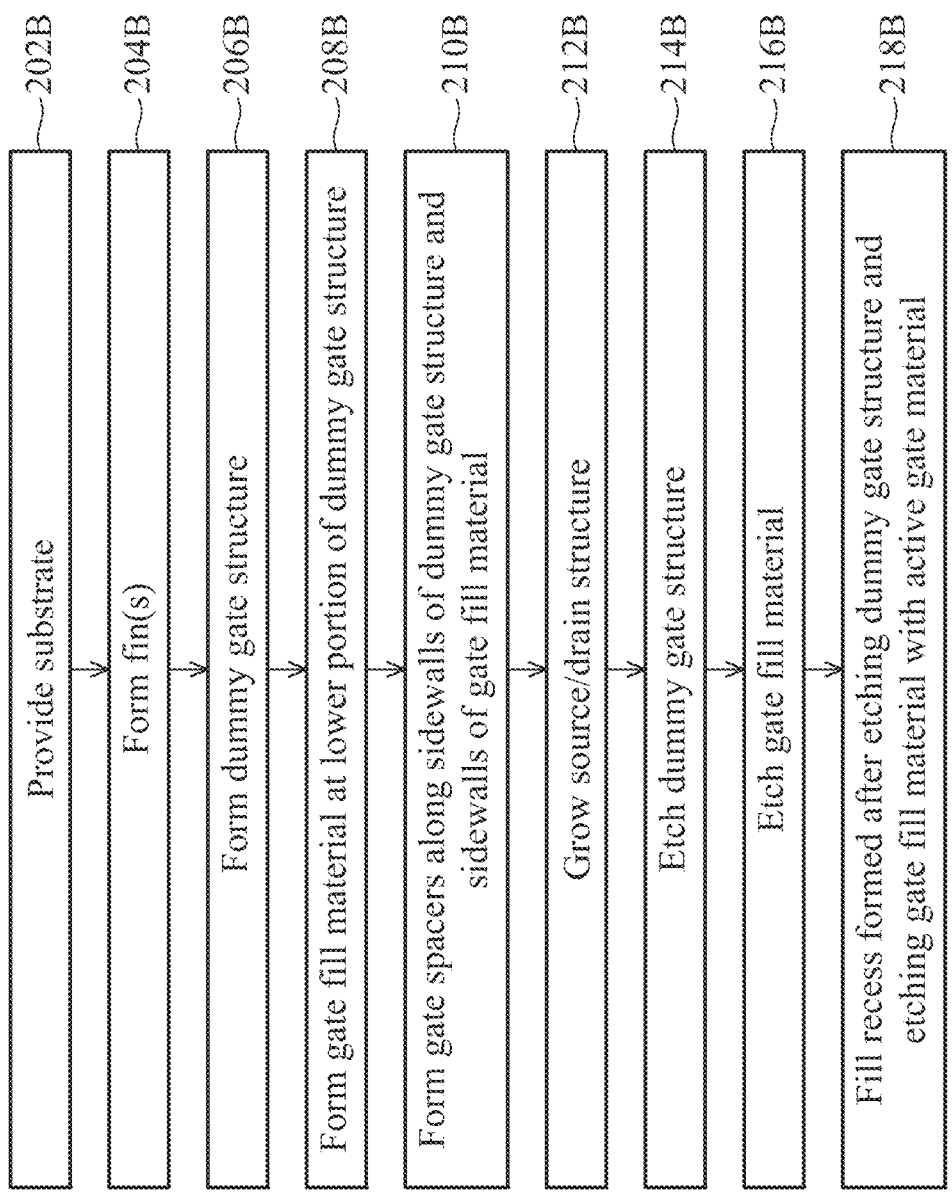
Figure 4:
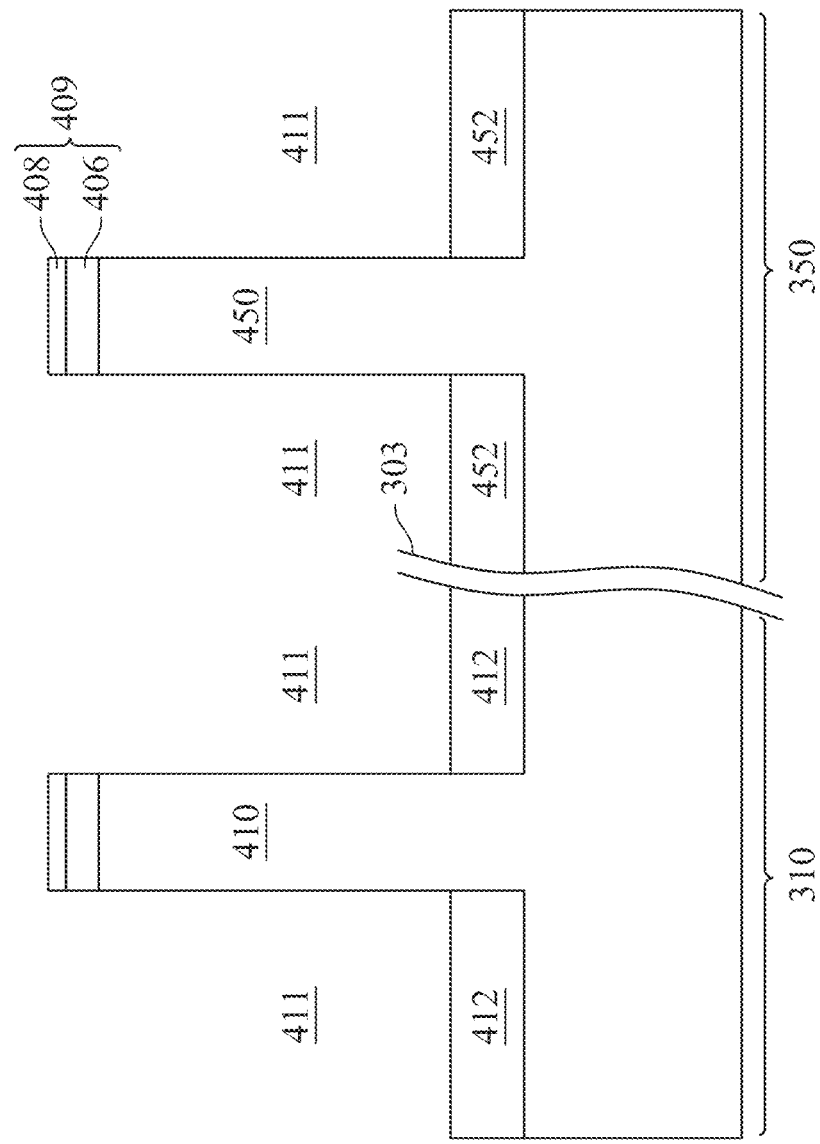

FIGS. 2A and 2B illustrates flowcharts of methods 200A and 200B, which may be used to form a non-planar transistor device. Method 200A may be used for forming a non-planar transistor device in a high density area. Method 200B may be used for forming a non-planar transistor device in a low density area. In some embodiments, method 200B may be used for forming a non-planar transistor device in a high density area. At least some of the operations (or steps) of each of method 200A and method 200B can be used to form a FinFET, device, which may include one or more of FiNFETs, such as FinFET 100; a nanosheet transistor device, a nanowire transistor device, a vertical transistor device, a gate-all-around (GAA) transistor device, or the like. It is noted that each of methods 200A and 200B is merely an example, and is not intended to limit the present disclosure. Accordingly, it is understood that additional operations may be provided before, during, and after the each of method 200A and method 200B of FIGS. 2A and 2B, and that some other operations may only be briefly described herein. FIGS. 3 and 4 may be associated with cross-sectional views of operations, which may be common for method 200A and 200B. In some embodiments, operations of method 200A may be associated with cross-sectional views of an example FinFET device at various fabrication stages in the high density area as shown in FIGS. 5A, 7A, 7B, 14A, 14B, 16A, 16B 20A, 20B, 21A, 21B, 22A, 22B, 40-43, 44A, 44B, 45A, 45B, 46A, 46B, 47A and 47B. Operations of method 200B may be associated with cross-sectional views of an example FinFET device at various fabrication stages in FIGS. 6A, 6B, 8, 9A-D, 10A-B, 11A-B, 12A-B, 13A-B, 15A-B, 17A-B, 18A-B, 19A-C, 23A-B, 24A-B, 25A-25B, 26A-B, 27A-B, 28A-B, 29A-B, 30A-C, 31A-C, and 32-39 for the low density area. Although operations of method 200B are illustrated for the low density area, some of these operations may be applicable for the high density area as well.

In brief overview, method 200A or 200B starts with operation 202A or 200B of providing a substrate. Method 200A or 200B continue respectively to operation 204A or 204B of forming fins. Method 200A or 200B continue respectively operation 206A or 206B of forming dummy gate structures over the formed fins. A density of the dummy gate structures formed in operation 206A may be higher than a density of the dummy gate structures formed in operation 206B, when method 200B used in the low density area. When method 200B is used for forming dummy gate structures in both high density area and low density area, a density of dummy gate structures in the high density area is higher than in the low density area. The dummy gate structures formed in operation 206B may be tapered so that a distance between opposing side walls is gradually decreasing in the lower portion of the dummy gate structures. The dummy gate structures formed in operation 206A may be vertical. When method 200B used for both low density are and high density, a degree of tapering may be lower for the dummy gate structures formed in operation 206b of method 200b in the high density area compared to that of the dummy gate structures formed in operation 206B of method 200B in the low density area. Method 200B continues with operation 208B of depositing a gate fill material in the lower portion of the tapered dummy gate structures formed in operation 206B. Method 200A may involve no depositing such gate fill material. Thus, following operation 206A, method 200A continues to operation 210A of forming gate spacers along sidewalls the dummy gate structures formed in operation 206A. Following operation 208B, method 200B continues to operation 210B of forming gate spacers along sidewalls of the dummy gate structures (in the upper portion) and along sidewalls of the gate fill material (in the lower portion). Following operation 210A or 210B, method 200A or 200B continues with operation 212A or 212B of growing source drain structures. Method 200A then continues with operation 214A of etching the dummy gate structure to form a recess and operation 218A of filing a recess with an active gate material to form an active gate. Following operation 212B, method 200B involves operation 214B of etching the dummy gate structure and operation 216B of etching the gate fill material. Etchings 214B and 216B are distinct. Method 200B continues with operation 218B of filing a recess formed as the result of operations 214B and 216B with an active gate material to form an active gate. Using methods 200B and/or 200A may allow to form active gates in the low density area and/or the high density area, which may have advantageous profiles. For example, the active gate in the low density area formed using method 200B may have an advantageous profile as the result of using the gate fill material and two etching operations 214B and 216B.

FIG. 3 is a cross-sectional view a semiconductor substrate 302, which may illustrate operation 202A and 202B in FIGS. 2A and 2B. The cross-sectional view of FIG. 3 may correspond to a cross-section cut along the lengthwise direction of an active/dummy gate structure of the FinFET device (e.g., cross-section B-B of FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the FinFET device 300 may include areas 310 and 350. The area 310 can be configured to form a number of transistors in relatively high gate density (hereinafter "high density area 310"); and the area 350 can be configured to form a number of transistors in relatively low gate density (hereinafter "low density area 350"). For example, area 310 may correspond to the substrate in operation 202A of FIG. 2A, while are 350 may correspond to the substrate in operation 202B of FIG. 2B. In some embodiments, the transistors in the high density area 310 may function as logic circuits, static random access memory (SRAM) circuits, and/or ring oscillators (ROs); and the transistors in the low density area 350 may functions as input/output (I/O) circuits, and/or serializer/deserializer (SerDes). Accordingly, features (e.g., fins) of the transistors in the low density area 350 may be more sparsely formed, when compared to features (e.g., fins) of the transistors formed in the high density area 310.

As shown in FIG. 3 (and the following figures), the high density area 310 and the low density area 350 are separated from each other by a divider 303, which can include additional features/components/devices that are omitted for simplicity. It should be appreciated that some of the operations of the method 200 may be concurrently performed in high density area 310 and the low density area 350.

Corresponding to operation 204A or 200B of FIG. 2A or 2B, FIG. 4 is a cross-sectional view of the FinFET device 300 including a fin 410 in the high density area 310 and a fin 450 in the low density area 350 at one of the various stages of fabrication. The cross-sectional view of FIG. 4 may be cut along the lengthwise direction of an active/dummy gate structure of the FinFET device 300 (e.g., cross-section B-B of FIG. 1).

The fin 410 formed in the high density area 310, and the fin 450 is formed in the low density area 350. Although one fin is shown in each of the high density area 310 and the low density area 350, it should be appreciated that the FinFET device 300 can include any number of fins in each of the areas 310 and 350 while remaining within the scope of the present disclosure.

The fins 410 and 450 may be each configured as an active fin, which will be adopted as an active (e.g., electrically functional) fin or channel in a completed FinFET device. Further, the fin 410 may be configured as the active channel of a one or more core transistors of the FinFET device 300 (sometimes referred to as active core fin 410); and the fin 450 may be configured as the active channel of one or more input/output (I/O) transistors of the FinFET device 300 (sometimes referred to as active I/O fin 450). In some other embodiments, the fins 410 and 450 may be each configured as a dummy fin, will not be adopted as an active channel to electrically conduct current in a finished FinFET device. When configured as dummy fins, the fins 410 and 450 may be formed of a dielectric material; and when configured as active fins, the fins 410 and 450 may be formed of a semiconductor material. In the following discussions, the fins 410 and 450 are configured as active fins, thereby being sometimes referred to as "semiconductor fin 410" and "semiconductor fin 450," respectively.

The semiconductor fins 410 and 450 are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. Although only one pad nitride layer 408 is illustrated, a multilayer structure (e.g., a layer of silicon oxide on a layer of silicon nitride) may be formed as the pad nitride layer 408. The pad nitride layer 408 may be formed using a chemical vapor deposition technique, such as low-pressure chemical vapor deposition (LPCVD) or plasma enhanced chemical vapor deposition (PECVD).

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 409, as illustrated in FIG. 4.

The patterned mask 409 is subsequently used to pattern exposed portions of the substrate 302 to form trenches (or openings) 411, thereby defining the semiconductor fins 410 and 450 between adjacent trenches 411 as illustrated in FIG. 4. When multiple fins are formed, such a trench may be disposed between any adjacent ones of the fins. In some embodiments, the semiconductor fins 410 and 450 are formed by etching trenches in the substrate 302 using, for example, a etch technique, which may be a dry etch technique, such as reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the semiconductor fins 410 and 450.

The semiconductor fins 410 and 450 may be patterned by any suitable method. For example, the semiconductor fins 410 and 450 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

FIGS. 3 and 4 illustrate an embodiment of forming the semiconductor fins 410 and 450, but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the semiconductor fins 410 and 450 that include the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the semiconductor fins 410 and 450 may include silicon germanium ($Si_xGe_{1-x}$, where x can be between 0 and 1), silicon carbide, pure or pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Upon forming the semiconductor fins 410 and 450, a number of isolation regions 412 and 452 are formed in the high density area 310 and the low density area 350, respectively, as shown in FIG. 4. The isolation regions 412 and 452, which are formed of an insulation material, can electrically isolate neighboring fins from each other. The insulation material may be an oxide, such as silicon oxide, a nitride, the like, or combinations thereof, and may be formed for example, by a chemical vapor deposition technique, such as a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 412 and 452 and a top surface of the fins 410 and 450 that are coplanar (not shown). The patterned mask 409 may also be removed by the planarization process.

In some embodiments, the isolation regions 412 and 452 include a liner, e.g., a liner oxide (not shown), at the interface between each of the isolation regions 412 and 452 and the substrate 302 (semiconductor fins 410 and 450). In some embodiments, the liner oxide is formed to reduce crystalline defects at the interface between the substrate 302 and the isolation regions 412 and 452. Similarly, the liner oxide may also be used to reduce crystalline defects at the interface between the semiconductor fins 410 and 450 and the isolation regions 412 and 452. The liner oxide (e.g., silicon oxide) may be a thermal oxide formed through a thermal oxidation of a surface layer of the substrate 302, although other suitable method may also be used to form the liner oxide.

Next, the isolation regions 412 and 452 are recessed to form shallow trench isolation (STI) regions 412 and 452, as shown in FIG. 4. The isolation regions 412 and 452 are recessed such that upper portions of the fins 410 and 450 protrude from between neighboring STI regions 412 and 452. Respective top surfaces of the STI regions 412 and 452 may have a flat surface (as illustrated), a convex surface, a concave surface (such as dishing), or combinations thereof. The top surfaces of the STI regions 412 and 452 may be formed flat, convex, and/or concave by an appropriate etch. The isolation regions 412 and 452 may be recessed using an acceptable etching process, such as one that is selective to the material of the isolation regions 412 and 452. For example, a dry etch or a wet etch using dilute hydrofluoric (DHF) acid may be performed to recess the isolation regions 412 and 452.

Figure 5A:
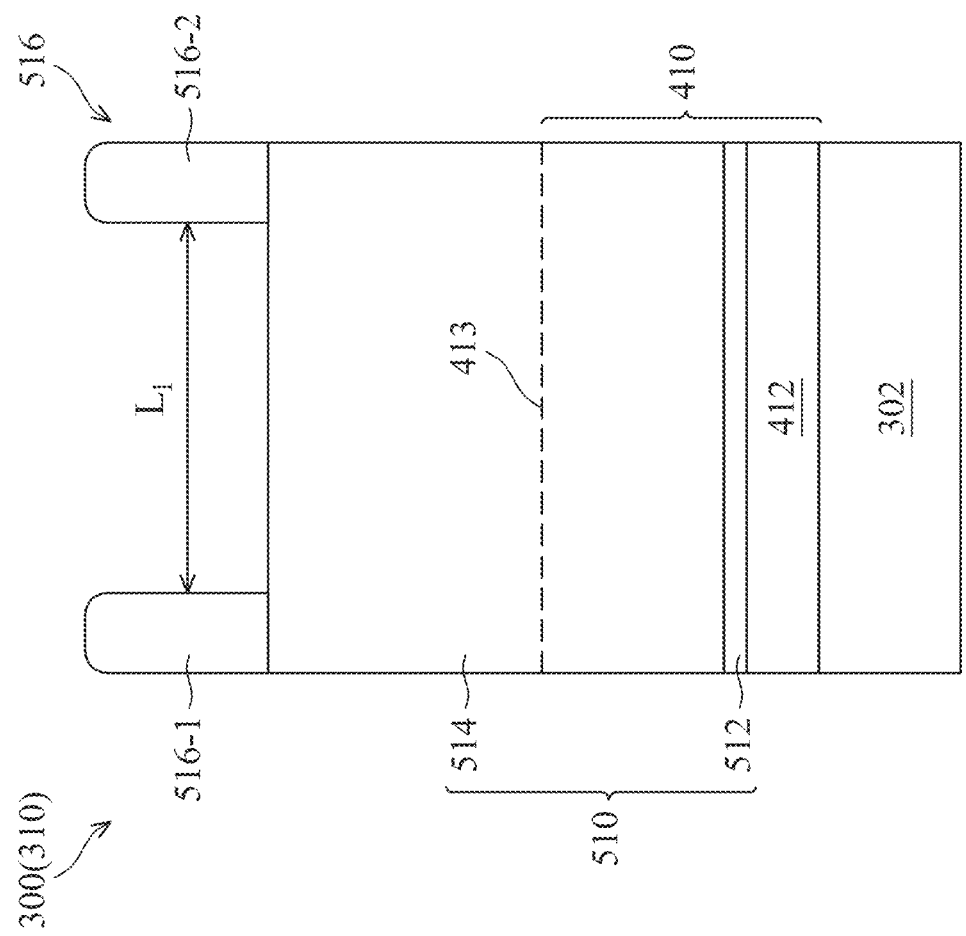
Figure 5B:
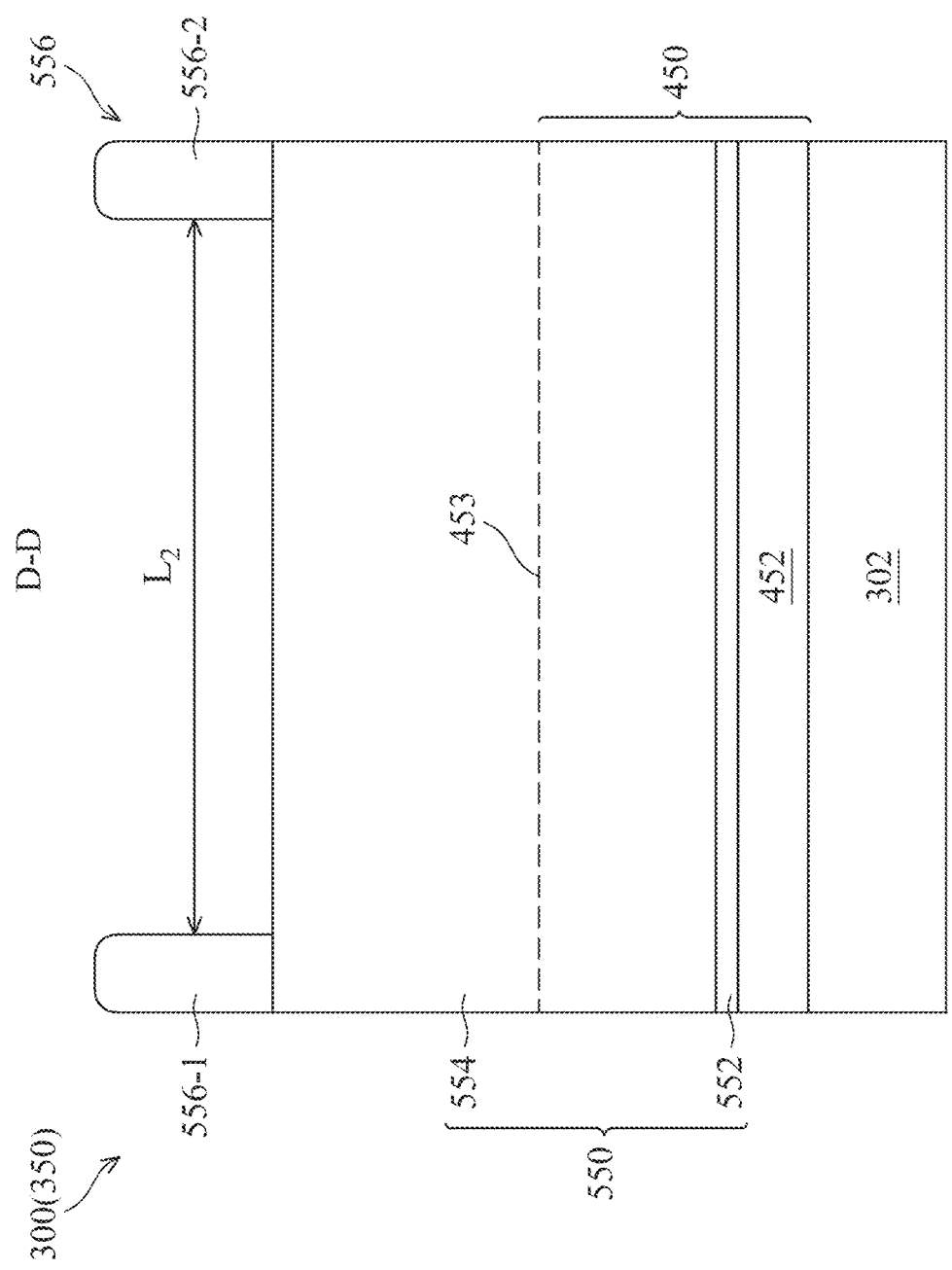

FIGS. 5A and 5B illustrate cross-sectional views of the FinFET device 300 at various stages of fabrication to pattern or otherwise form dummy gate structures in the high density area 310 and the low density area 350, respectively.

FIG. 5A is a cross-sectional view of the FinFET device 300 including a blanket dummy gate structure 510 over the semiconductor fin 410 (in the high density area 310), and FIG. 5B is a cross-sectional view of the FinFET device 300 including a blanket dummy gate structure 550 over the semiconductor fin 450 (in the low density area 350), at one of the various stages of fabrication at one of the various stages of fabrication. The cross-sectional views of FIGS. 5A and 5B may be each cut along a direction parallel to the lengthwise direction of a respective semiconductor fin (e.g., cross-section C-C indicated in FIG. 1).

The blanket dummy gate structure 510 is formed over the workpiece (e.g., the partially formed FinFET device 300 in the high density area 310) to overlay the semiconductor fin 410. Thus, the blanket dummy gate structure 510 may have a portion in direct contact with the isolation regions 412, as illustrated in FIG. 5A, and another portion in direct contact with the semiconductor fin 410 (e.g., contacting a top surface and sidewalls of the semiconductor fin 410). For purpose of reference, top surface 413 of the semiconductor fin 410 is indicated by a dotted line in the cross-sectional view of FIG. 5A which does not intersect the semiconductor fin 410. Similarly in FIG. 5B, the blanket dummy gate structure 550 is formed over the low density area 350 to overlay the semiconductor fin 450. Thus, the blanket dummy gate structure 550 may have a portion in direct contact with the isolation regions 452, as illustrated in FIG. 5B, and another portion in direct contact with the semiconductor fin 450 (e.g., contacting a top surface and sidewalls of the semiconductor fin 450). For purpose of reference, top surface 453 of the semiconductor fin 450 is indicated by a dotted line in the cross-sectional view of FIG. 5B which does not intersect the semiconductor fin 450.

The blanket dummy gate structure 510 includes a blanket dummy gate dielectric 512 and a blanket dummy gate 514 (FIG. 5A); and the blanket dummy gate structure 550 includes a blanket dummy gate dielectric 552 and a blanket dummy gate 554 (FIG. 5B), in some embodiments. The blanket dummy gate dielectrics 512 and 552 may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. The blanket dummy gates 514 and 554 may be, for example, polysilicon (doped or undoped), silicon germanium, or the like, and may be deposited and then planarized, such as by a chemical mechanical polishing (CMP) process.

Upon forming the blanket dummy gate structures 510 and 550 in the high density area and the low density area, a mask layer 516 and a mask layer 556 may be formed over the blanket dummy gate structures 510 and 550, respectively. The mask layers 516 and 556 (sometimes referred to as hard mask layers) may be formed of, for example, silicon nitride or the like. The mask layers 516 and 556 can respectively include one or more patterns configured to define dummy gate structure(s), which will later be replaced with active gate structure(s), through the blanket dummy gate structure. As illustrated in FIG. 5A, the mask layer 516 includes patterns 516-1 and 516-2 that cover two portions of the blanket dummy gate structure 510, which may be later formed as two dummy gate structures in the high density area 310, respectively. As illustrated in FIG. 5B, the mask layer 556 includes patterns 556-1 and 556-2 that cover two portions of the blanket dummy gate structure 550, which may be later formed as two dummy gate structures in the low density area 350, respectively.

In accordance with various embodiments, the patterns 516-1-2 in the high density area 310 may be formed with a spacing $L_1$, and the patterns 556-1-2 in the low density area 350 may be formed with a spacing $L_2$, wherein $L_2$ is greater than $L_1$. For example in a certain process node, $L_1$ may range from about 5 nanometers (nm) to about 50 nm; and $L_2$ may range from about 20 nm to about 1000 nm. In some embodiments, $L_1$ and $L_2$ may have a ratio (e.g., $W_1/W_2$) ranging from about 1.3 to about 200. As such, the transistors can be relatively densely formed in the high density area 310 (partially due to the relatively small spacing between adjacent transistors), and the transistors can be relatively sparsely formed in the low-density area 350 (partially due to the relatively large spacing between adjacent transistors). In some embodiments, an average intergate distance, i.e. a distance between two adjacent gates, such as $L_1$, in the high density area may be from 10 nm to 500 nm or 10 nm to 300 nm or from 10 nm to 200 nm or any value or subrange within these ranges, while an average intergate distance, such as $L_2$, in the low density area may be at least 5 nm or at least 10 nm or at least 20 nm greater than the average intergate distance in the high density area.

Figure 9A:
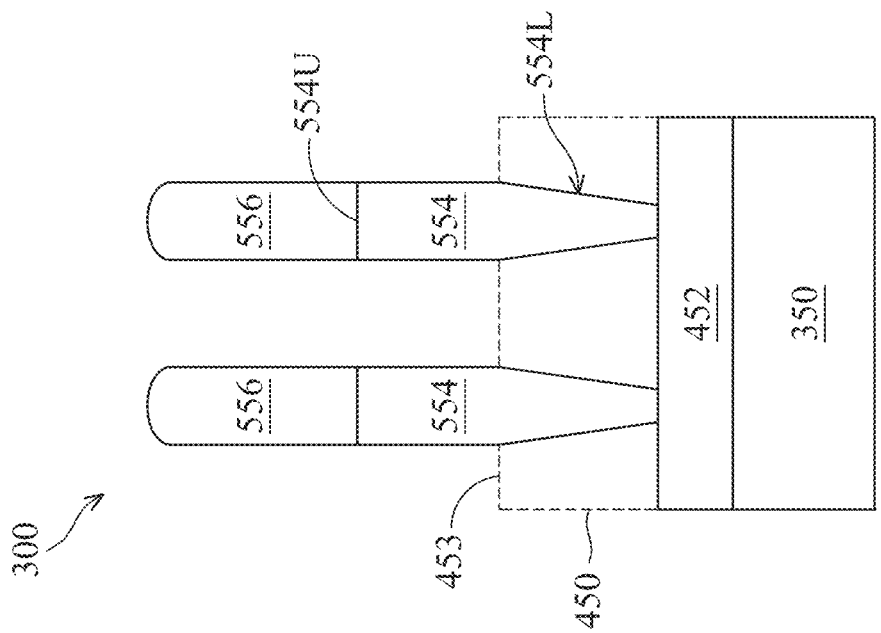
Figure 8:
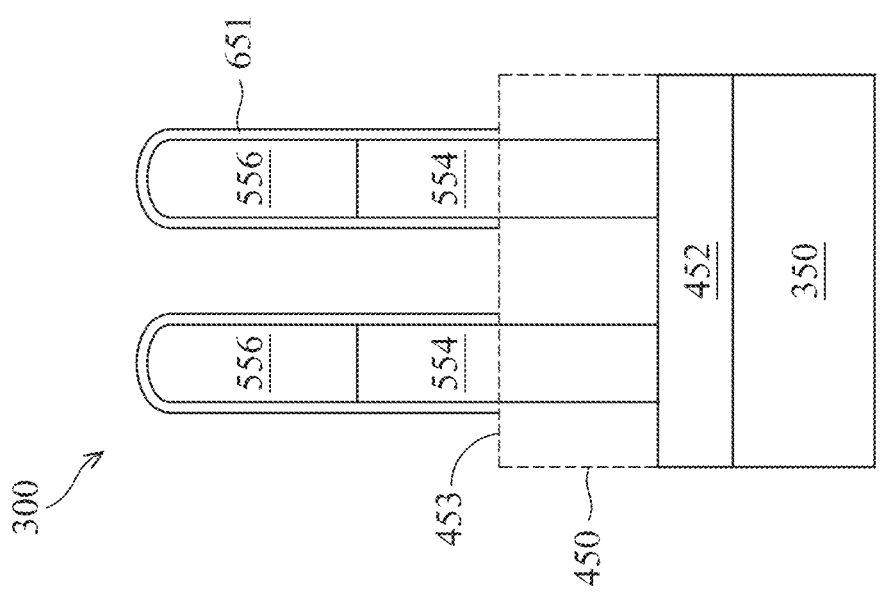
Figure 9B:
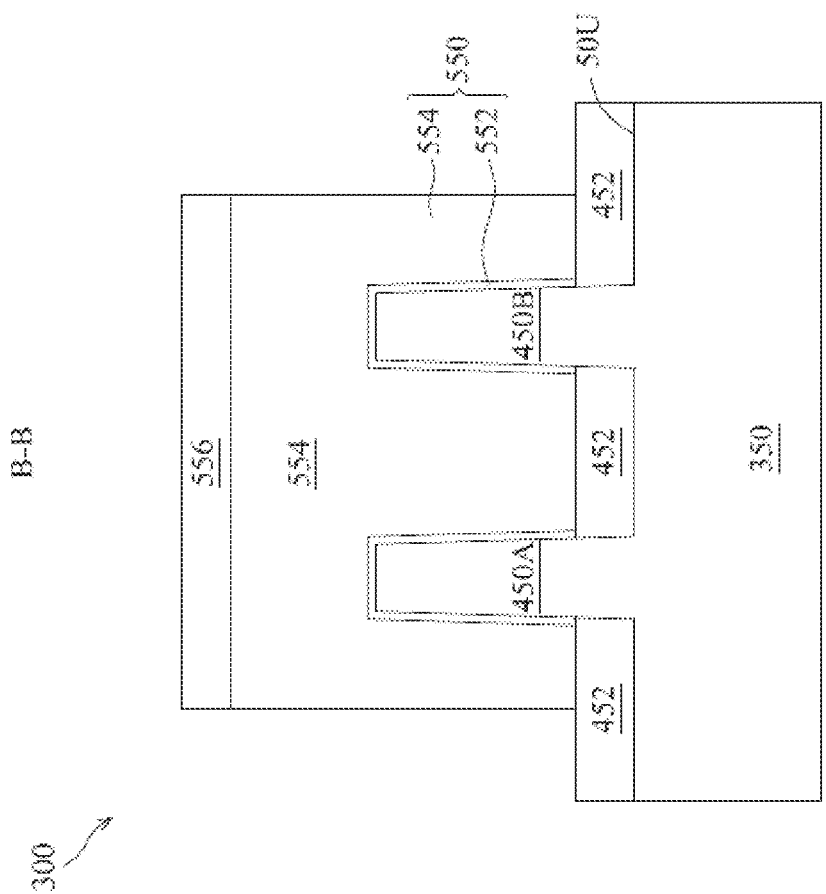
Figures 19A, 19B:
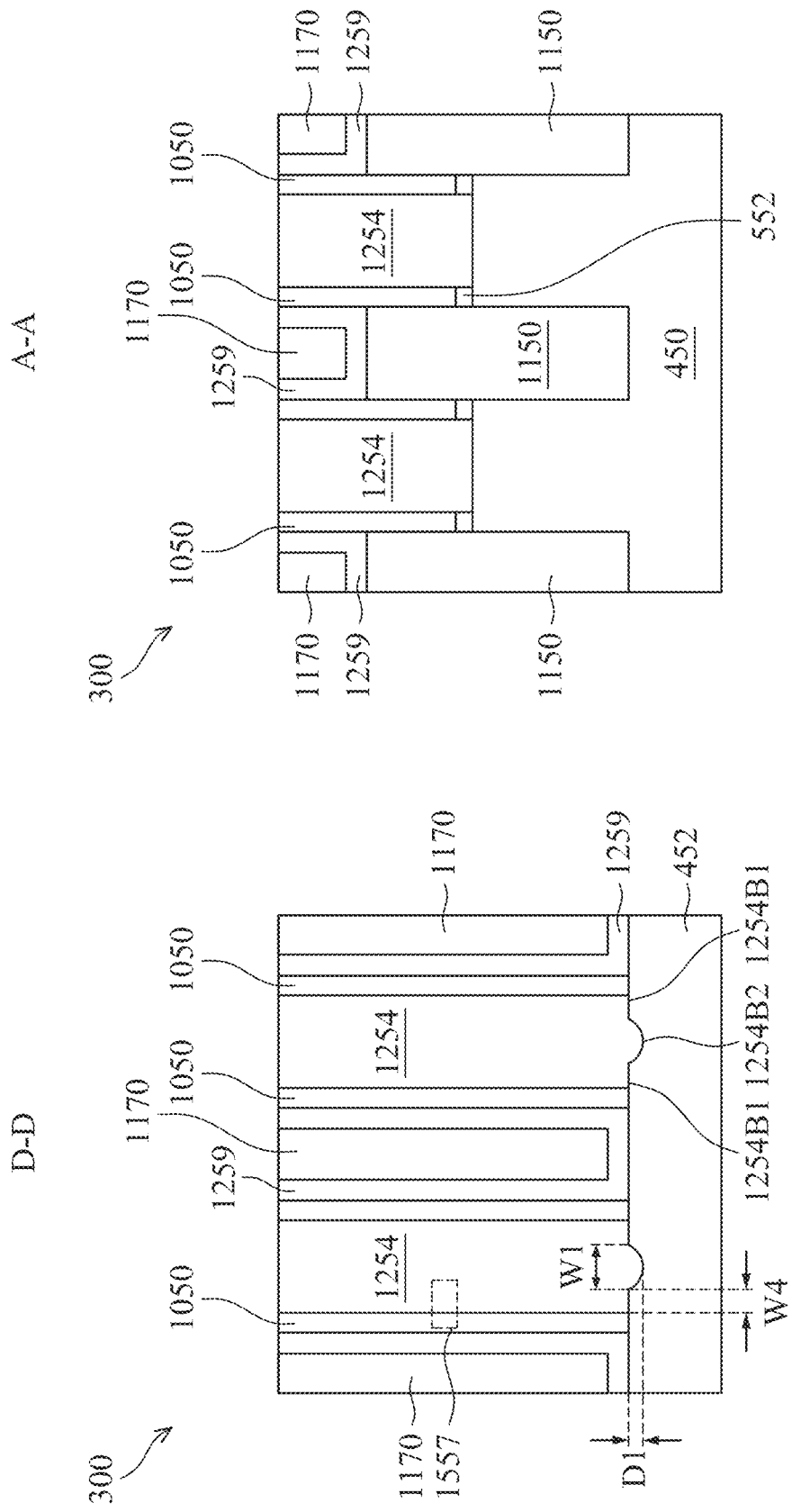

FIGS. 6A-B, 8, 9A-D, 10A-B, 11A-B, 12A-B, 13A-B, 15A-B, 17A-B, 18A-B and 19A-C, illustrate various cross-sectional views of a FinFET device 300 at various stages of fabrication in the low density area 350, in accordance with an embodiment. However, in certain embodiments, these Figures may be applied for fabrication of a FinFET device 300 in the high density area 310 as well. The FinFET device 300 is similar to the FinFET 100 in FIG. 1, but with multiple fins and multiple gate structures. Throughout the discussion herein, figures with the same numeral but different letters (e.g., FIG. 6A and FIG. 6B) refer to different views of the FinFET device at a same processing stage. FIG. 6A illustrate cross-sectional views of the FinFET device 300 along cross-section B-B. FIGS. 6B, 8, and 9A illustrate cross-sectional views of the FinFET device 300 along cross-section D-D. FIGS. 9B, 9C, and 9D illustrate cross-sectional views along cross-section B-B, A-A, and C-C, respectively. FIGS. 10A, 11A, 12A, 13A, 15A, 17A, 18A, and 19A illustrate cross-sectional views of the FinFET device 300 along cross-section D-D, and FIGS. 10B, 11B, 12B, 13B, 15B, 17B, 18B, and 19B illustrate cross-sectional views of the FinFET device 300 along cross-section A-A. FIG. 19C is a zoomed-in view of a portion of FIG. 19A.

FIGS. 6A and 6B illustrate the formation of dummy gate structure 550 over the semiconductor fins 450 in the low density area 350 or dummy gate structure 510 over the semiconductor gate fins 410 in the high density area 310. Considering that initial operations of forming dummy gate structures is similar in the low and high density area is similar the discussion of FIGS. 6A and 6B is combined for the low and high density areas. The corresponding numbers for the high density areas are provided in parenthesis. The dummy gate structure 550 (or 510) includes gate dielectric 552 (or 512) (may also be referred to as dummy gate dielectric) and gate electrode 554 (or 514) (may also be referred to as dummy gate electrode or dummy gate), in some embodiments. A mask 556 (or 516) may be formed over the dummy gate structure 550 (or 510). To form the dummy gate structure 550 (or 510), a dielectric layer is formed on the semiconductor fins 450 (or 410). The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 556 (or 516). The pattern of the mask 556 (or 516) then may be transferred to the gate layer and the dielectric layer by an acceptable etching technique to form gate electrode 554 (or 514) and gate dielectric 552 (or 512), respectively. The gate electrode 554 (or 514) and the gate dielectric 552 (or 512) cover respective channel regions of the semiconductor fins 450 (or 410). The gate electrode 554 (or 514) may also have a lengthwise direction substantially perpendicular to the lengthwise direction of respective semiconductor fins 450 (or 410).

The gate dielectric 552 (or 512) is shown to be formed (e.g., by thermal oxidization of the material of the fins 450 (or 410)) over the fins 450 (or 410) (e.g., over top surfaces and sidewalls of the fins 450 (or 410)) but not over the STI regions 452 (or 412) in the example of FIG. 6A. In other embodiments, the gate dielectric 552 (or 512) may be formed (e.g., deposited) over the fins 450 (or 410) and over the STI regions 452 (or 412) For example, the gate dielectric 552 (or 512) may extends continuously from the fin 450A (or 410A) to the fin 450B (or 410B). These and other variations are fully intended to be included within the scope of the present disclosure. FIG. 6B shows the corresponding cross-section view along cross-section D-D. Two dummy gate structures 550 (or 510) are illustrated in FIG. 6B as a non-limiting example. Other numbers of dummy gate structures are also possible and are fully intended to be included within the scope of the present disclosure.

Figure 7B:
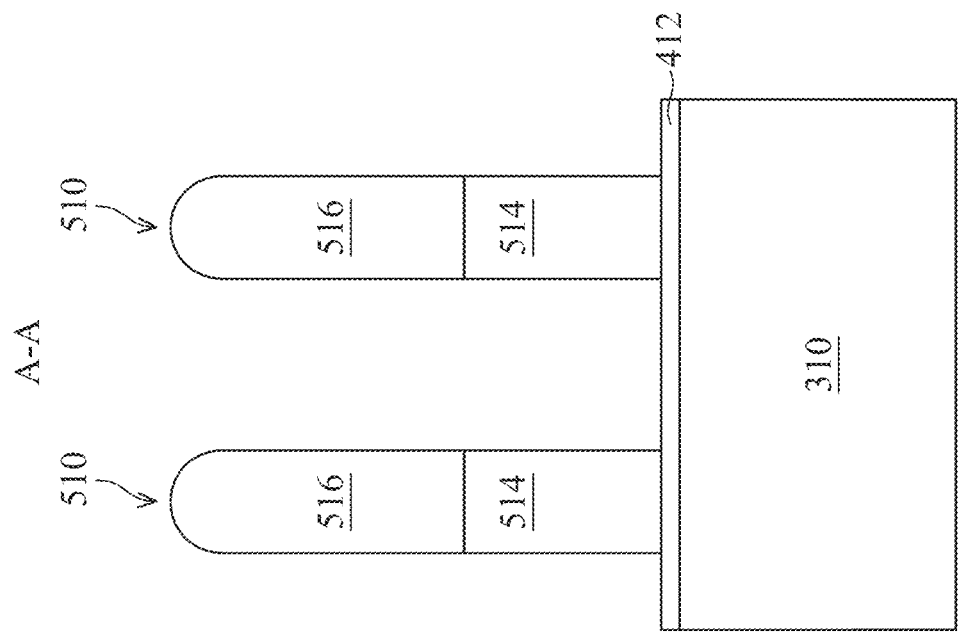
Figure 7A:
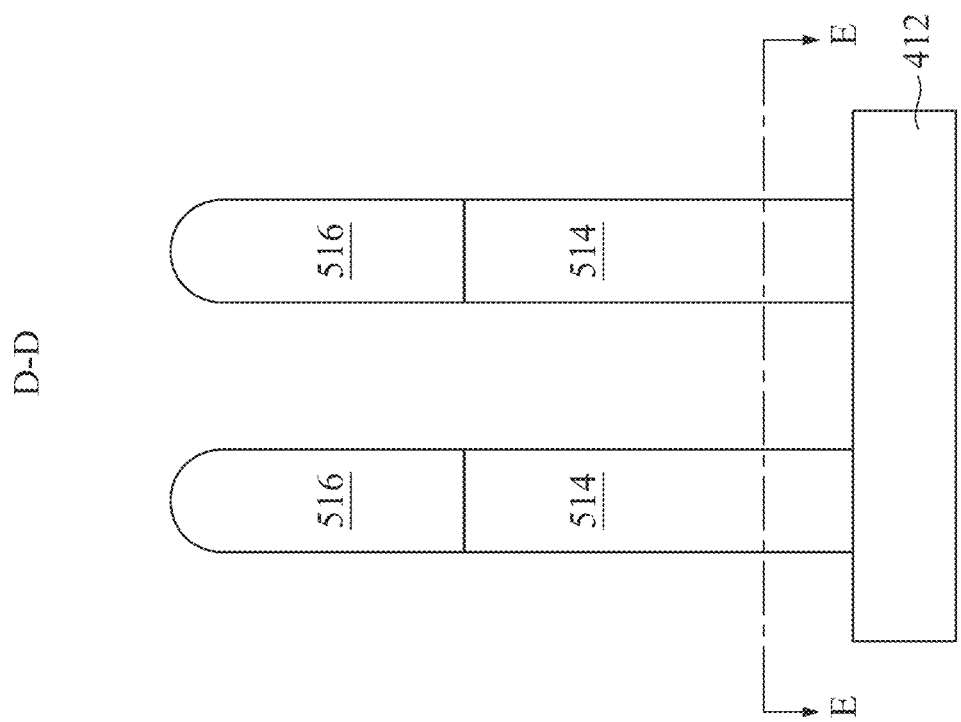

FIGS. 7A and 7B provide respectively D-D and A-A cross-sections as defined in FIG. 1 for the dummy gate structures formed in the high density area 310.

Formation of dummy gate structures 550 in the low density area 350 may further include a thinning process to reduce a thickness of lower portions of the dummy gate structure 550 proximate to the isolation regions 452. FIGS. 8 and 9A illustrate such thinning process. In FIG. 8, a protection layer 651 is formed over the mask 556 and over upper portions of the gate electrode 554, while lower portions of the gate electrode 554 are exposed by the protection layer 651. The protection layer 651 is formed of a material different from the material of gate electrode 554, such that in a subsequent etching process, the protection layer 651 prevents or reduces etching of its underlying layers (e.g., upper portion of gate electrode 554). The protection layer 651 may be a dielectric layer, such as a silicon oxide layer or a silicon nitride layer, formed by a suitable deposition process such as PECVD or atomic layer deposition (ALD), although other suitable material, such as a carbon-based coating, may also be used as the protection layer 651. The discussion hereinafter may refer to the protection layer 651 as a dielectric layer 651, with the understanding that any suitable material may be used to form the protection layer 651.

FIG. 8 further illustrates the fin 450 in phantom, since the fin 450 is not in the cross-section of FIG. 8. In the example of FIG. 8, the dielectric layer 651 is formed over upper portions of the gate electrode 554, which upper portions are disposed above an upper surface 453 of the fin 450, while lower portions of the gate electrode 554 disposed below the upper surface 453 are exposed (e.g., not covered) by the dielectric layer 651. Therefore, the deposition process of the dielectric layer 651 may be referred to as a depth-selective deposition process. This depth-selective deposition process may be a result of the small space between adjacent fins 450. As semiconductor manufacturing process continues to advance, features sizes continue to shrink. The distance between two adjacent fins 450 may become so small that the deposition rate of a deposition process becomes low in such small spaces. As a result, when the dielectric layer 651 is being formed, sidewalls of the upper portion of the gate electrode 554, which is above the fin 450, are covered by the deposited dielectric layer 651. In contrast, little or no dielectric layer 651 is formed along sidewalls of the lower portion of the gate electrode 554.

The location of the dielectric layer 651 in FIG. 8 is merely a non-limiting example. For example, the dielectric layer 651 may extends below the upper surface 453 of the fin 450, and may stop at a location between the upper surface 453 of the fin 450 and the upper surface of the isolation region 452. In some embodiments, the sidewalls of the lower portion of the gate electrode 68 are also covered by the dielectric layer 651, but a thickness of the dielectric layer 651 over the lower portions of the gate electrode 554 is smaller than a thickness of the dielectric layer 651 over the upper portions of the gate electrode 554. For example, the thickness of the dielectric layer 71 may decrease continuously as the gate electrode 554 extends toward the isolation regions 452. As a result, in a subsequent etching process, the lower portion of the gate electrode 554 is consumed (e.g., etched) more than the upper portion of the gate electrode 554.

Next, in FIG. 9A, an etching process is performed to reduce a thickness T of a lower portion 554L (e.g., a portion below the upper surface 453 of the fin 450) of the gate electrode 554. The etching process uses an etchant that is selective to the material (e.g., polysilicon) of the gate electrode 554, in some embodiments. A suitable etching process, such as an anisotropic etching process (e.g., a plasma etching process), may be used to remove the lower portions of the gate electrode 554. In embodiments where plasma etching is used, the lateral etching rate of the plasma etching process is adjusted, e.g., by adjusting a bias power of the plasma etching process, to control the sidewall profile of the gate electrode 554. In other embodiments, a wet etch process is performed to remove the lower portion of the gate electrode 554.

As illustrated in FIG. 9A, after the etching process, exterior portions of the lower portion 554L of the gate electrode 554 are removed, and therefore, a thickness T of the gate electrode 554 in the lower portion 554L is reduced. As illustrated in FIG. 9A, sidewalls of the lower portion 554L are sloped (e.g., slanted) with respect to the upper surface of the substrate, such that a distance between opposing sidewalls of the lower portion 554L decreases as the lower portion 554L of the gate electrode 554 extends toward the isolation regions 452. In other words, in the cross-section view of FIG. 9A, the gate electrode 554 tapers off as the gate electrode extends toward the isolation regions 452. In the example of FIG. 9A, the opposing sidewalls of the upper portion of the gate electrode 554 (e.g., portions above the upper surface 453 of the fin 450) are straight (e.g., perpendicular to the upper surface of the substrate), such that the thickness T of the gate electrode 554 in the upper portion remains a same (e.g., having a substantially uniform thickness).

In some embodiments, the dielectric layer 651 is removed (e.g., completely removed) by the etching process to thin the lower portions of the gate electrode 554. In other embodiments, after the etching process to thin the lower portions of the gate electrode 554 is performed, the dielectric layer 651 is removed by another suitable etching process, e.g., using an etchant selective to the material of the dielectric layer 651.

FIGS. 9B and 9C illustrate cross-sectional views of the FinFET device 300 along cross-sections B-B and A-A, respectively, after the lower portions of the gate electrode 554 are thinned. FIG. 9D illustrates the cross-sectional views of the FinFET device 300 along cross-section C-C. Note that the dummy gate structure 550 is not in the cross-section C-C, thus not illustrated in FIG. 9D.

FIGS. 11A-B, 12A-B, 13A-B, 15A-B, 17A-B, 18A-B, and 19A-C illustrate additional processing steps to from the FinFET device 300, in accordance with an embodiment. For simplicity, not all features are illustrated in these figures. For example, the substrate is not illustrated in the figures.

Figure 10B:
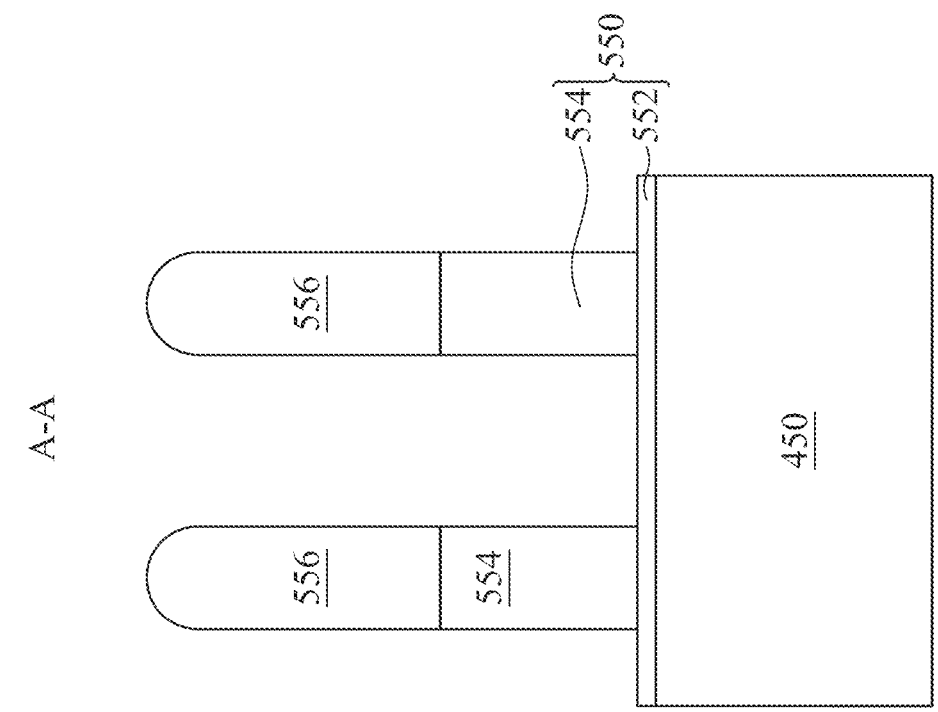
Figure 10A:
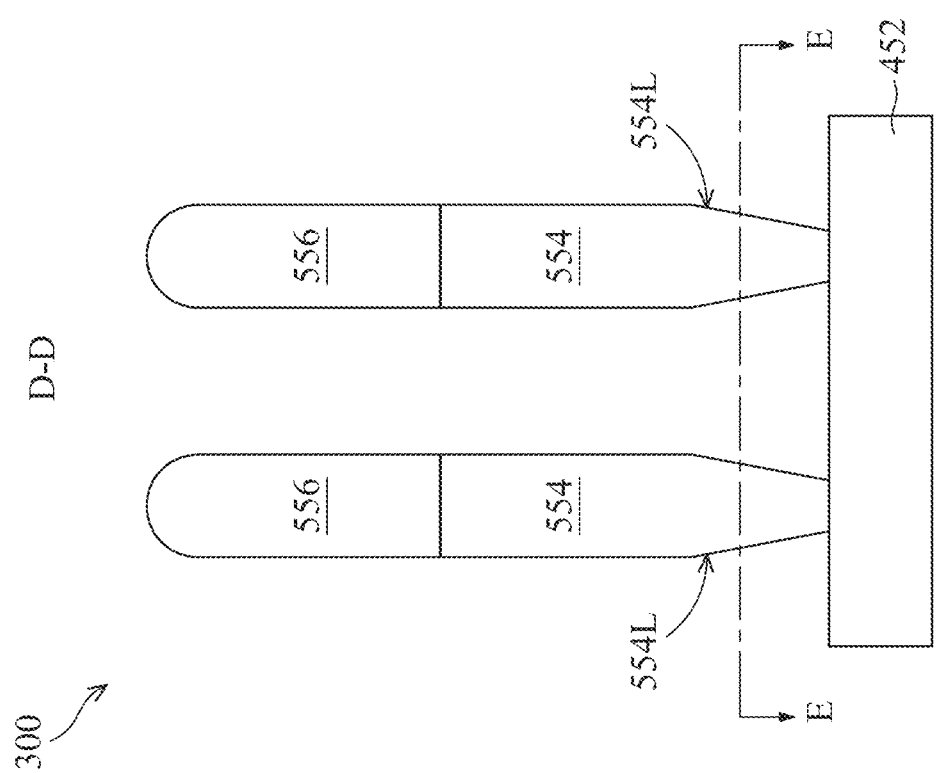

To facilitate comparison with subsequent figures, (simplified) cross-sectional views of the FinFET device 300 in FIGS. 9A and 9C are shown in FIGS. 10A and 10B, respectively.

Figure 11B:
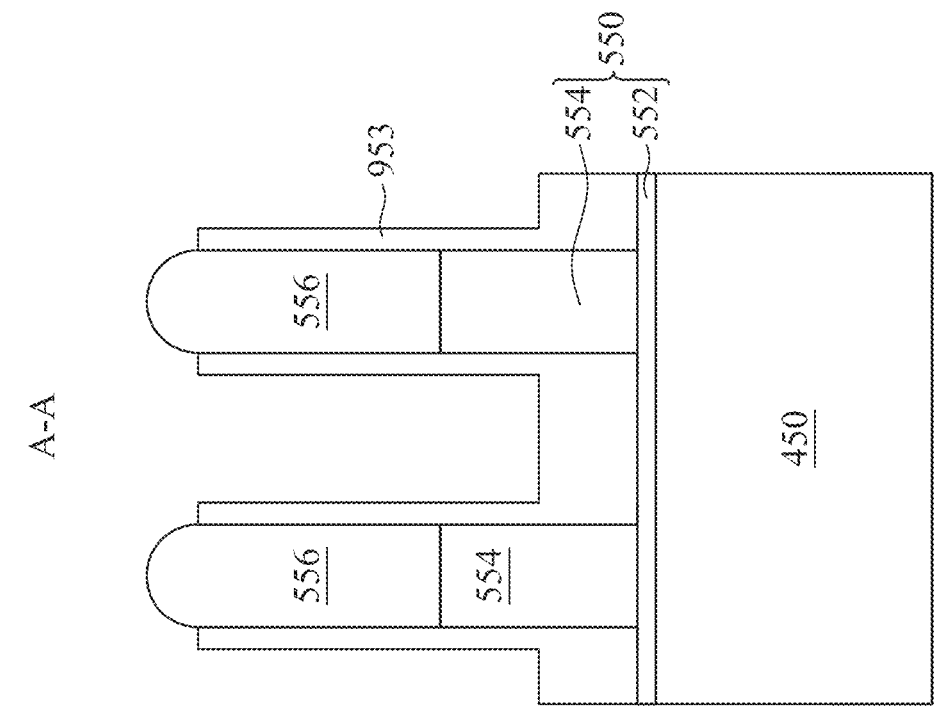
Figure 11A:
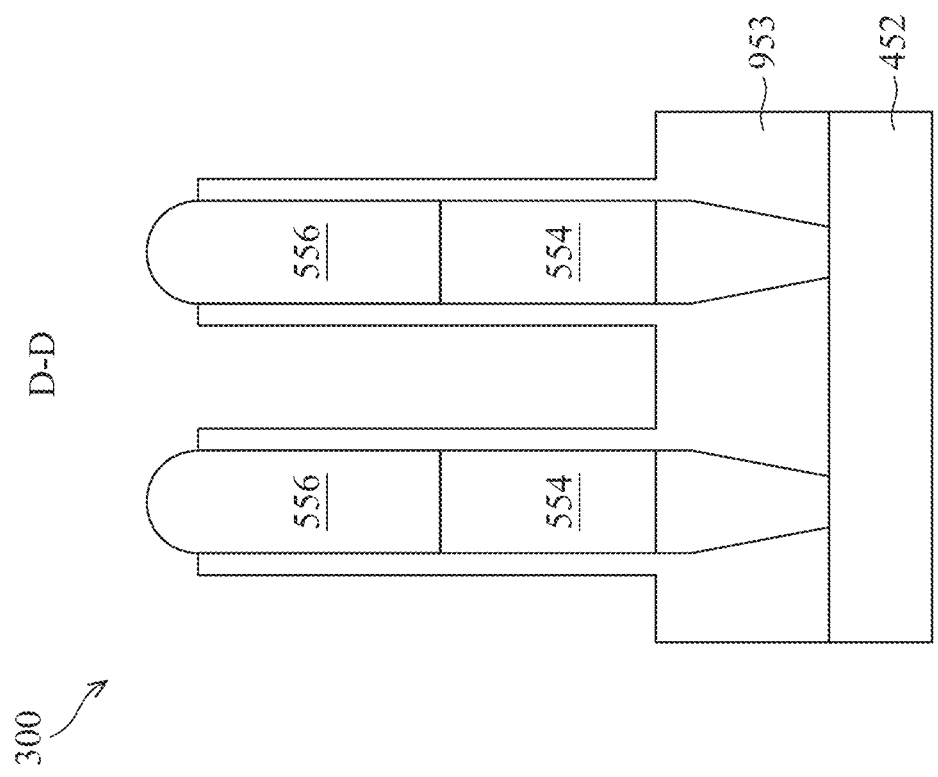

Next, in FIGS. 11A and 11B, a gate fill material 953 is formed over the FinFET device 300 of FIGS. 10A and 10B. The gate fill material 953 fills the space between lower portions 554L of the gate electrode 554. The gate fill material 953 may also be formed along sidewalls of the dummy gate structure 550. The gate fill material 953 may be formed in a bottom-up fashion, using a suitable deposition process such as CVD, PECVD, ALD, or plasma-enhanced ALD (PEALD). In some embodiments, the gate fill material 953 is removed in subsequent processing, and therefore, the gate fill material 953 may also be referred to as a dummy gate fill material. In the illustrated embodiment, the gate fill material 953 is formed of a suitable material that provides etching selectivity over (e.g., having different etching rate from) the material of the gate electrode 554, such that the gate electrode 554 and the gate fill material 953 are removed in two different etching processes in subsequent processing. Details are discussed below. Example materials for the gate fill material 953 include silicon germanium (SiGe), silicon nitride (SiN), silicon oxynitride (SiON), silicon oxycarbonitride (SiOCN), silicon carbide (SiC), silicon oxycarbides (SiOC), or silicon oxide (SiO), or the like.

Next, in FIGS. 12A and 12B, an anisotropic etching process, such as a plasma etching process, is performed to remove portions of the gate fill material 953 (e.g., portions disposed outside boundaries or sidewalls of the gate electrode 554). In an embodiment where a plasma etching process is used to remove portions of the gate fill material 953, a bias voltage of the plasma etching process is tuned (e.g., adjusted) to adjust a lateral etching rate of the plasma etching process. In the example of FIGS. 12A and 12B, portions of the gate fill material 953, such as portions disposed along sidewalls of the dummy gate structure 550 and portions disposed between dummy gate structures 550, are removed, and remaining portions of the gate fill material 953 are disposed within lateral extents (e.g., within boundaries defined by sidewalls) of the dummy gate structures 550. For example, the gate fill material 953 is disposed around the lower portion 554L of the gate electrode 554, e.g., in spaces between slanted sidewalls of the lower portion 68L of the gate electrode 554 and the isolation regions 452. In FIG. 12A, exterior sidewalls of the remaining portions of the gate fill material 953 are aligned with respective sidewalls of the gate electrode 554. In other embodiments, after the anisotropic etching process, the remaining portions of the gate fill material 953 extend along (e.g., cover) the entire sidewalls of the dummy gate structure 550. Note that in the cross-sectional view of FIG. 12B, no gate fill material 953 is left over the gate dielectric 552 after the anisotropic etching process. A lateral dimension $W_4$ of the bottom of the gate fill material 953 may be from 3 Å to 1000 Å or from 5 Å to 1000 Å or from 10 Å to 1000 Å or any subrange or value within these ranges Next, in FIGS. 13A and 13B, gate spacers 1050 are formed along sidewalls of the dummy gate structure 550, including their portions 554 and 556, and along sidewalls of the gate fill material 953. The gate spacers 1050 are formed of a nitride, such as silicon nitride, silicon oxynitride, silicon carbonitride, the like, or a combination thereof, and may be formed using, e.g., a thermal oxidation, CVD, or other suitable deposition process, in some embodiments. The gate spacers 1050 are formed of a different material from that of the gate fill material 953 and that of the gate electrode 554, in the illustrated embodiment.

In an embodiment, the gate spacer 1050 is formed by first conformally depositing a gate spacer layer over the FinFET device 300. Next, an anisotropic etch process, such as a dry etch process, is performed to remove a first portion of the gate spacer layer disposed on upper surfaces of the FinFET device 300 (e.g., the upper surface of the mask 556) while keeping a second portion of the gate spacer layer disposed along sidewalls of the dummy gate structures 550 and along sidewalls of the gate fill material 953. The second portion of the gate spacer layer remaining after the anisotropic etch process forms the gate spacer 1050. The anisotropic etch process also removes horizontal portions of the gate spacer layer.

The shapes and formation methods of the gate spacer 1050 as illustrated in FIGS. 13A and 13B are merely non-limiting examples, and other shapes and formation methods are possible. These and other variations are fully intended to be included within the scope of the present disclosure.

Next, source/drain regions 1150 are formed in/over the fin 450 on opposing sides of the dummy gate structure 550. The source/drain regions 1150 are formed by forming recesses in the fin 450, then epitaxially growing a material in the recesses, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The gate dielectric 66 disposed outside boundaries (e.g., sidewalls) of the gate spacers 1050 is removed by the process to form the recesses for the source/drain regions 1150. As illustrated in FIG. 20B, the epitaxial source/drain regions 1150 may have surfaces raised from respective surfaces of the fins 450 (e.g. raised above the non-recessed portions of the fins 64) and may have facets. The source/drain regions 1150 of the adjacent fins 540 may merge to form a continuous epitaxial source/drain region 1150. In some embodiments, the source/drain regions 1150 for adjacent fins 450 do not merge together and remain separate source/drain regions 1150. In some embodiments, the resulting FinFET is an n-type FinFET, and source/drain regions 1150 comprise silicon carbide (SiC), silicon phosphorous (SiP), phosphorous-doped silicon carbon (SiCP), or the like. In some embodiments, the resulting FinFET is a p-type FinFET, and source/drain regions 1150 comprise SiGe, and a p-type impurity such as boron or indium.

The epitaxial source/drain regions 1150 may be implanted with dopants to form source/drain regions 1150 followed by an anneal process. The implanting process may include forming and patterning masks such as a photoresist to cover the regions of the FinFET device 300 that are to be protected from the implanting process. The source/drain regions 1150 may have an impurity (e.g., dopant) concentration in a range from about $1 \cdot 19$ cm$^{-3}$ to about $1 \cdot 21$ cm$^{-3}$. P-type impurities, such as boron or indium, may be implanted in the source/drain region 1150 of a P-type transistor. N-type impurities, such as phosphorous or arsenide, may be implanted in the source/drain regions 1150 of an N-type transistor. In some embodiments, the epitaxial source/drain regions may be in situ doped during growth.

FIG. 14A illustrates formation of gate spacers 1010 along sidewalls of the dummy gate structure 510, including their portions 514 and 516 in the high density area. Methods for forming gate spacers 1010 of the high density area may be similar to those for gate spacers 1050 of the low density area. FIG. 14B illustrates formation source/drain regions 1110 are formed in/over the fin 410 on opposing sides of the dummy gate structure 510 in the high density area. Methods for forming source/drain structures of the high density area may be similar to those for source/drain structures 1150 of the low density area.

Figures 15A, 15B:
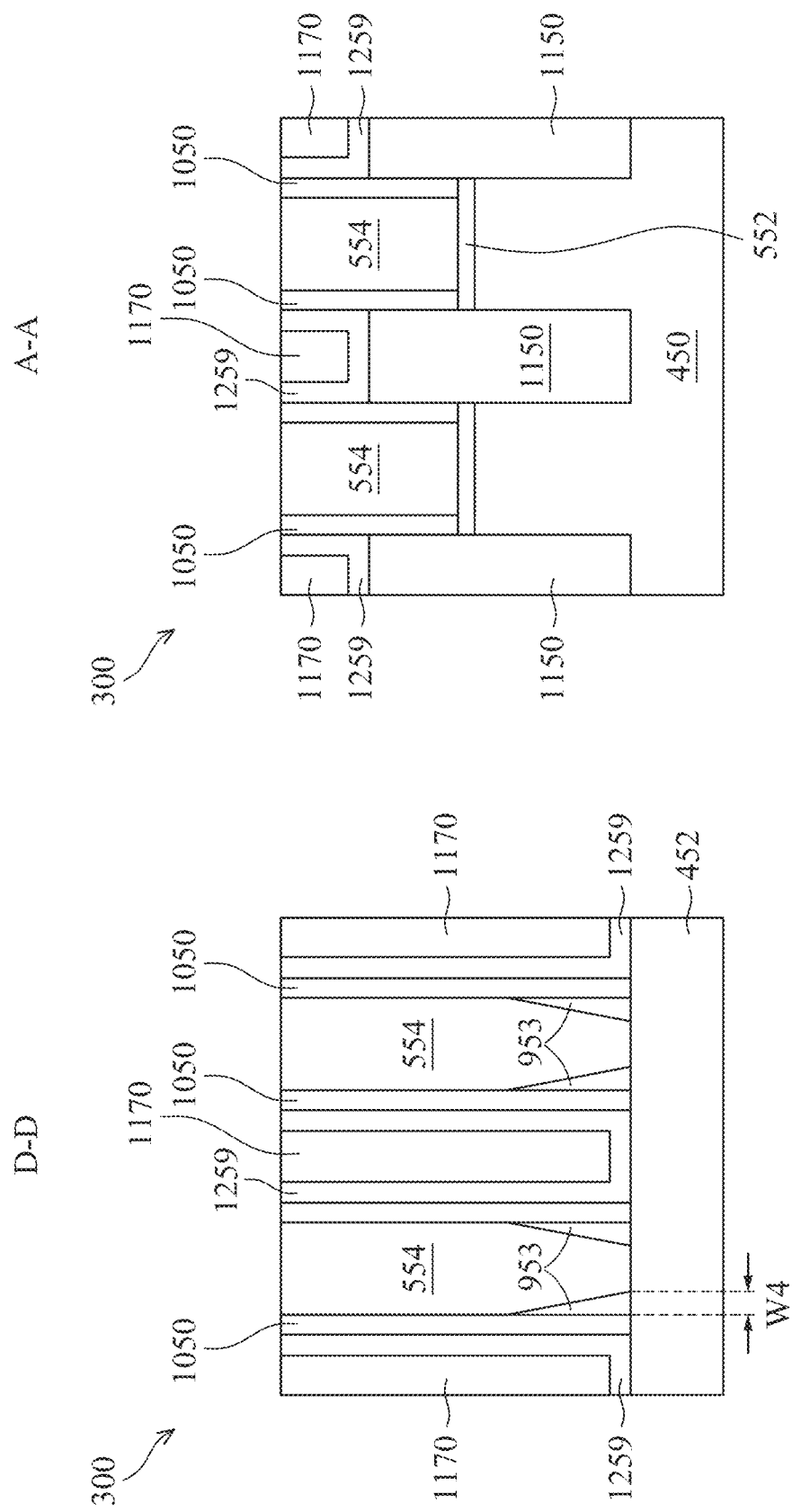

Next, in FIGS. 15A and 15B, a contact etch stop layer (CESL) 1259 is formed over the structure illustrated in FIGS. 13A and 13B for the low density area. The CESL 1259 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 1170 is formed over the CESL 1259 and over the dummy gate structures 550. In some embodiments, the first ILD 1170 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 556 and to remove portions of the CESL 1259 disposed over the gate electrode 554. After the planarization process, the top surface of the first ILD 1170 is level with the top surface of the gate electrode 554, in some embodiments.

Figure 16B:
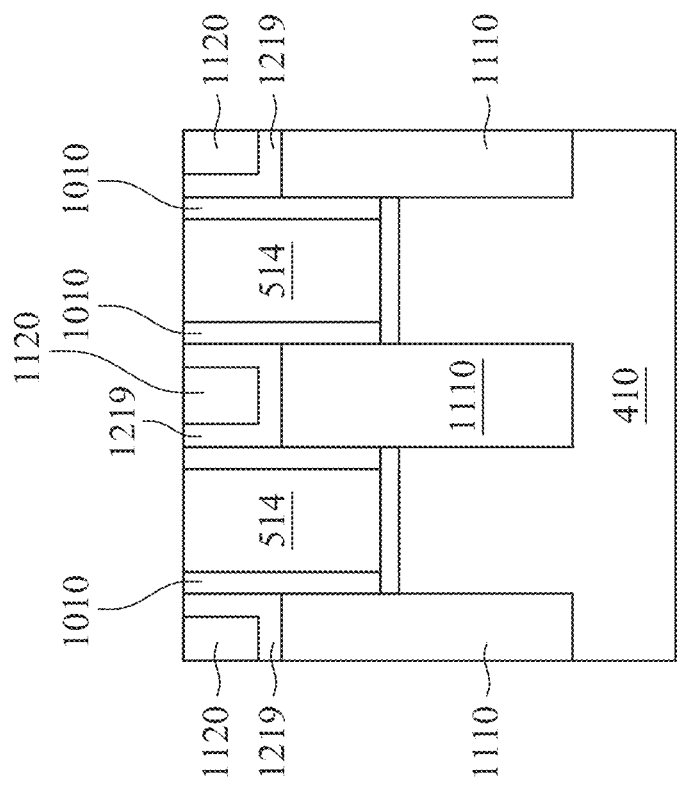
Figure 16A:
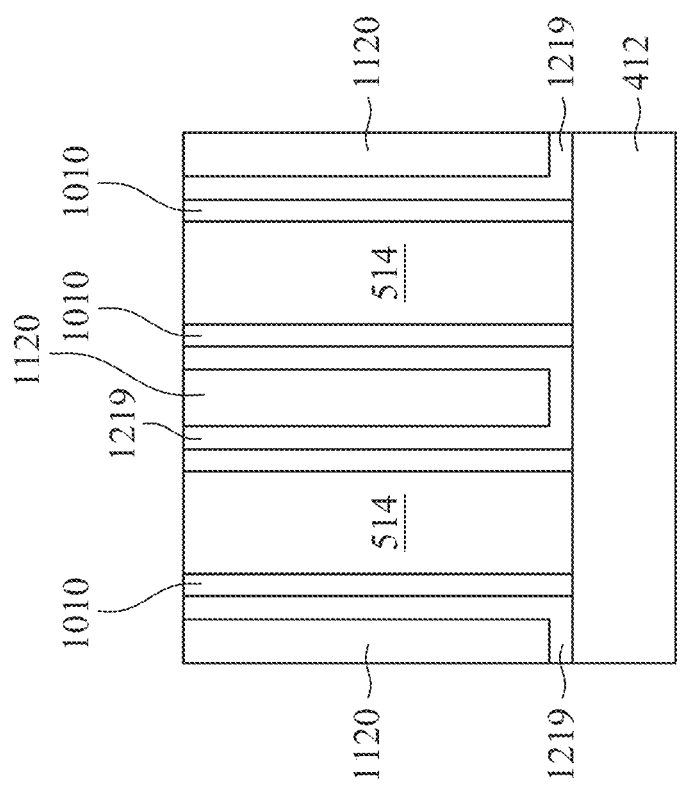

FIGS. 16A and 16B show formation a contact etch stop layer (CESL) 1219 over the structure illustrated in FIGS. 14A and 14B for the high density area and subsequent formation of a first interlayer dielectric (ILD) 1120 is formed over the CESL 1219 and over the dummy gate structures 510. Methods and materials for CESL 1219 may be similar to those for CESL 1259. Methods and materials for ILD 1120 may be similar to those for ILD 1170.

Next, in FIGS. 17A, 17B, 18A, 18B, 19A, and 19B, an embodiment gate-last process (sometimes referred to as replacement gate process) is performed to replace the dummy gate electrode 554, the gate fill material 953, and the dummy gate dielectric 552 with an active gate (may also be referred to as a replacement gate or a metal gate) and active gate dielectric material(s) in the low density area. In some embodiments, the gate structure that is formed after the replacement gate process is referred to as a metal gate structure or a replacement gate structure, and elements of the metal gate structure without the active gate dielectric may be referred to as a metal gate.

Figures 17A, 17B:
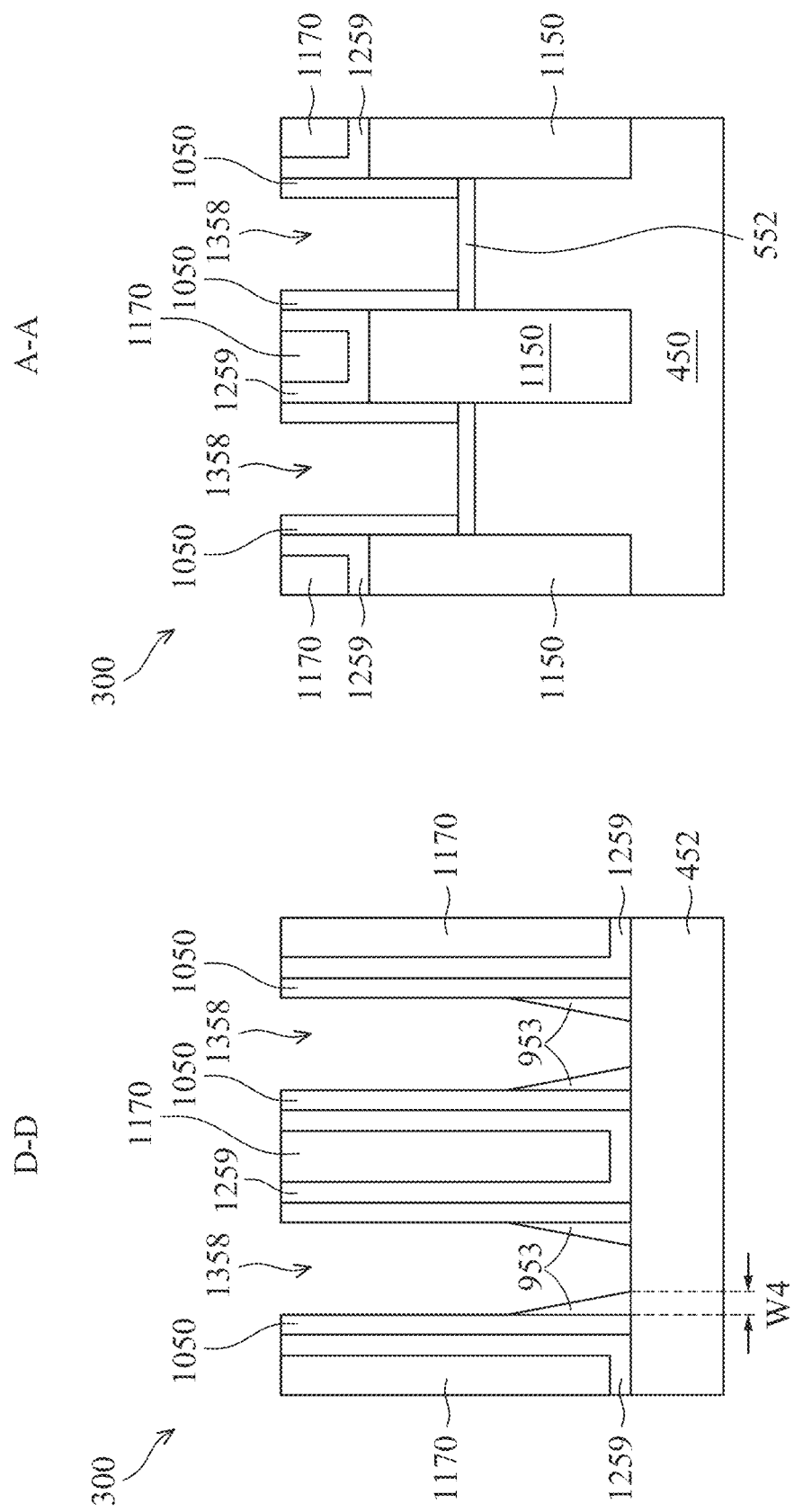

FIGS. 17A and 17B illustrate operation 214B in FIG. 2B. In FIGS. 17A and 17B, the dummy gate electrodes 554 are removed by a first etching process, e.g., using an etchant that is selective to (e.g., having a higher etch rate for) the material of the gate electrode 554. A suitable etching process, such as a wet etch process or a dry etch process, may be performed as the first etching process. After the first etching process, recesses 1358 are formed between respective gate spacers 1050. In FIG. 17A (cross-sectional view along cross-section D-D), the gate fill material 953 remain at the bottom of the recesses 1358, and upper inner sidewalls (e.g., upper portions of the sidewalls facing the gate fill material 953) of the gate spacers 1050 are exposed. In FIG. 17B (cross-sectional view along cross-section A-A), no gate fill material 953 is left and the dummy gate dielectric 552 is exposed by the recesses 1358.

FIGS. 18A and 18B illustrate operation 216B in FIG. 2B. In FIGS. 18A and 18B, a second etching process is performed after the first etching process is finished, to remove the gate fill material 953, e.g., using an etchant that is selective to the gate fill material 953. A suitable etching process, such as a wet etch process (e.g., using an etching chemical) or a dry etch process, may be performed as the second etching process. In an embodiment, a plasma etch process is performed as the second etching process, where the plasma process uses a gas source comprising a main etch gas and a dilute gas (also referred to as carrier gas). The main etch gas may comprises $Cl_2$, HBr, $CF_4$, $CHF_3$, $CH_2F_2$, $CH_3F$, $C_4F_6$, $BCl_3$, $SF_6$, $H_2$, combinations thereof, or the like, and the carrier gas comprises an inert gas, such as Ar, He, Ne, combinations thereof, or the like. In addition, the gas source may optionally include a passivation gas comprising $N_2$, $O_2$, $CO_2$, $SO_2$, CO, $SiCl_4$, combinations thereof, or the like. The passivation gas is used to tune the etching selectivity of the second etching process, so as to advantageously reduce or avoid damage to, e.g., the gate spacers 1050 and the first ILD 1170 during the second etching process, in some embodiments.

In some embodiments, a power of the plasma etching process (performed as the second etching process) is between about 10 W and about 3000 W, and a bias power of the plasma etching process is between about 10 W and about 3000 W. In some embodiments, the bias power is tuned to adjust the lateral etching rate of the plasma etching process. A pressure of the plasma etching process is between about 1 mTorr and about 800 mTorr. A flow rate of each of the main etching gas, the dilute gas, and the passivation gas is between about 10 standard cubic centimeters per minute (sccm) and about 5000 sccm. In the example of FIGS. 17A and 17B, after the plasma etching process, the gate fill material 953 is removed from the recesses 1358, and the plasma etching process also removes portions of the gate dielectric 552 underlying (e.g., directly below) the recesses 1358. As illustrated in FIG. 18B, remaining portions of the gate dielectric 552 are disposed directly under the gate spacers 1050. In some embodiments, the second etching process also removes upper portions of the isolation regions 452 (e.g., due to over-etching), and as a result, isolation regions 452 has a concave upper surface 452U2 under the recesses 1358. The concave upper surface 452U2 corresponds to an area of the upper surface of the isolation regions 452 not covered by the gate fill material 953 after the first etching process (see FIG. 17A). In the example of FIG. 18A, the isolation regions 452 also have a substantially flat upper surface 452U1 in areas covered by the gate fill material 953 after the first etching process, and as a result, little or no etching was done to those areas (e.g., 953U1) during the second etching process.

FIGS. 19A and 19B illustrate operation 218B in FIG. 2B. In FIGS. 19A and 19B, a metal gate structure 1254 (also referred to as a replacement gate structure) is formed in each of the recesses 1358. The metal gate structure 1254 may have a multi-layered structure (not illustrated in FIGS. 19A and 19B, but illustrated in FIG. 19C), in some embodiments. FIG. 18C illustrates a zoomed-in view of an area 1557 in FIG. 19A.

As illustrated in FIG. 19C, the metal gate structure 1254 includes a gate dielectric layer 1254A, a barrier layer 1254B, a work function layer 1254C, and a gate electrode 1254D. In accordance with some embodiments, to form the replacement gate structures 1254, the gate dielectric layer 1254A is deposited conformally in the recesses 1358, such as on the top surfaces and the sidewalls of the fins 450 and on sidewalls of the gate spacers 1050, and on a top surface of the first ILD 1170 (not shown). In some embodiments, the gate dielectric layer 1254A comprises silicon oxide, silicon nitride, or multilayers thereof. In other embodiments, the gate dielectric layer 1254A includes a high-k dielectric material, and in these embodiments, the gate dielectric layers 1254A may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 1254B is formed conformally over the gate dielectric layer 1254A. The barrier layer 1254B may comprise an electrically conductive material such as titanium nitride, although other materials, such as tantalum nitride, titanium, tantalum, or the like, may alternatively be utilized. The barrier layer 1254B may be formed using a CVD process, such as PECVD. However, other alternative processes, such as sputtering, metal organic chemical vapor deposition (MOCVD), or ALD, may alternatively be used.

Next, the work function layer 1254C, such as P-type work function layer or N-type work function layer, is formed in the recesses over the barrier layers 1254B. Exemplary P-type work function metals that may be included in the gate structures for P-type devices include TiN, TaN, Ru, Mo, Al, WN, ZrSi2, MoSi2, TaSi2, NiSi2, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 1254C. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 1254D is deposited over the seed layer, and fills the remaining portions of the recesses 1358. The gate electrode 1254D may be made of a metal-containing material such as Cu, Al, W, the like, combinations thereof, or multi-layers thereof, and may be formed by, e.g., electroplating, electroless plating, or other suitable method. After the formation of the gate electrode 1254D, a planarization process, such as a CMP, may be performed to remove the excess portions of the gate dielectric layer 1254A, the barrier layer 1254B, the work function layer 1254C, the seed layer, and the gate electrode 1254D, which excess portions are over the top surface of the first ILD 1170. The resulting remaining portions of the gate dielectric layer 1254A, the barrier layer 1254B, the work function layer 1254C, the seed layer, and the gate electrode 1254D thus form the replacement gate structure 1254 of the resulting FinFET device 300. Now that due to the concave upper surface 452U2 (see FIG. 18A) of the isolation regions 452, a portion 1254B2 of the bottom surface of the metal gate structure 1254 is curved, e.g., having a protrusion that protrudes downward into the isolation region 452, as illustrated in FIG. 19A. In some embodiments, a width W1 of the protrusion is between about 0 angstrom and about 3000 angstroms (e.g., 0 angstrom≤W1≤3000 angstroms) and a depth D1 of the protrusion is between about 0 angstrom and about 200 angstroms (e.g., 0 angstrom≤D1≤200 angstroms)). FIG. 19B illustrates portions of the metal gate structure 1254 disposed directly over the fin 450. The bottom surface of the metal gate structure 1254 does not protrude the isolation fully but only partially in the area corresponding to the concave upper surface 452U2. Portions 1254B1 of the bottom surface of the metal gate structure 1254, see FIG. 19A, corresponding to the areas of substantially flat upper surfaces 452U1, see FIG.

18A, do not protrude or extend into the isolation region 452. Each portion 1254B1 may have a lateral dimension $W_4$, which may be determined by a lateral dimension of the bottom of the gate fill material 953, see FIGS. 12A, 13A, 15A, 17A, 18A, 19A. In some embodiments, $W_4$ may be at least 3 Å, or at least 5 Å or at least 10 Å. If $W_4$ is too small, such as less than 3 Å, it may mean that the compensated dummy gate is not removed. There may no certain upper limit for W4. In some embodiments, $W_4$ may be from 3 Å to 1000 Å, which is a typical dimension for a gate structure, or from 5 Å to 1000 Å or from 10 Å to 1000 Å or any subrange or value within these ranges.

As mentioned above, in certain embodiments, method 200B may be used for forming FinFET device in the high density area. When method 200B is used for forming FinFET device in both high density area and low density area, a flat portion, such as portion 1254B1, of a metal gate structure, such as structure 1254, may have a lateral dimension, such as $W_4$, in the low density area, which is no smaller or greater than that in the high density area.

One skilled in the art will readily appreciate that additional processing, such as processing to form gate contact plugs, source/drain contact plugs, and interconnect structures, may be performed after the processing step of FIGS. 19A and 19B to complete the fabrication of the FinFET device 100. Details are not discussed here.

FIGS. 20A, 20B, 21A, 21B, an embodiment gate-last process (sometimes referred to as replacement gate process) is performed to replace the dummy gate electrode 514, and the dummy gate dielectric 512 with an active gate (may also be referred to as a replacement gate or a metal gate) and active gate dielectric material(s) in the high density area.

FIGS. 20A and 20B illustrate operation 214A in FIG. 2A. In FIGS. 20A and 20B, the material of the dummy gate electrodes 514 are removed by an etching process, e.g., using an etchant that is selective to (e.g., having a higher etch rate for) the material of the gate electrode 514. A suitable etching process, such as a wet etch process or a dry etch process, may be performed as the first etching process. After the etching process, recesses 1318 are formed between respective gate spacers 1010. The process of etching the dummy gate electrodes 514 may be similar to the first etching process for etching the gate electrode 554 illustrated in FIGS. 17A and 17B In some embodiments, the etching process also removes upper portions of the isolation regions 412 (e.g., due to over-etching), and as a result, isolation regions 412 has a concave upper surface 412U under the recesses 1318, see FIG. 20A. Unlike the situation in FIG. 18A, the upper surface of isolation regions 412 after the etching process may not include a substantially flat upper surface, such as surface 452U1 in FIG. 18A because in the high density, area no gate fill material, such as material 953, was used and only a single etching process, i.e. etching the dummy gate 514 is performed. In other words, the upper surface of isolation regions 412 may consist or consist essentially of the concave upper surface 412U.

Figure 21B:
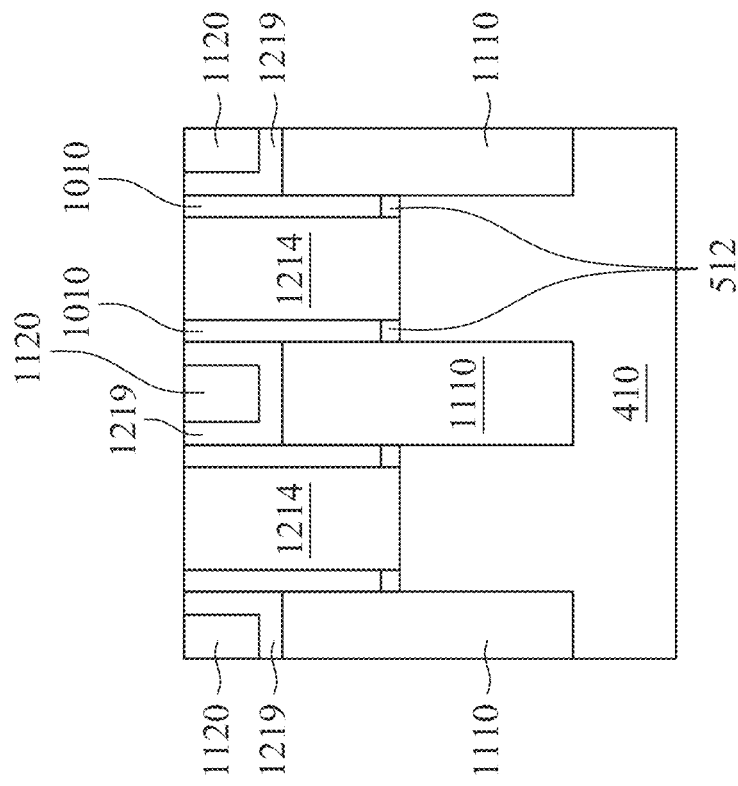
Figure 21A:
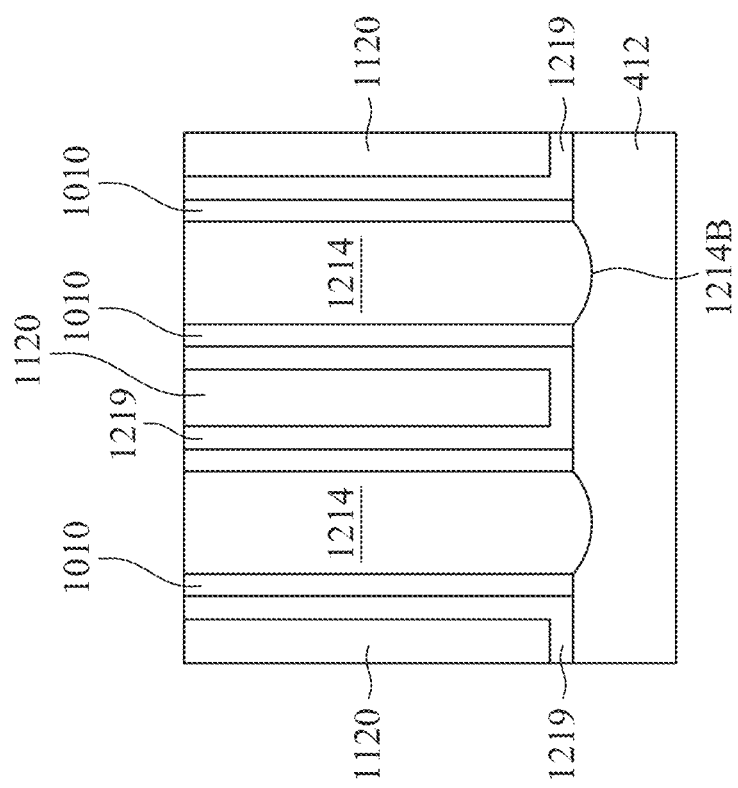

FIGS. 21A and 21B illustrate operation 218A in FIG. 2A. In FIGS. 21A and 21B, a metal gate structure 1214 (also referred to as a replacement gate structure) is formed in each of the recesses 1318. The metal gate structure 1214 may have a multi-layered structure similarly to metal gate structure 1254 (see FIG. 19C). Due to the concave upper surface 412U (see FIG. 20A) of the isolation regions 412, the bottom surface 1214B of the metal gate structure 1214 is curved, e.g., having a protrusion that protrudes or extends downward into the isolation region 412, as illustrated in FIG. 20A. In some embodiments, unlike the bottom surface of the metal gate structure 1254 for the low density area, see FIG. 19A, the bottom surface 1214B of the metal gate structure 1214 in the high density area fully extends into the isolation region 412, see FIG. 21A In other words, the bottom surface 1214B of the metal gate structure 1214 in the high density area may not include substantially flat areas, such as areas 1254B1, which do not extend or protrude into the isolation region 412.

In FIGS. 20A and 20B, the etching of the dummy gate 514 completely removes all the material of the dummy gate 514. As such, sidewalls of recess 1318 and sidewalls of metal gate structure 1214 formed in FIGS. 21A and 21B are vertical or substantially vertical. However, in some embodiments, etching operation 214A in FIG. 2A may remove only a portion of the material of the dummy gate 514. The remaining unetched portion of the dummy gate 514 may be used for determining a profile of the replacement metal gate structure, such as structure 1214.

Figure 44B:
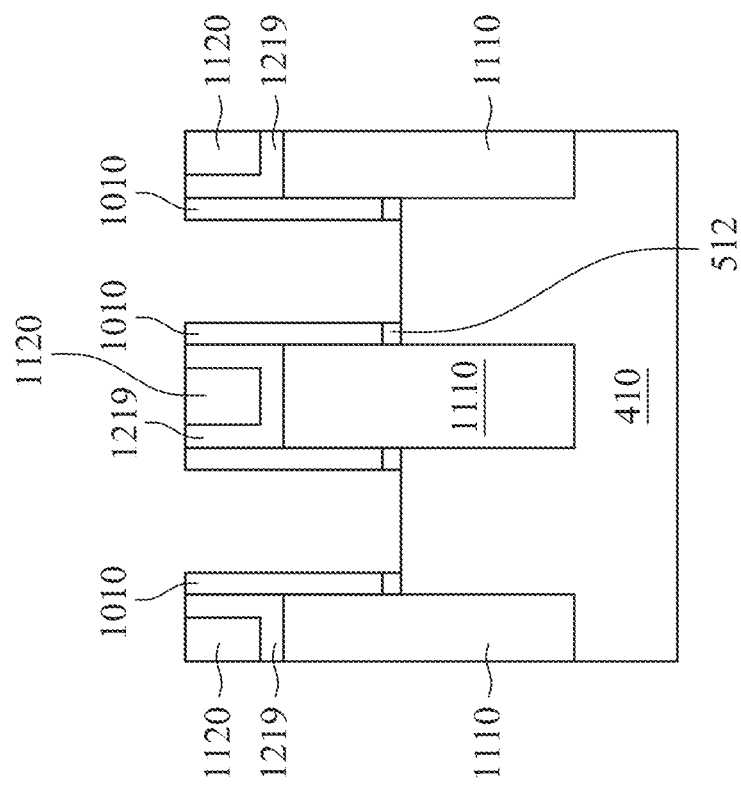
Figure 44A:
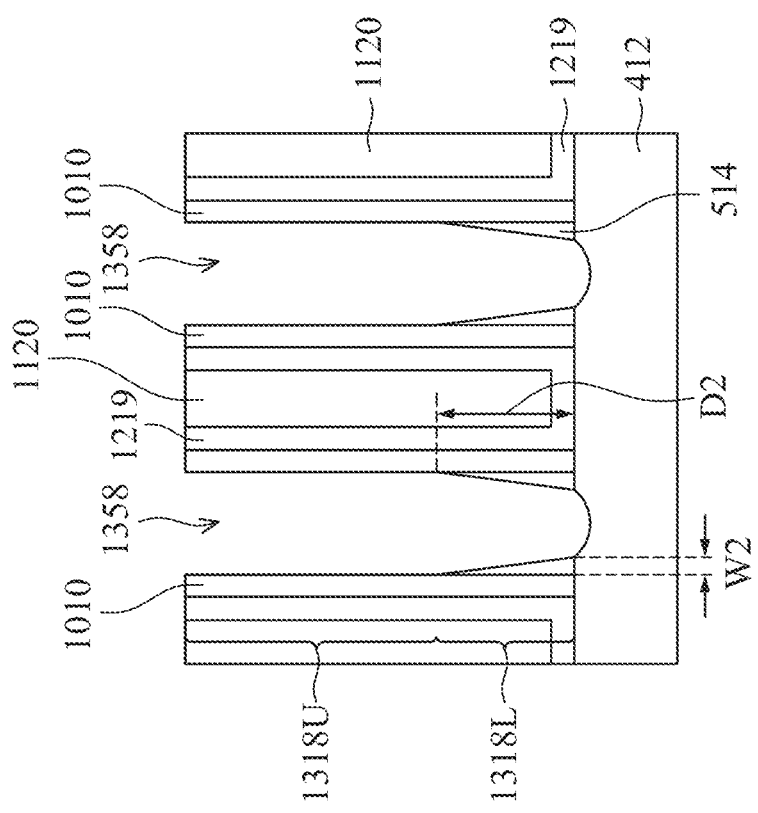

For example, FIGS. 44A and 44B show a situation when etching operation 214A leaves a portion of dummy gate 514 in the lower portion 1318L along sidewalls of recess 1318 while removing it completely in the upper portion 1318U along sidewalls of recess 1318. The remaining portion of the material of dummy gate 514 may be tapered. FIG. 44A characterizes the remaining tapered portion of the material of dummy gate 514 using parameters $W_2$ and $D_2$.

Figure 45A:
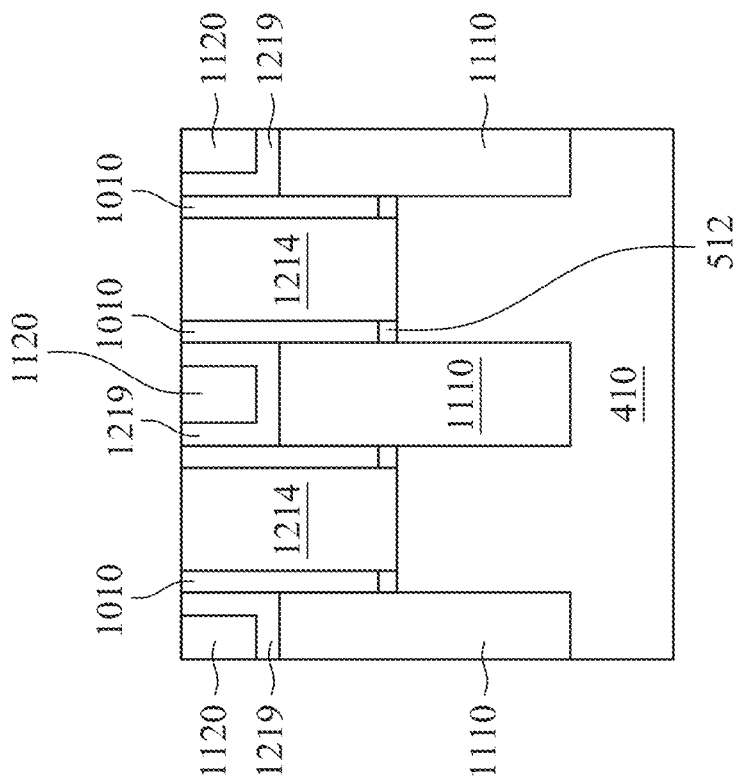
Figure 45B:
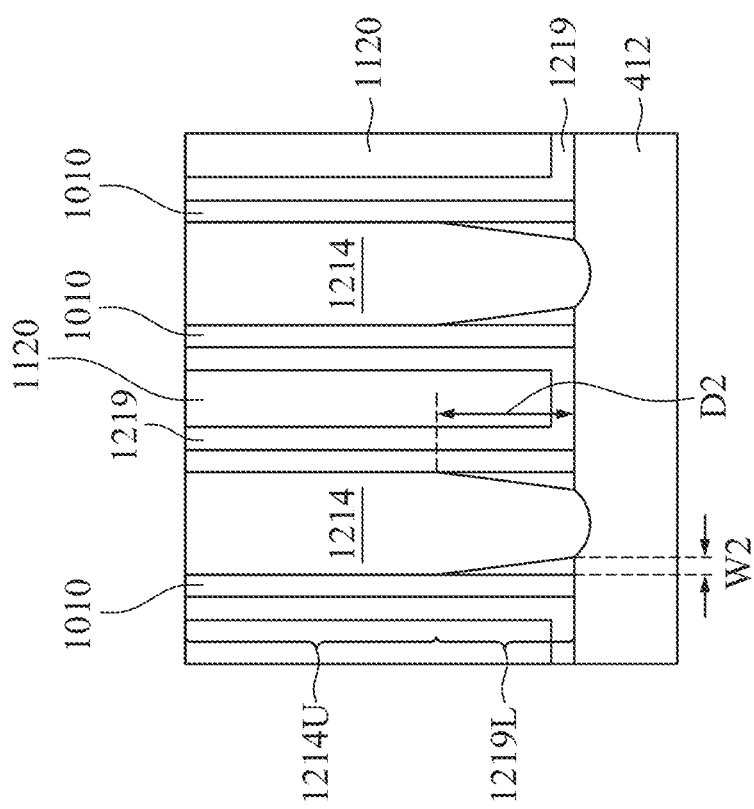

FIGS. 45A and 45B illustrate operation 218A which forms metal gate structure 1214 (also referred to as a replacement gate structure) in each of recesses 1318 formed in FIGS. 44A and 44B. Metal gate structures 1214 in FIG. 45A have vertical sidewalls in upper portion 1214U and tapered sidewalls in lower portion 1214L. Because a profile of metal gate structure 1214 is determined by a profile of corresponding recess 1318, tapered sidewalls in lower portion 1214L are characterized using parameters $W_2$ and $D_2$ as well. In some embodiments, $W_2$ may be from 0 Å to 500 Å or from 5 Å to 500 Å or from 10 Å to 500 Å or any value or subrange within these ranges. In some embodiments, $D_2$ may be from 0 Å to 1000 Å or from 5 Å to 1000 Å or from 10 Å to 1000 Å or any value or subrange within these ranges. $W_2$ and $D_2$ may be varied depending on needs for a specific device.

Figure 46B:
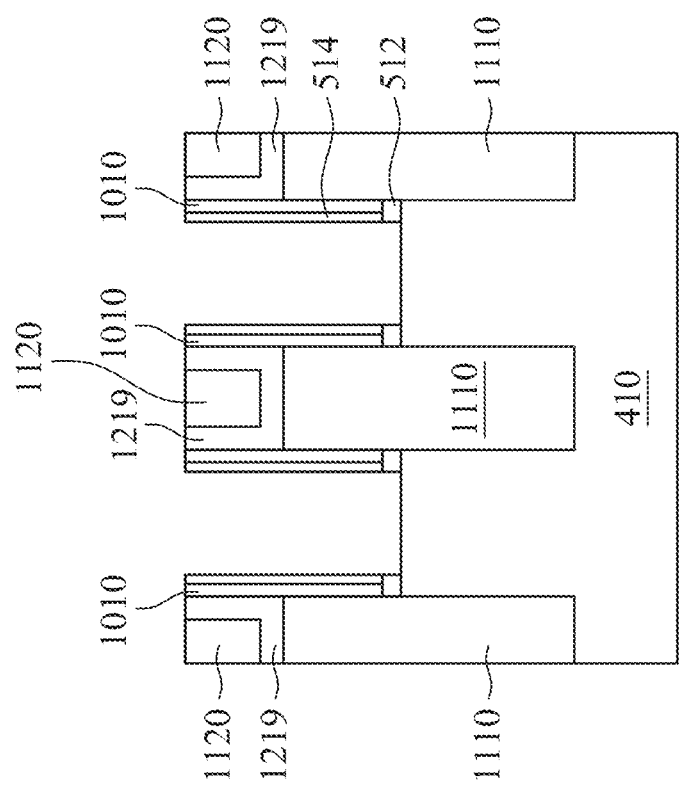
Figure 46A:
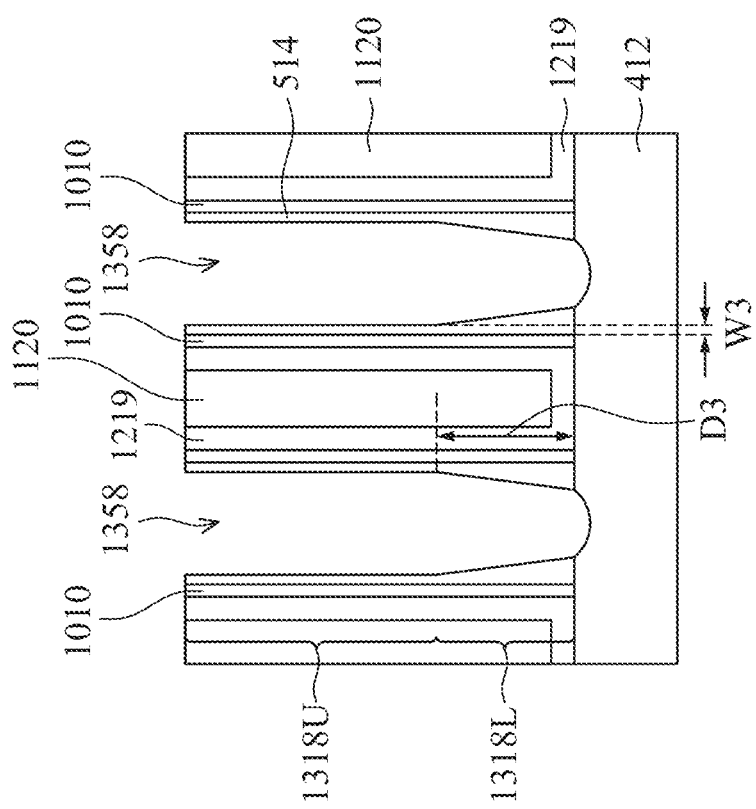

FIGS. 46A and 46B show a situation when etching operation 214A leaves a portion of dummy gate 514 in the lower portion 1318L and the upper portion 1318U along sidewalls of recess 1318. The remaining portion of the material of dummy gate 514 in the lower portion 1318L may be tapered. FIG. 44A characterizes the tapered portion of the material of dummy gate 514 in the lower portion 1318L using parameters $W_3$ and $D_3$. The remaining portion of the material of dummy gate 514 in the upper portion 1318U may be not tapered.

Figures 47A, 47B:
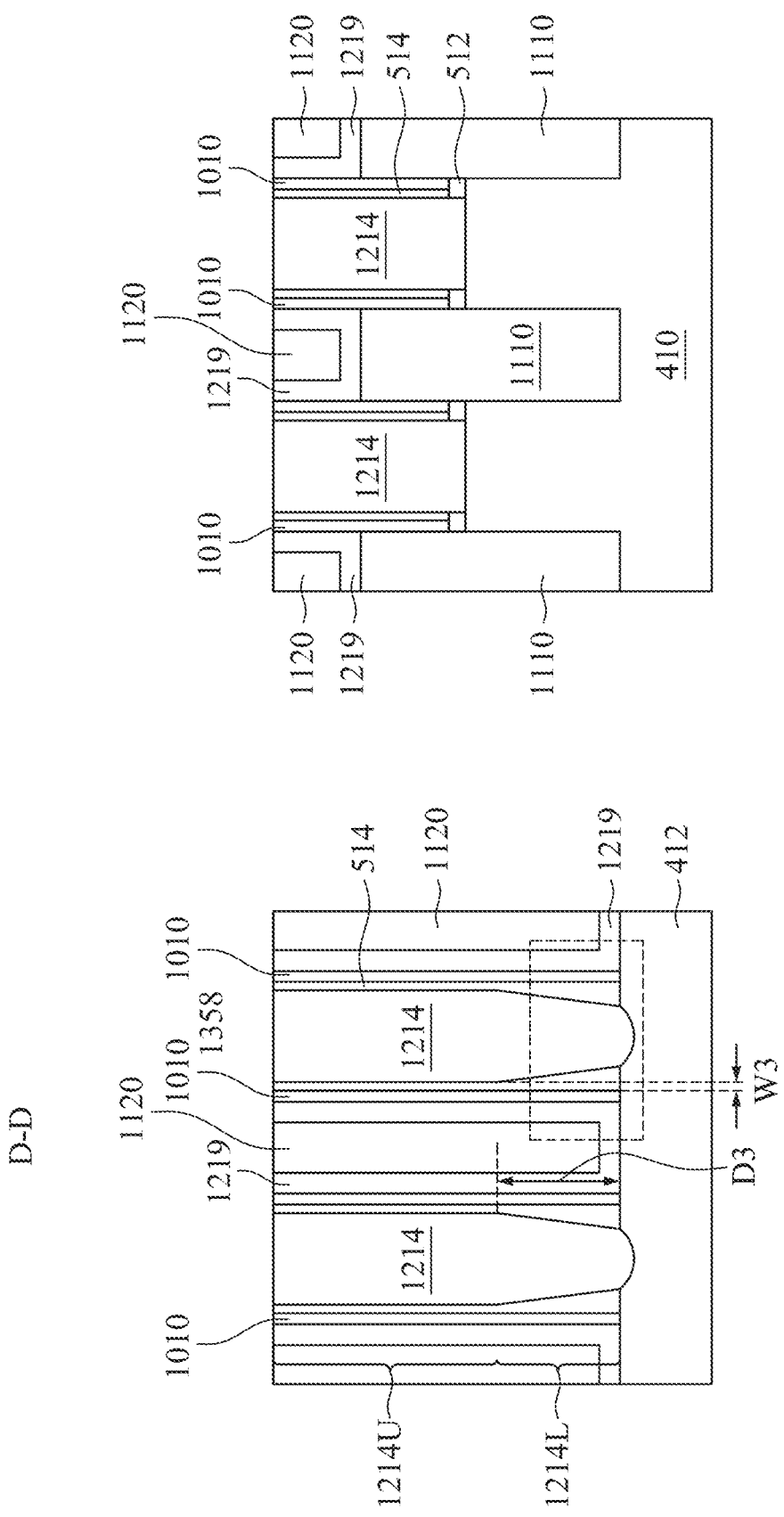

FIGS. 47A and 47B illustrate operation 218A which forms metal gate structure 1214 (also referred to as a replacement gate structure) in each of recesses 1318 formed in FIGS. 46A and 46B. The material of dummy gate 514 along the sidewalls of recesses 1318 may act as an additional gate spacer. Metal gate structures 1214 in FIG. 45A have vertical sidewalls in upper portion 1214U and tapered sidewalls in lower portion 1214L. Because a profile of metal gate structure 1214 is determined by a profile of corresponding recess 1318, tapered sidewalls in lower portion 1214L are characterized using parameters $W_3$ and $D_3$ as well. In some embodiments, $W_3$ may be from 0 Å to 500 Å or from 5 Å to 500 Å or from 10 Å to 500 Å or any value or subrange within these ranges. In some embodiments, $D_3$ may be from 0 Å to 1000 Å or from 5 Å to 1000 Å or from 10 Å to 1000 Å or any value or subrange within these ranges. $W_3$ and $D_3$ may be varied depending on needs for a specific device.

Figure 47C:
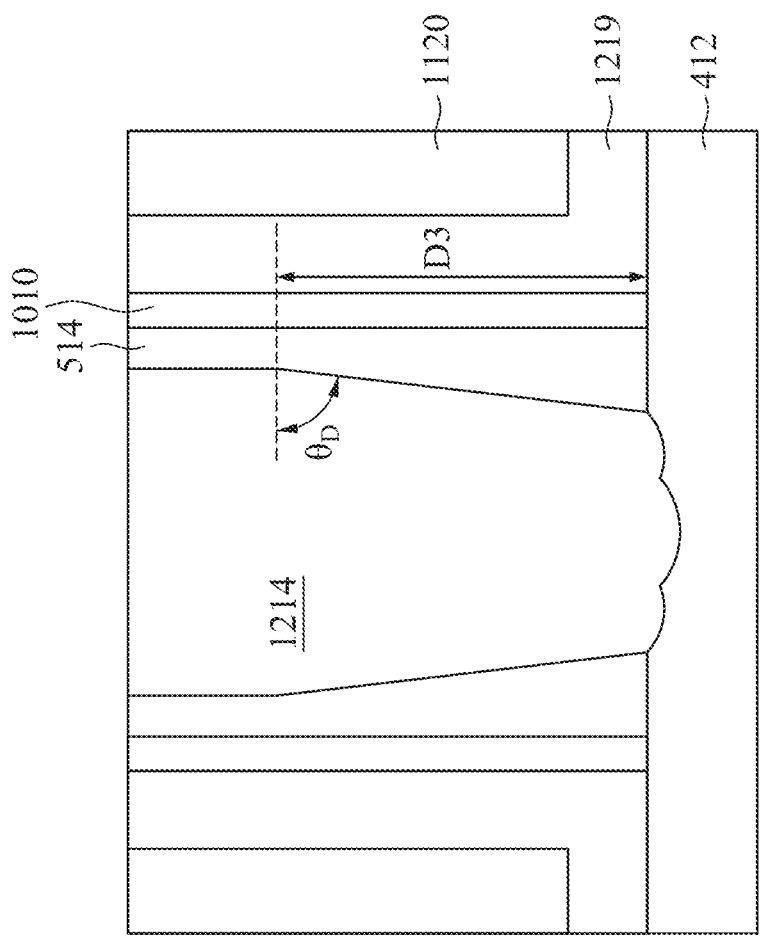

FIG. 47C is a zoom of the selected area in FIG. 47A. FIG. 47C defines transition angle $\theta_D$ between a direction perpendicular to sidewalls of metal gate structure 1214 in its upper portion 1214U and a direction of tapered sidewalls of metal gate structure 1214 in its lower portion 1214L. Transition angle $\theta_D$ may be less than 90°. In certain embodiments, $\theta_D$ may be 300 or greater but less than 90°.

Figure 22B:
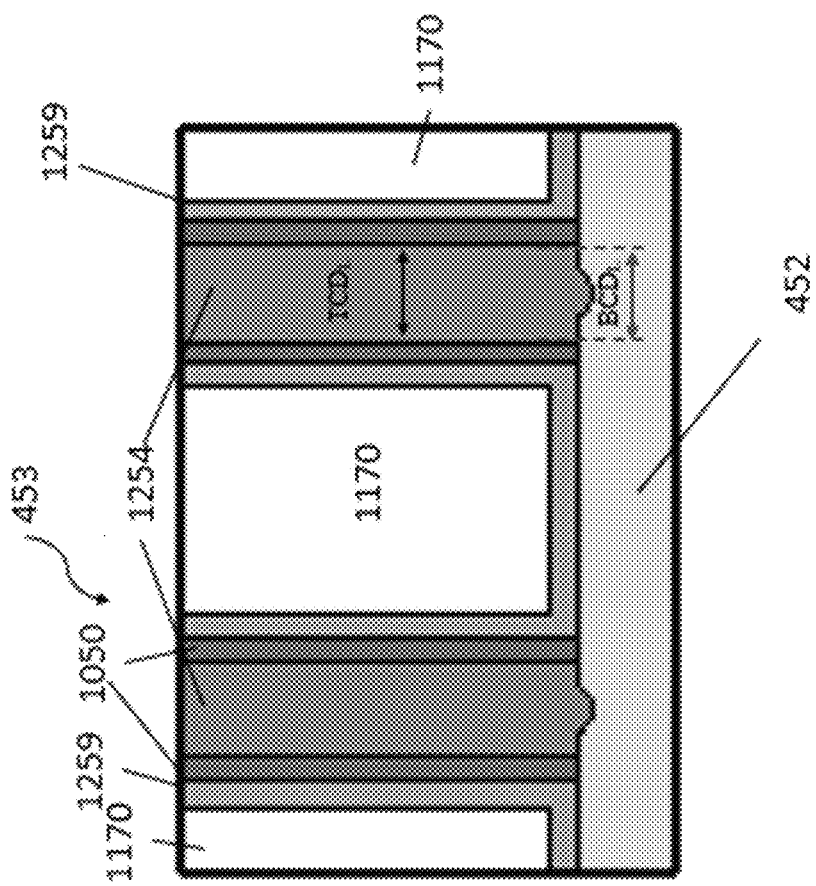
Figure 22A:
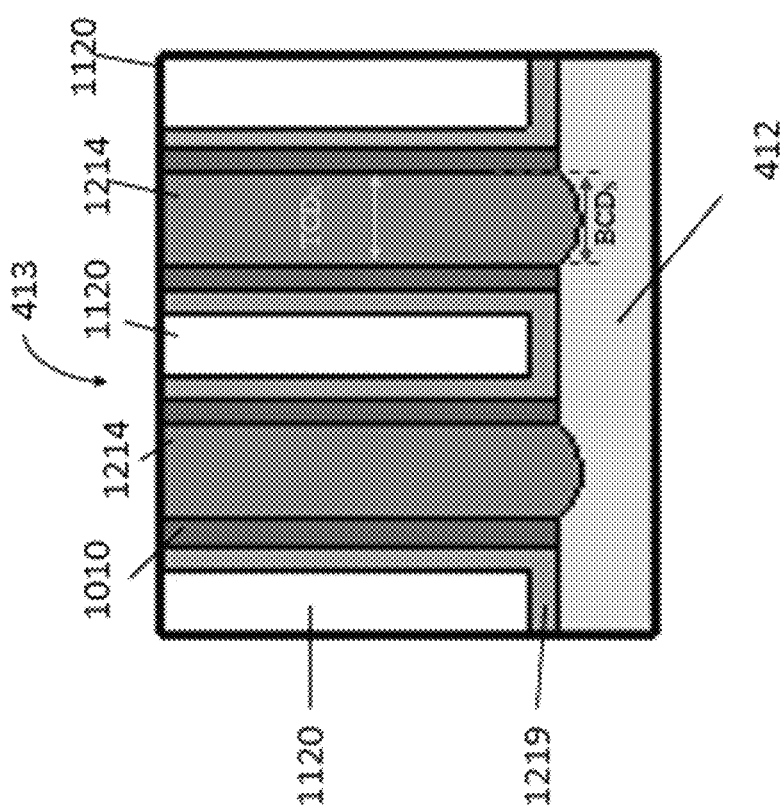

FIGS. 22A and 22B provide comparison between the gate electrode in the high density area (FIG. 22A) and the low density area (FIG. 22B). FIG. 22A essentially reproduces FIG. 21A, while FIG. 22B essentially reproduces FIG. 19A. $TCD_S$ ($TCD_L$) may refer to a distance between the sidewalls of the metal gate structure 1214 (1254) around in the upper portion; $BCD_S$ ($BCD_L$) can refer to a distance between the sidewalls of the metal gate structure 1214 (1254) at the bottom portion near the respective bottom surface. In some embodiments, each $TCD_S$, $BCD_S$ $TCD_L$, and $BCD_L$ may be between 10 Å to 3000 Å. In some embodiments, $TCD_L/TCD_S$ may be from 0.7 to 1.3. In some embodiments, $TCD_S/BCD_S$ may be close to $TCD_L/BCD_L$. For example, $TCD_S/BCD_S$ may be from 0.8 of $TCD_L/BCD_L$ to 1.2 of $TCD_L/BCD_L$ or 0.9 of $TCD_L/BCD_L$ to 1.1 of $TCD_L/BCD_L$.

Figures 23A, 23B:
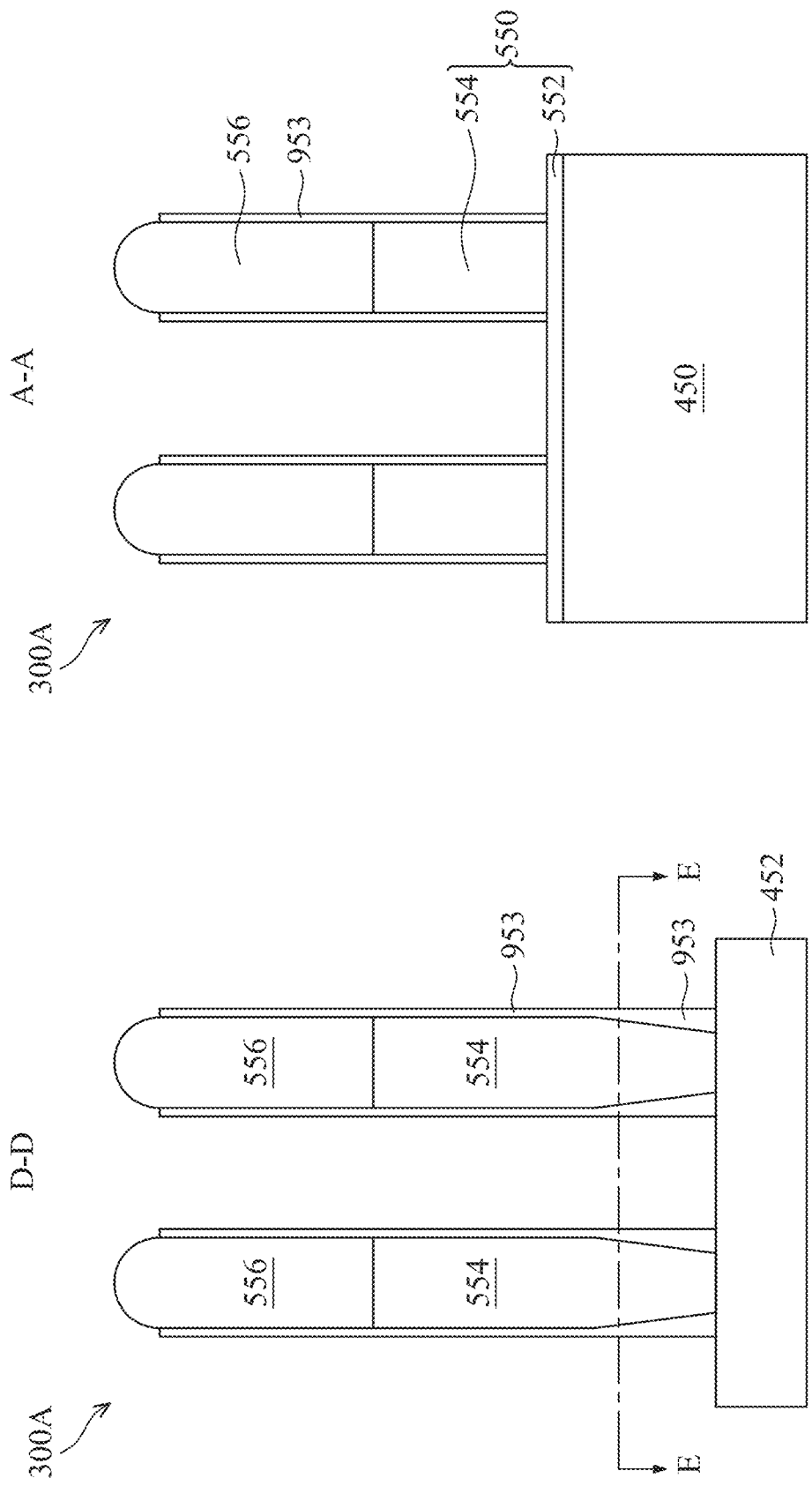

FIGS. 23A, 23B, 24A, 24B, 25A, 25B, 26A, and 26B illustrate cross-sectional views of a FinFET device 300A, which may be formed in the low density area 350, at various stages of fabrication, in an embodiment. The FinFET device 300A in FIGS. 23A and 23B is similar to the FinFET device 300 in FIGS. 12A and 12B, but with gate fill materials 953 along sidewalls of the gate electrode 554. In other words, the processing of FIGS. 23A and 23B follows the processing step of FIGS. 11A and 11B. In particular, compared with FIGS. 12A and 12B, the lateral etching rate of the second etching process (e.g., an anisotropic etching process) is adjusted (e.g., reduced), such that sidewalls of the dummy gate structure 550 (e.g., 554 and 556) are covered (e.g., completely covered) by remaining portions of the gate fill material 953 in FIGS. 23A and 23B. In other words, the remaining portions of the gate fill material 953 extends continuously from an upper surface of the dummy gate structure 550 distal from the isolation regions 452 to the isolation regions 452. In another embodiment, the shape and location of the gate fill material 953 illustrated in FIGS. 23A and 23B may be formed directly after the bottom-up deposition process to form the gate fill material 953, and no additional etching process is performed to shape the gate fill material 953 in order to form the structure illustrated in FIGS. 23A and 23B.

Figures 24A, 24B:
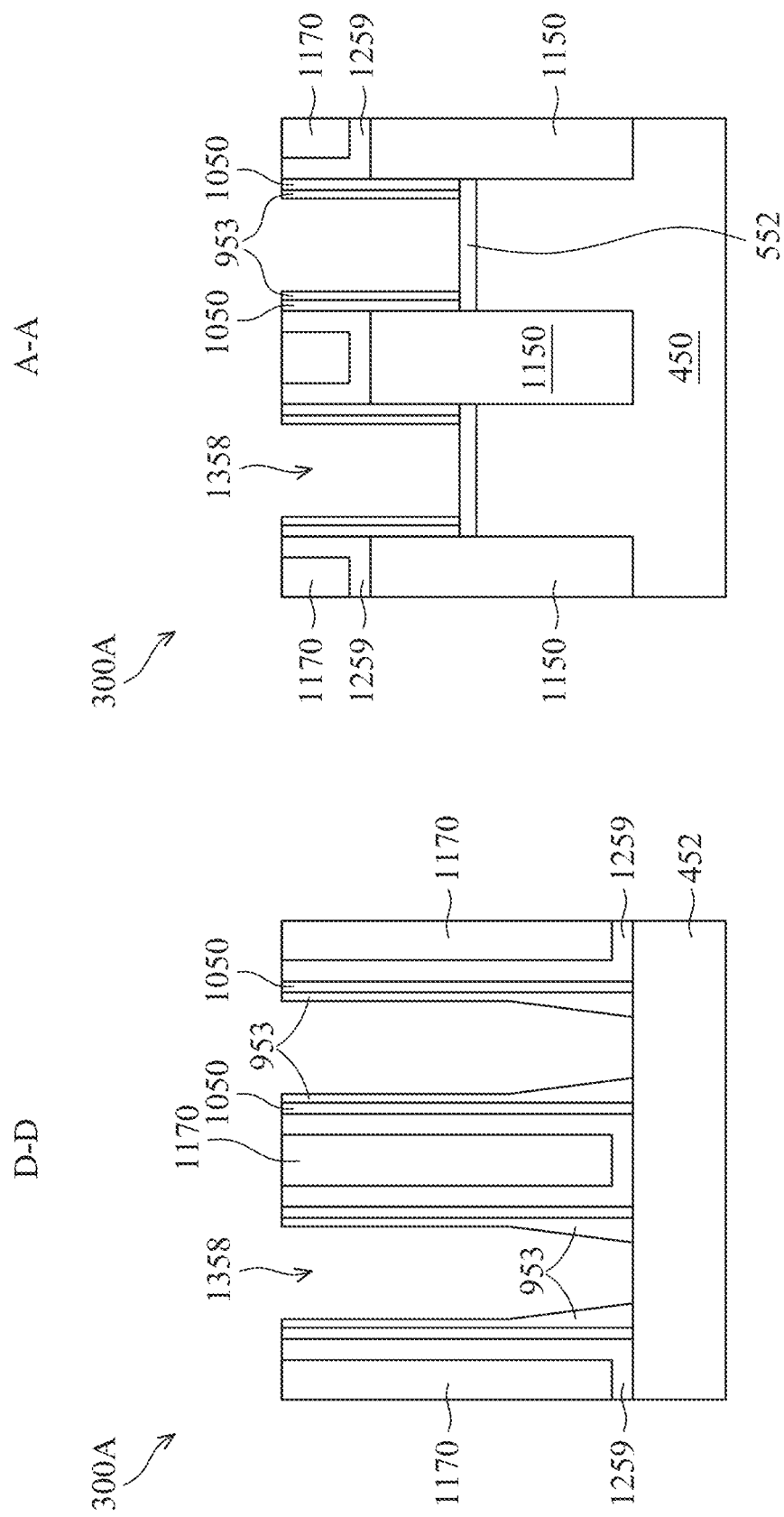

Next, in FIGS. 24A and 24B, the gate spacers 1050, the source/drain regions 1150, the CESL 1259, and the first ILD 1170 are formed, using the same or similar processing steps as illustrated in FIGS. 13A, 13B, 15A and 15B. A planarization process, such as CMP, may be performed next to remove the mask 556 and to achieve a coplanar upper surface between the gate electrode 554, the gate spacers 1050, the CESL 1259, and the first ILD 1170.

Next, the first etching process is performed to remove the dummy gate electrode 554, similar to FIGS. 17A and 17B. After the first etching process, the recesses 1358 are formed. Note that compared with FIG. 17A, portions of the gate fill material 953 are left covering the entire inner sidewalls (e.g., sidewalls facing the gate fill material 953) of the gate spacers 1050. In other words, the gate fill material 953 extends continuously from an upper surface of the gate spacer 1050 to the upper surface of the isolation regions 452 in the cross-sectional view of FIG. 24A, and extends continuously from the upper surface of the gate spacer 1050 to the upper surface of the gate dielectric 552 in the cross-sectional view of FIG. 24B.

Figures 25A, 25B:
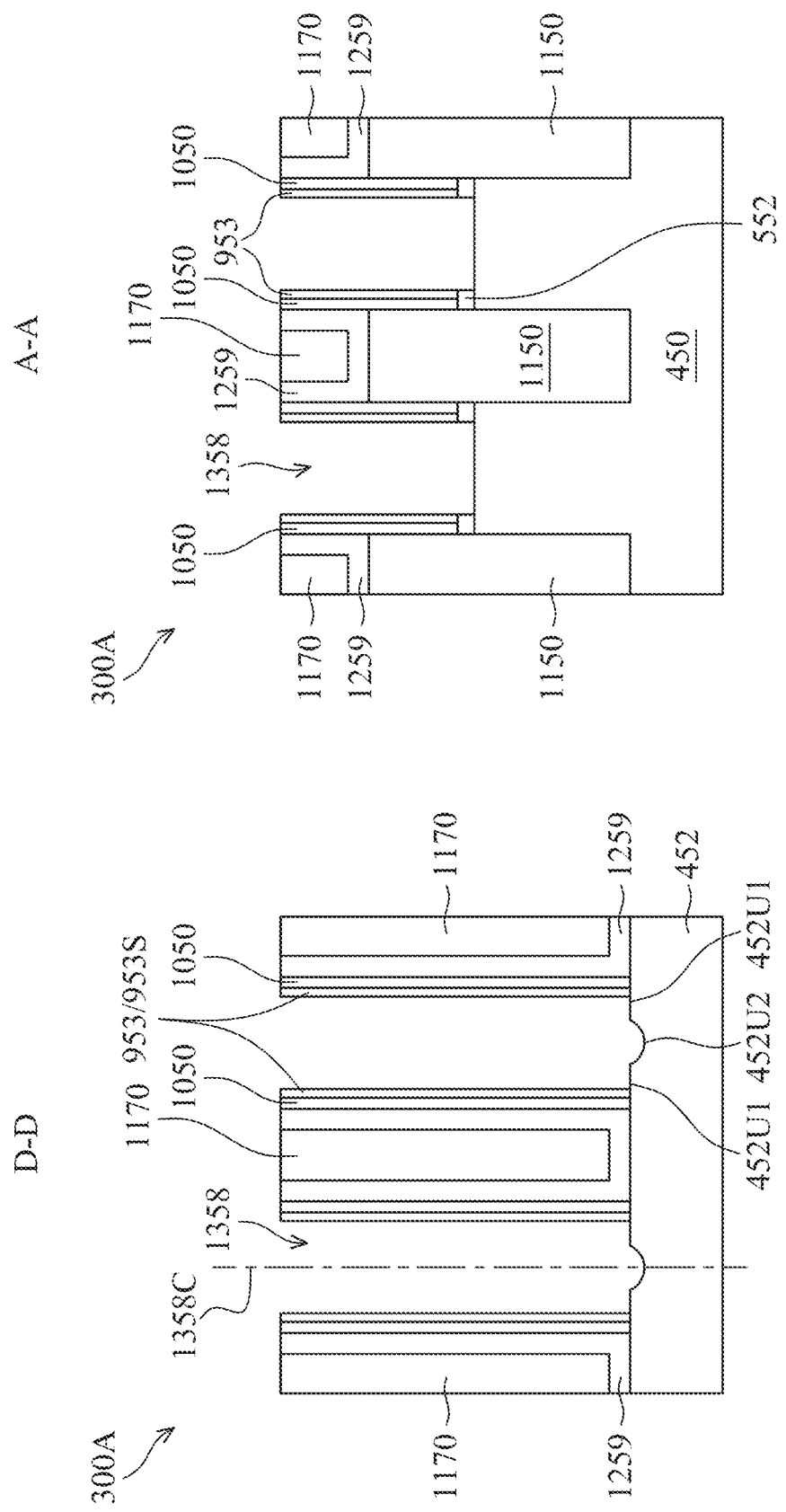

Next, in FIGS. 25A and 25B, the second etching process is performed to remove portions of the gate fill material 953. In some embodiments, the second etching process is a plasma etch process same as or similar to that of FIGS. 18A and 18B. The bias power of the plasma etch process may be adjusted to achieve a target level of anisotropicity (e.g., a target level of lateral etching rate). As illustrated in FIGS. 25A and 25B, after the second etching process, remaining portions of the gate fill material 953 covers the entire inner sidewalls of the gate spacers 1050. The remaining portions of the gate fill material 953 in FIG. 25A may function as another gate spacer. In the example of FIGS. 25A and 25B, the inner sidewalls 953S of the remaining portion of gate fill material 953 are straight (e.g., perpendicular to the upper surface of the substrate) such that the thickness of gate fill material 953 is substantially uniform.

Note that in FIG. 25A, a center area of the upper surface of the isolation regions 452, which is exposed in FIG. 24A, has a curved (e.g., concave) upper surface 452U2 due to, e.g., over etching during the second etching process. Upper surface 452U1 of the isolation regions, which is under (e.g., covered by) the gate fill material 953 in FIG. 24A, is substantially flat, since it is protected from the second etching process.

Figures 26A, 26B:
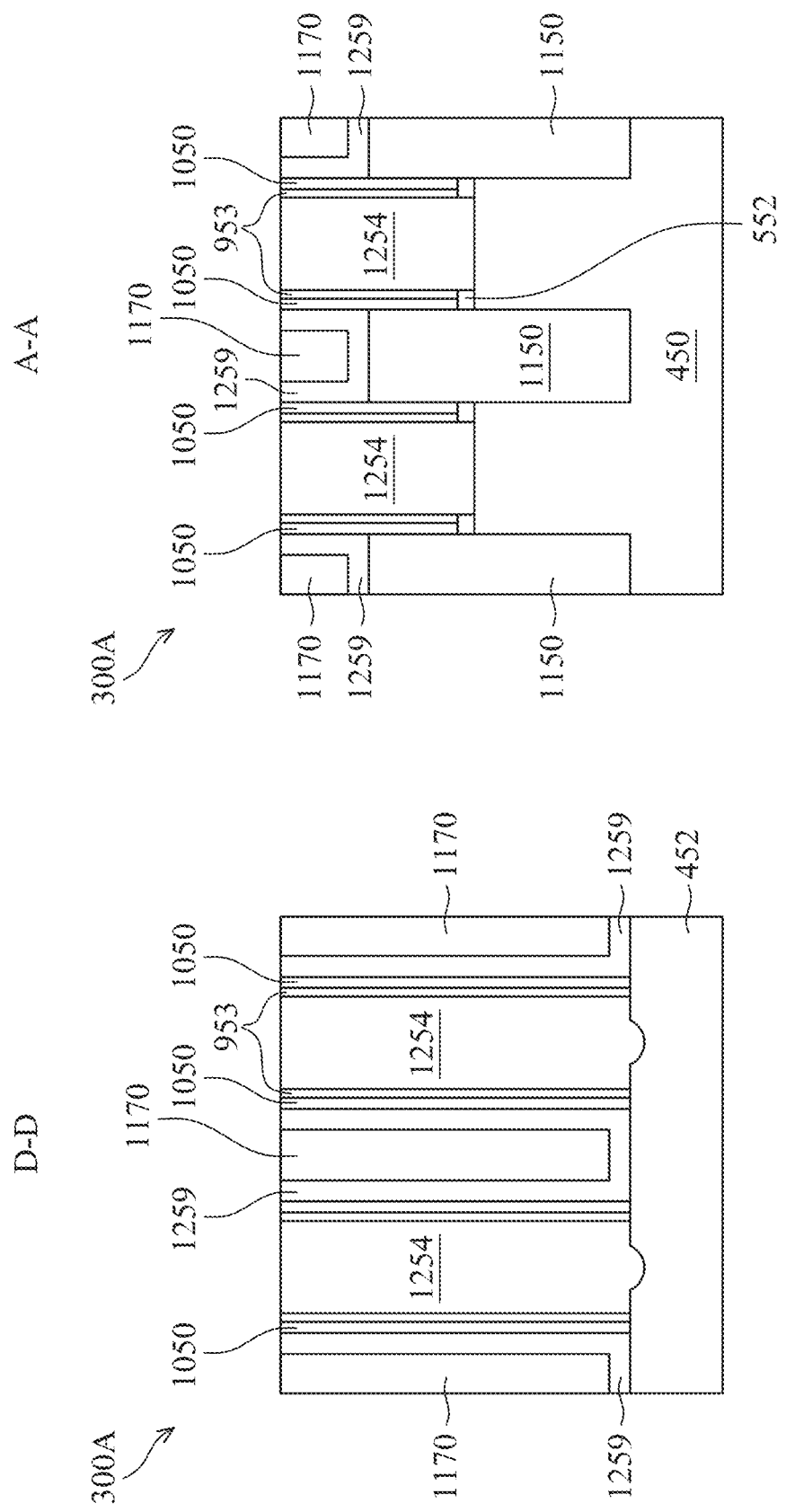

Next, in FIGS. 26A and 26B, the metal gate structure 1254 is formed to fill the recesses 1358, using the same or similar processing as in FIGS. 19A and 19B. Details are not repeated here.

Figures 27A, 27B:
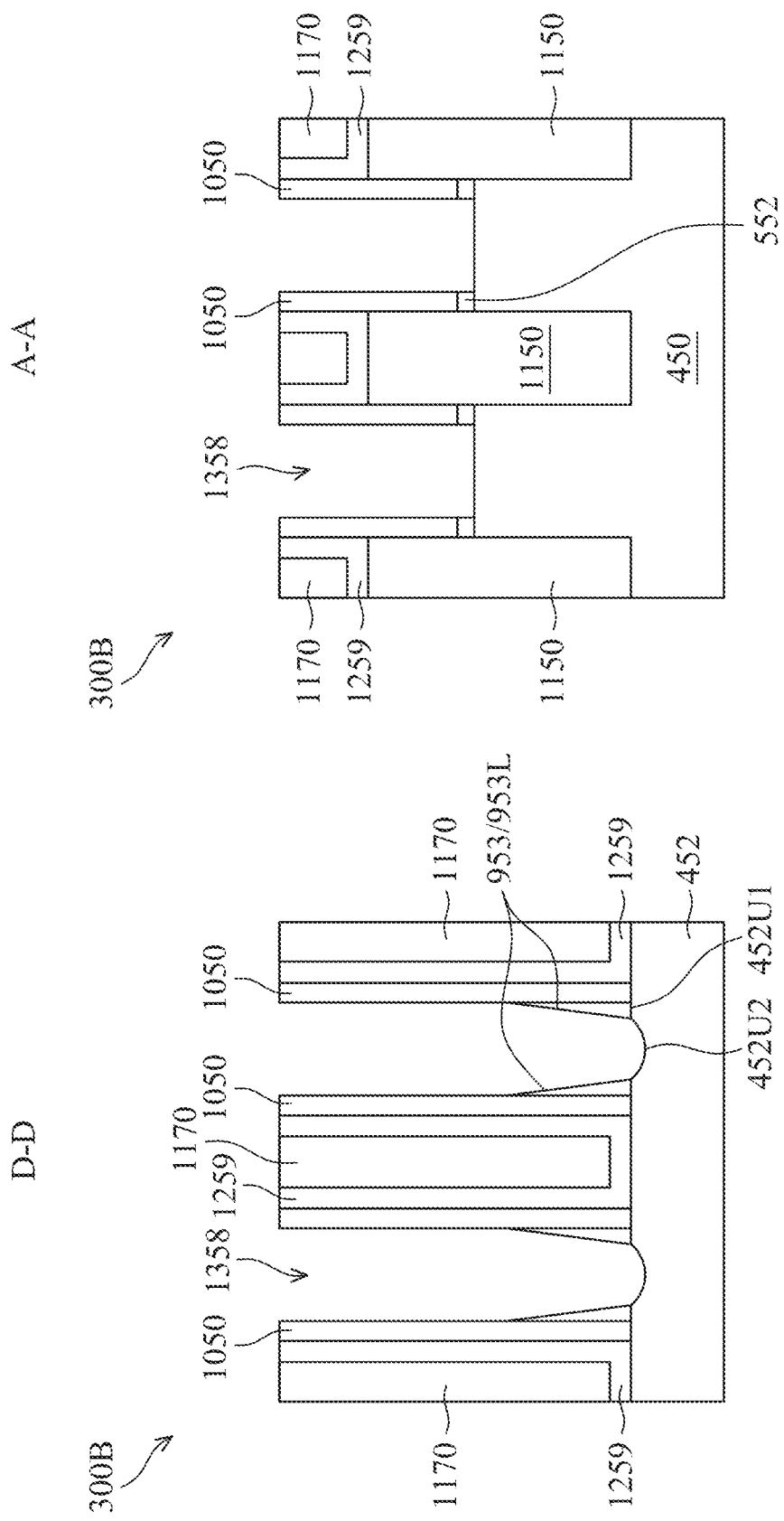

FIGS. 27A, 27B, 28A, and 28B illustrate cross-sectional views of a FinFET device 300B in the low density area 350 at various stages of fabrication, in an embodiment. The FinFET device 300B in FIGS. 27A and 27B is similar to the FinFET device 300 in FIGS. 18A and 18B, but with the process condition of the second etching process adjusted such that, after the second etching process, lower portions 953L of the gate fill material 953 are left. In FIG. 27A, an area of the upper surface of the isolation regions 452, which area is exposed by the recess 1358, has a curved (e.g., concave) upper surface 452U2 due to, e.g., over etching during the second etching process. Upper surface 452U1 of the isolation regions, which is under (e.g., covered by) the lower portion 953L of the gate fill material 953, is substantially flat, since it is protected from the second etching process.

Figures 28A, 28B:
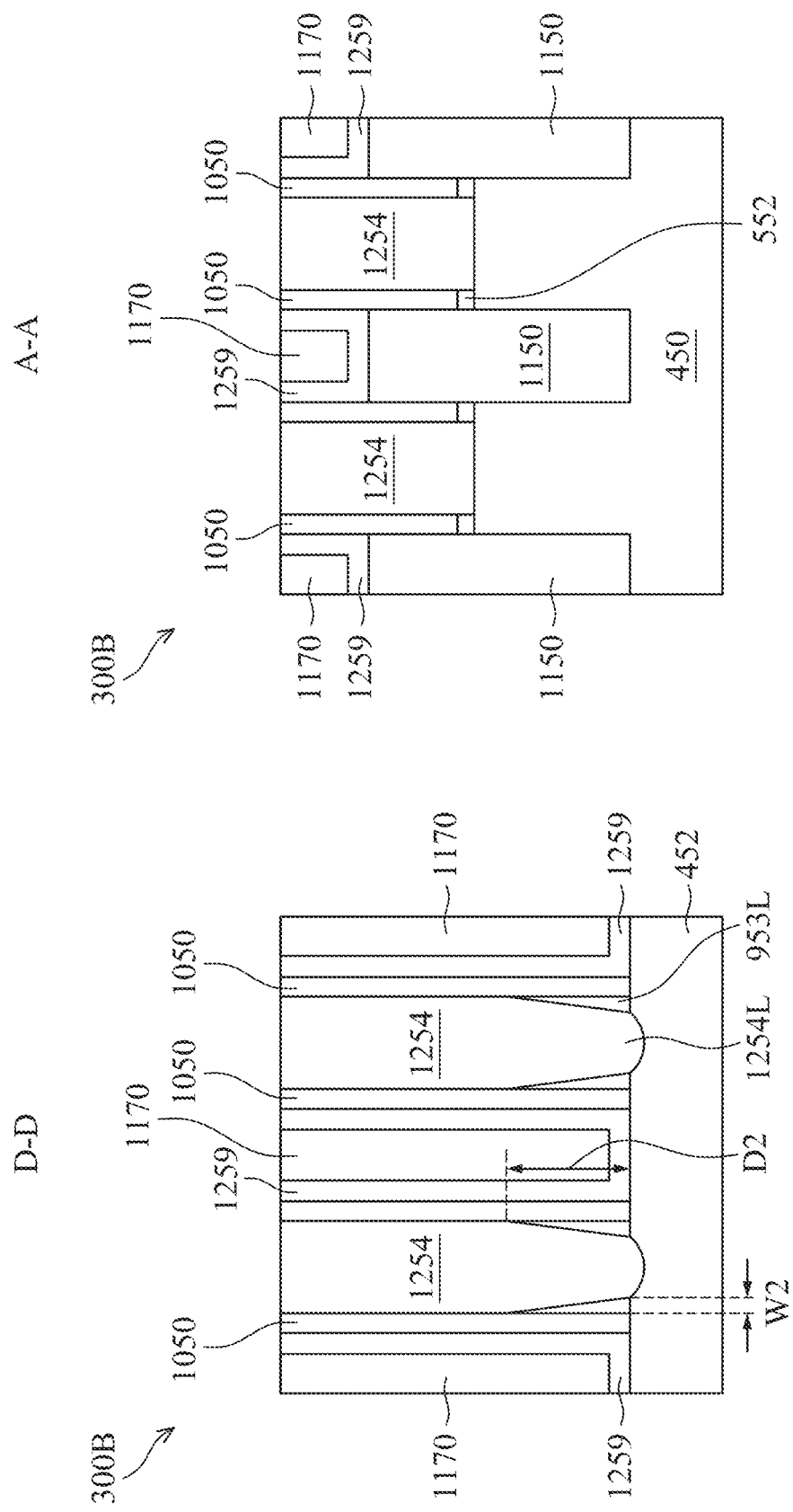
Figures 30A, 30B:
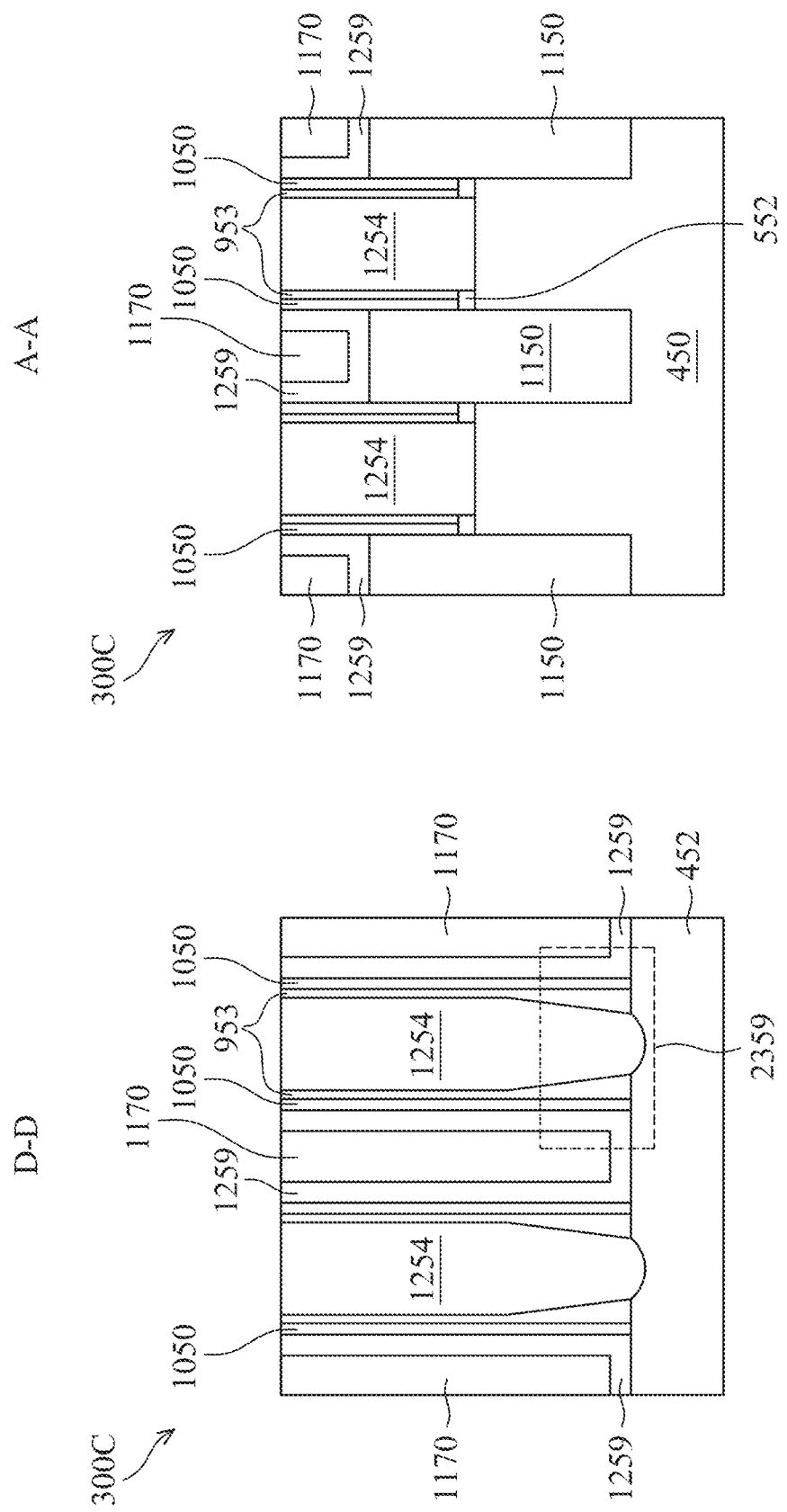

Next, in FIGS. 28A and 28B, the metal gate structures 1254 are formed in the recesses 1358, using the same or similar processing as FIGS. 24A and 24B. In FIG. 30A, a width W2 of the lower portions 953L of the gate fill material 953 is between about 0 angstrom and about 500 angstroms (e.g., 0 angstrom≤W2≤500 angstroms). A height D2 of the lower portions 953L, which is the same as the height of the lower portions 1254L of the metal gate structure 1254, is between about 0 angstrom and about 1000 angstroms (e.g., 0 angstrom≤D2≤1000 angstroms). Note that in the illustrated embodiment of FIG. 28A, upper portions of the metal gate structure 1254 has straight sidewalls, and the lower portions of the metal gate structures 1254 has sloped or curved sidewalls. In FIG. 28A, a bottom surface of the metal gate structure 1254 is curved and extends into the isolation regions 452.

Figures 29A, 29B:
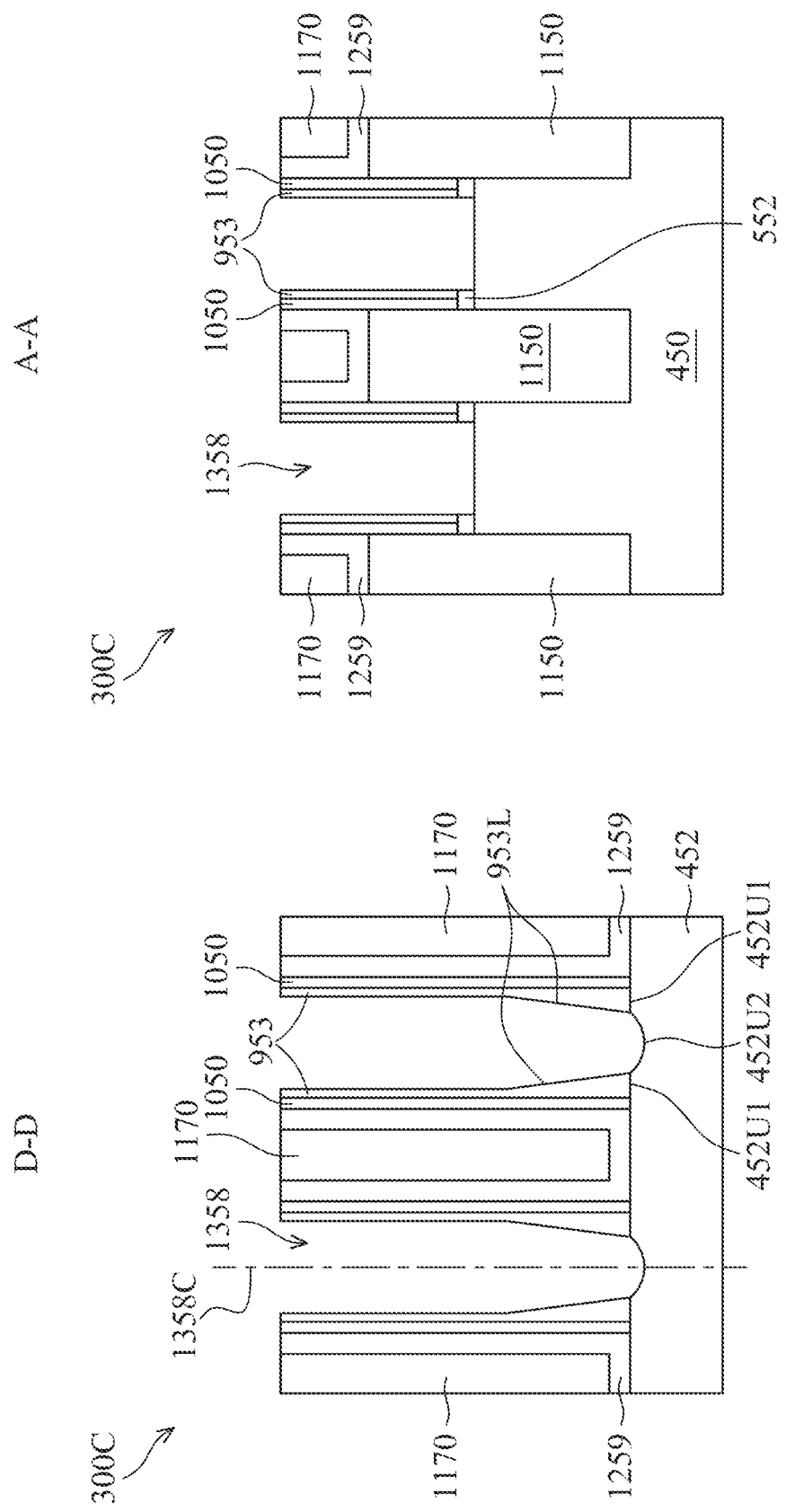
Figure 30C:
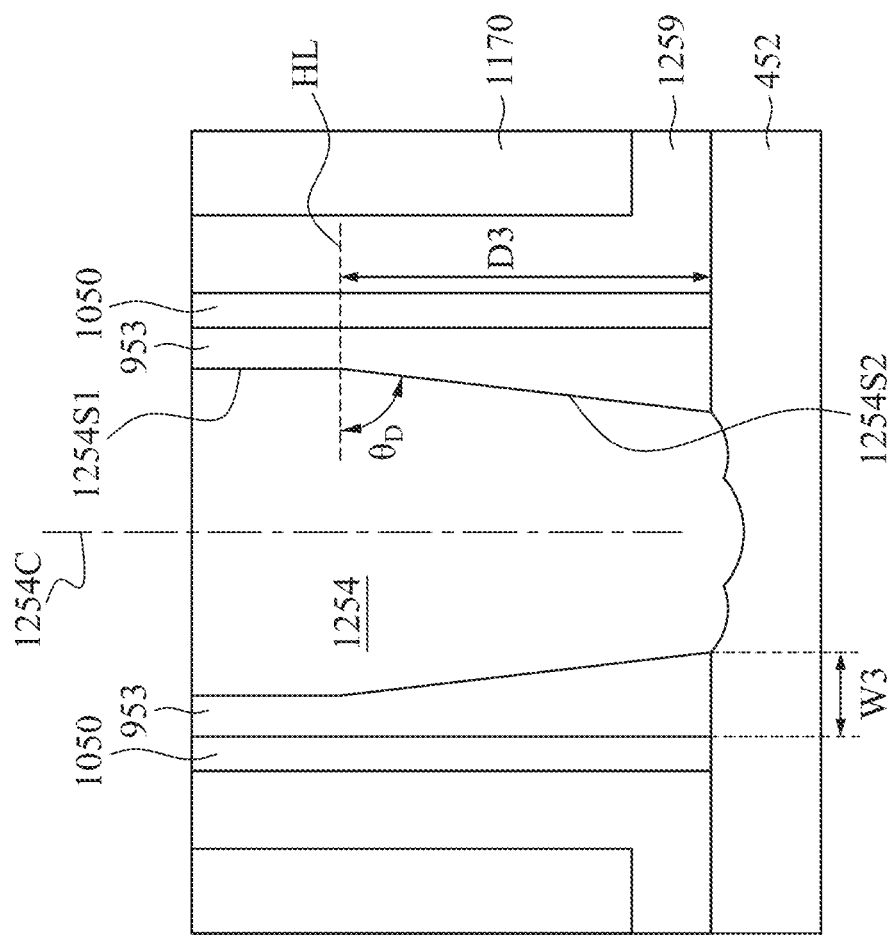

FIGS. 29A, 29B, 30A, and 30B illustrate cross-sectional views of a FinFET device 300C in the low density area 350 at various stages of fabrication, in an embodiment. FIG. 30C illustrates a zoomed-in view of an area 2359 in FIG. 30A. The FinFET device 300C in FIGS. 29A and 29B is similar to the FinFET device 300A in FIGS. 25A and 25B, but with the process condition of the second etching process adjusted such that, after the second etching process, lower portions 953L of the gate fill material 953 are thicker than the upper portion 953U of the gate fill material 73.

Referring to FIG. 29A, lower portions 953L of the remaining gate fill material 953 are thicker than upper portions 953U of the remaining gate fill material 953. The inner sidewalls of the lower portions 953L of the remaining gate fill material 953 (e.g., facing the recesses 1358) are sloped or curved toward a center axis 1358C of the recess 1358. The inner sidewalls of the upper portions 953U may be straight (e.g., perpendicular to the upper surface of the substrate), or may be sloped toward the center axis 1358C of the recess 1358 as the gate fill material 953 extends toward the isolation regions 452. FIG. 29A further illustrates the curved (e.g., concave) upper surface 452U2 and the flat upper surface 452U1 of the isolation regions 452.

In some embodiments, after the second etching process, the gate fill material 953 comprises a first portion directly over the fin (see, e.g., 953 in FIG. 29B), wherein a thickness of the first portion remain a same as the first portion extends from an upper surface of the gate spacers 1050 to an upper surface of the fin 450. The gate fill material 953 further comprises a second portion (see, e.g., 953/953L in FIG. 29A) on a first side of the fin 450, where the second portion contacts the isolation regions 452, and a thickness of the second portion increases as the second portion extends toward the isolation regions 452.

Next, in FIGS. 30A and 30B, the metal gate structure 1254 is formed in the recess 1358. FIG. 30C illustrates a zoomed-in view of an area 2359 in FIG. 30A. As illustrated in FIG. 30C, the bottom surface of the metal gate structure 1254 is curved and extends into the isolation regions 452. The upper sidewall 1254S1 of the metal gate structure 1254 may be straight, and the lower sidewall 1254S2 of the metal gate structure 1254 may be sloped toward a center axis 1254C of the metal gate structure 1254. An angle θ_D between the lower sidewall 1254S2 and a horizontal line HL in FIG. 30C may be less than about 90 degrees. A height D3 of the lower portion of the metal gate structure 1254, measured between the isolation regions 452 and a location where the upper sidewall 1254S1 adjoins the lower sidewall 1254S2, is between about 0 angstrom and about 1000 angstroms (e.g., 0 angstrom≤D3≤1000 angstroms), in an embodiment. A thickness W3 of the lower portion of the gate fill material 953, measured at an interface between the gate fill material 953 and the isolation regions 452, is between about 0 angstroms and about 500 angstroms (e.g., 0 angstrom≤W3≤500 angstroms), in an embodiment.

Figure 31A:
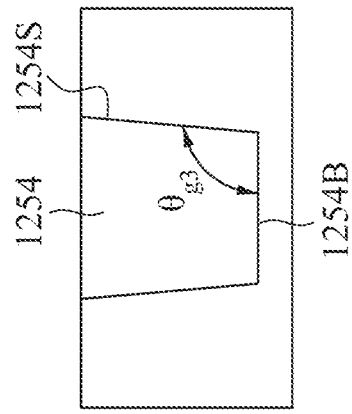
Figure 31B:
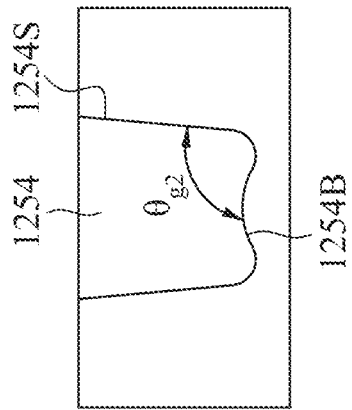
Figure 31C:
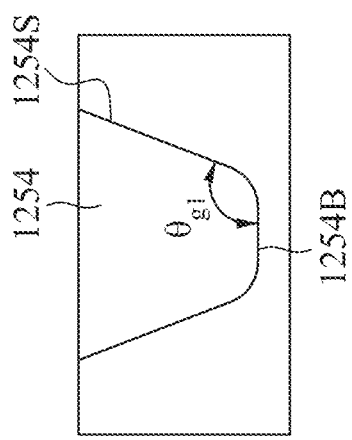

FIGS. 31A-31C illustrate various embodiment cross-sectional views of the bottom portion of the metal gate structure 1254 along cross-section D-D. By adjusting the second etching process, (e.g., by controlling the bias voltage to control lateral etching rate, and/or by tuning the selectivity of the second etching process), different shapes and/or sizes for the remaining portions of the gate fill material 953 (see, e.g., FIGS. 17A, 25A, 27A and 29A) can be achieved to control the shape/size of the bottom portion of the metal gate structure 1254. For example, in FIG. 31A, the bottom portion of the metal gate structure 1254 tapers off and has a curved bottom surface. In FIG. 31B, the metal gate structure 1254 has sloped sidewalls, and a bottom surface 1254B' of the metal gate structure 1254 has a slight arch (e.g., bends upwards) in the middle. In FIG. 31C, the bottom portion of metal gate structure 1254 has sloped sidewalls and a flat bottom surface 1254B'. An angle between the bottom surface 1254B' and a respective sidewall 1254S of the metal gate structure 1254, denoted as $\theta_{g1}$, $\theta_{g2}$, and $\theta_{g3}$ respectively in FIGS. 31A, 31B, and 31C, is larger than about 90 degrees. Without the current disclosed methods, the angle between the bottom surface 1254B' and a respective sidewall 1254S of the metal gate structure 1254 may be less than 90 degrees, and may not achieve a larger than 90 degree angle. The current disclosure allows larger than 90 degree angles to be formed, which may advantageously increase the volume of the metal gate structure 1254 and reduces the electrical resistance of the metal gate structure 1254.

FIGS. 32-37 illustrate cross-sectional views of a FinFET device 400 in the low density area at various stages of fabrication, in an embodiment. The FinFET device 400 illustrated may be a cross-sectional view of a portion of, e.g., the FinFET device 300A along a cross-section E-E illustrated in FIG. 23A (also illustrated in FIG. 10A). Note that the cross-section E-E is across the lower portion 554L (e.g., a lower portion that tapers off) of the gate electrode 554.

Figure 32:
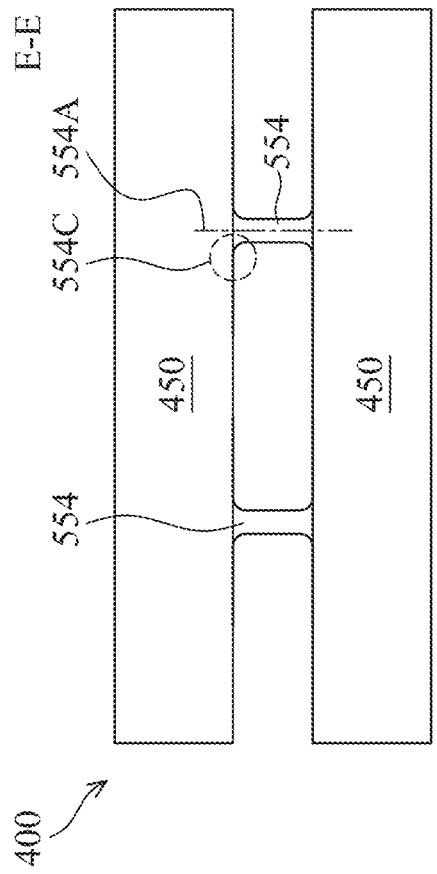

Referring to FIG. 32, the FinFET device 400 is at a same or similar processing step of FIGS. 10A and 10B. Due to the location of the cross-section E-E (e.g., near the end of the tapering portion of the gate electrode 554), the gate electrode 554 is shown as a thin strip. Note that for simplicity, only portions of the gate electrode 554 between the fins 450 are illustrated in FIGS. 32-37. FIG. 32 also illustrates the corner regions 554C of the gate electrode 554, which extends away from the longitudinal axis 554A of the gate electrode 554, therefore the cross-section of the gate electrode 554 in FIG. 32 has a concave shape. The shape of the corner regions 554C is caused by the etching process (see, e.g., FIG. 9A) to thin the lower portion of the gate electrode 554, because the etching process may have a slower etching rate in the corner regions (e.g., 554C).

Figure 33:
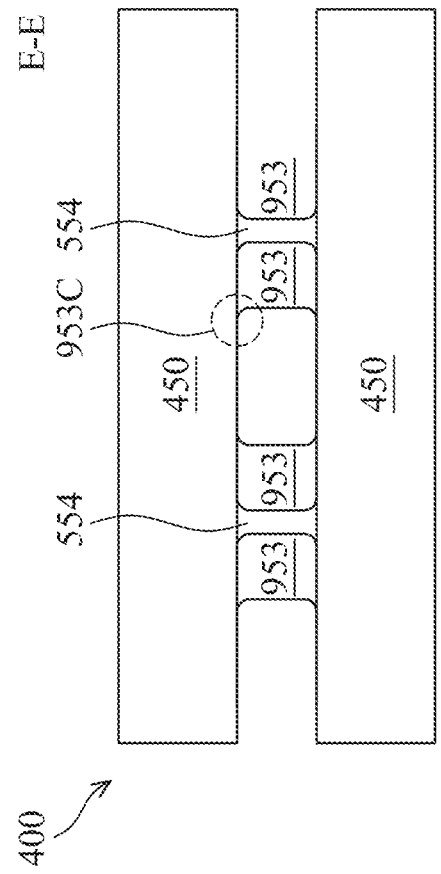

Next, in FIG. 33, the gate fill material 953 is formed. The gate fill material 953 may also have corner regions 953C similar to corner regions 953C, due to similar reasons (e.g., slower etching rate at corner regions). Therefore, FIG. 35 may correspond to the processing step of, e.g., FIGS. 23A and 23B.

Figure 34:
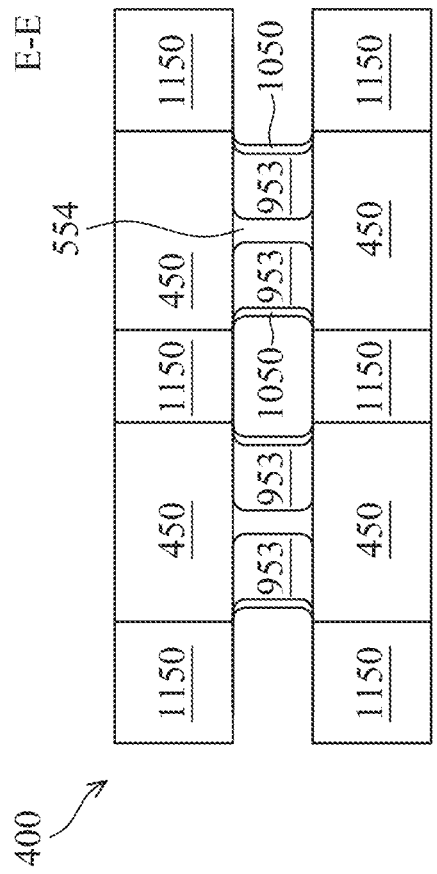

Next, in FIG. 34, gate spacers 1050 are formed along sidewalls of the gate fill material 953, and source/drain regions 1150 are formed over the fins 450. Due to the conformal deposition process and/or the etching process to form the gate spacers 1050, the gate spacers 1050 have similar corner regions.

Figure 35:
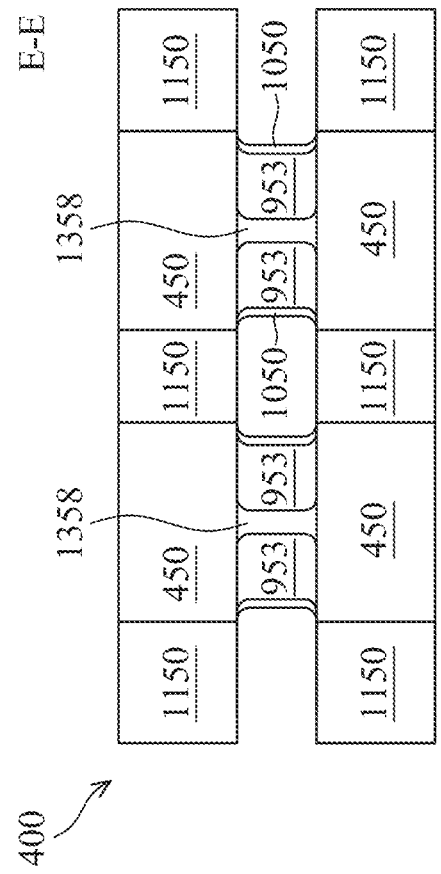

Next, in FIG. 35, the gate electrode 554 is removed by the first etching process, and the recesses 1358 are formed. Therefore, FIG. 35 may correspond to the processing step of FIGS. 24A and 24B.

Next, in FIG. 36, the second etching process is performed to remove portions of the gate fill material 953, and remaining portions of the gate fill material 953 are disposed along inner sidewalls of the gate spacers 1050. Note that due to the slower etching rate of the gate fill material 953 at the corner regions, after the second etching process, the inner sidewalls 953S of the gate fill material 953 at the corner regions bend toward a respective center axis 1358A of the recess 1358. Therefore, each of the recesses 1358 now has a convex shaped cross-section. FIG. 38 may correspond to the processing step of FIGS. 25A and 25B.

Next, in FIG. 37, the metal gate structure 1254 is formed to fill the recess 1358. Note that due to the recesses 1358 having a convex shape, the metal gate structures 1254 also have a convex shape. As a result, an angle θa between two adjacent sides in the corner region of the metal gate structure 1254 is larger than about 90 degrees and smaller than about 180 degree. Due to the convex shape of the metal gate structure 1254, corner regions of the metal gate structures 1254 bends inwards toward a center axis 1254A' of the metal gate structure 1254, thus away from the source/drain regions 1150. This advantageously increase the distance between the metal gate structures 1254 and the source/drain regions 1150 and reduces the leakage current (e.g., leakage current between the metal gate structure 1254 and the source/drain regions 1150) of the FinFET device formed. In contrast, without the currently disclosed formation methods, the metal gate structures 1254 may have had a concave cross-section, with corner regions extending outwards toward the source/drain regions 1150, which may have increased leakage current.

FIG. 38 illustrates a cross-sectional view of a FinFET device 400A, in the low density area in an embodiment. The FinFET device 400A is similar to the FinFET device 400 in FIG. 37, but with the gate fill material 953 only in corner regions, which may be due to a higher lateral etching rate of the etching process.

FIG. 39 illustrates a cross-sectional view of a FinFET device 400B, in the low density area, in an embodiment. The FinFET device 400B is similar to the FinFET device 400 in FIG. 37, but with the gate fill material 953 completely removed. Note that due to the over etching to completely remove the gate fill material 953, corner regions of the gate spacers 1050 bends inward, which again causes the cross-section of the metal gate structure 1254 to have a convex shape.

FIGS. 40-43 illustrate cross-sectional views of a FinFET device 400 in the high density area at various stages of fabrication, in an embodiment. The FinFET device 400 illustrated may be a cross-sectional view of a portion of, e.g., the FinFET device 300 along a cross-section E-E illustrated in FIG. 7A. Note that the cross-section E-E is across the lower portion 514L of the gate electrode 514.

Figure 40:
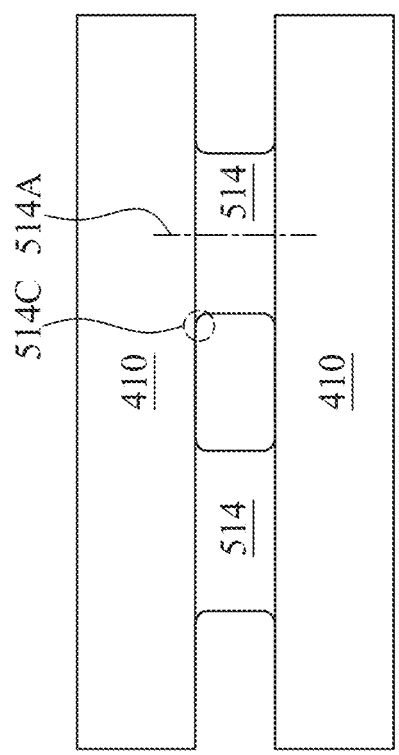

Referring to FIG. 40, the FinFET device 400 is at a same or similar processing step of FIGS. 7A and 7B. For simplicity, only portions of the gate electrode 514 between the fins 410 are illustrated in FIGS. 40-43. FIG. 40 also illustrates the corner regions 514C of the gate electrode 514, which extends away from the longitudinal axis 514A of the gate electrode 514, therefore the cross-section of the gate electrode 514 in FIG. 40 has a concave shape.

Figure 41:
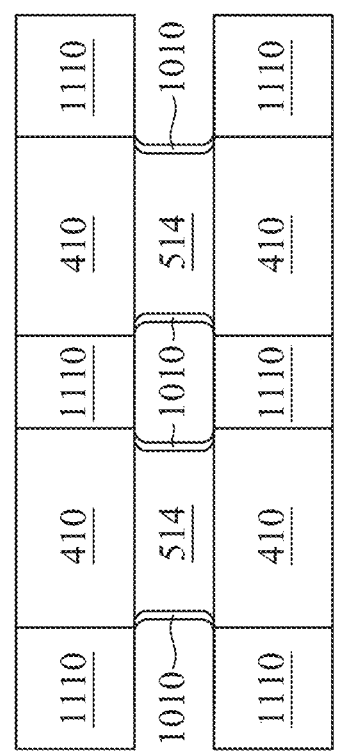

Next, in FIG. 41, gate spacers 1010 are formed along sidewalls of the dummy gate electrode 514, and source/drain regions 1110 are formed over the fins 410. Due to the conformal deposition process and/or the etching process to form the gate spacers 1010, the gate spacers 1010 have similar corner region as the dummy gate electrode 514.

Figures 42, 43:
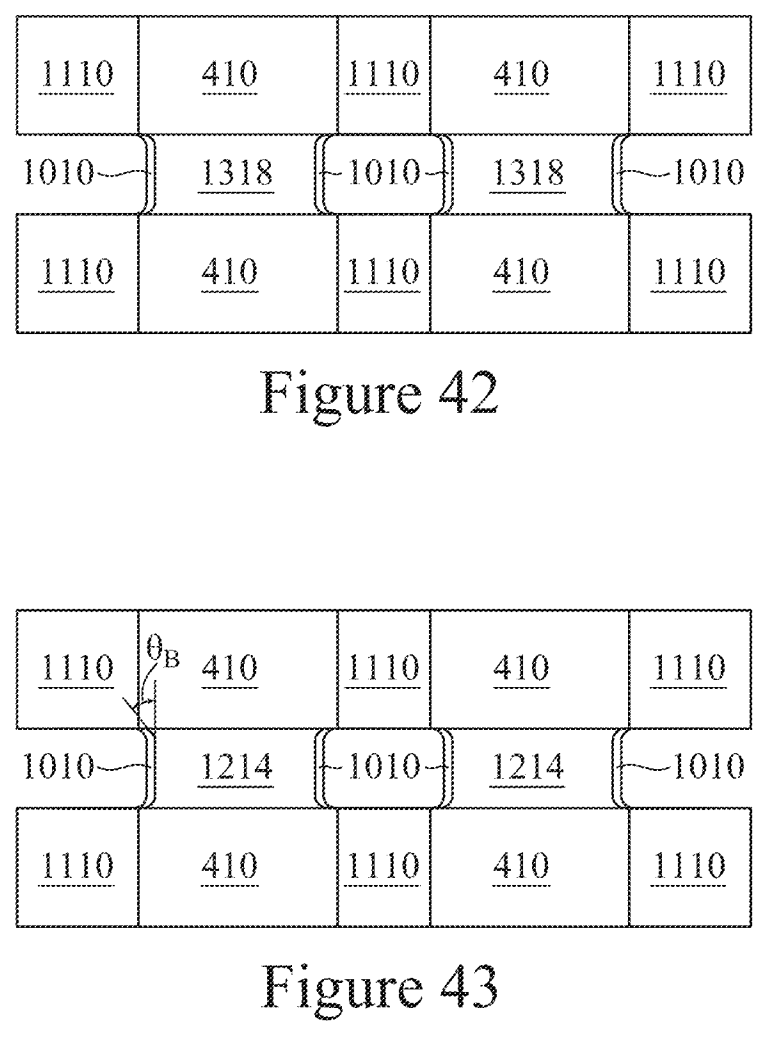

Next, in FIG. 42, the gate electrode 514 is removed by the etching process, and the recesses 1318 are formed. Therefore, FIG. 42 may correspond to the processing step of FIGS. 20A and 20B.

Next, in FIG. 43, the metal gate structure 1214 is formed to fill the recess 1318. Note that due to the recesses 1318 having a concave shape, the metal gate structures 1254 also have a concave shape. As a result, an angle $\theta_b+180°$ between two adjacent sides in the corner region of the metal gate structure 1214 is larger than about 180 degree. Due to the convex shape of the metal gate structure 1214, corner regions of the metal gate structures 1214 bends inwards toward a center axis of the metal gate structure 1214, thus towards the source/drain regions 1110.

Disclosed methods may allow controlling a profile of gate structures. For example, it may be possible to produce a device which does not have undesirably small critical dimensions in the low density area. Such small critical dimensions may lead to a poor device performance. Controlling profile(s) of gate structure(s) may allow producing devices with profile(s) of gate structure(s), which may lead to an improved device performance. Also disclosed methods may allow having higher yields when producing devices.

In one aspect of the present disclosure, a semiconductor device is disclosed. The semiconductor device includes a substrate. The semiconductor device includes a substrate including a first area and a second area. In the first area, the semiconductor device includes: a first fin formed over the substrate and extends along a first direction; a first shallow trench isolation (STI) structure, disposed on sides of the first fin along a second direction perpendicular to the first direction, that embeds a lower portion of the first fin; and a first gate structure having a bottom surface in contact with a first portion of a top surface of the first STI structure. The first portion of the top surface of the first STI structure includes a middle recessed portion and side portions laterally aligned with a remaining portion of the top surface of the first STI structure. In the second area, the semiconductor device in the second area includes: a second fin formed over the substrate and extends along the first direction; a second shallow trench isolation (STI) structure, disposed on sides of the second fin along the second direction, that embeds a lower portion of the second fin; and a second gate structure having a bottom surface in contact with a first portion of a top surface of the second STI structure. The first portion of the top surface of the second STI structure consists essentially of a recessed portion.

In another aspect of the present disclosure, a semiconductor device is disclosed. The semiconductor device includes a substrate including a first area and a second area. The semiconductor device in the first area includes a first fin that is formed over the substrate and extends along a first direction; and a first gate structure that straddles the first fin and extends along a second direction perpendicular to the first direction. The first gate structure has a bottom surface partially extending into a first isolation structure. The semiconductor device in the second area includes a second fin that is formed over the substrate and extends along the first direction; and a second gate structure that straddles the second fin and extends along the second direction. The second gate structure has a bottom surface fully extending into a second isolation structure.

In yet another aspect of the present disclosure, a method of making a semiconductor device is disclosed. The method includes forming a first fin and a second fin in a first area and a second area of a substrate, respectively; forming a first dummy gate structure and a second dummy gate structure straddling the first fin and second fin, respectively; forming a sacrificial layer extending along a bottom portion of the second dummy gate structure; and replacing the first dummy gate structure with a first metal gate structure and replacing the second dummy gate structure and the sacrificial layer with a second metal gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate including a first area and a second area;
wherein the semiconductor device in the first area comprises:
a first fin formed over the substrate and extends along a first direction;
a first shallow trench isolation (STI) structure, disposed on sides of the first fin along a second direction perpendicular to the first direction, that embeds a lower portion of the first fin; and
a first gate structure having a bottom surface in contact with a first portion of a top surface of the first STI structure;
wherein the first portion of the top surface of the first STI structure includes a middle recessed portion and side portions laterally aligned with a remaining portion of the top surface of the first STI structure and wherein the bottom surface of the first gate structure is in contact with (a) the middle recessed portion of the first portion of the top surface of the first STI structure and (b) each of the side portions of the first portion of the top surface of the first STI structure, and
wherein the semiconductor device in the second area comprises:
a second fin formed over the substrate and extends along the first direction;
a second shallow trench isolation (STI) structure, disposed on sides of the second fin along the second direction, that embeds a lower portion of the second fin; and
a second gate structure having a bottom surface in contact with a first portion of a top surface of the second STI structure; and
wherein the first portion of the top surface of the second STI structure consists essentially of a recessed portion.

2. The semiconductor device of claim 1, wherein a first density of transistors formed in the first area is less than a second density of transistors formed in the second area, an average intergate distance between two adjacent gates of the transistors in the first area is from 10 nm to 500 nm and an average intergate distance between adjacent gates of the transistors in the second area is at least 5 nm greater than the average intergate distance in the first area.

3. The semiconductor device of claim 1, wherein the first area further comprises a third gate structure having a bottom surface in contact with a second portion of the top surface of the first STI structure, the second portion of the top surface of the first STI structure, the second area further comprises a fourth gate structure having a bottom surface in contact with a second portion of the top surface of the second STI structure, the second portion of the top surface of the first STI structure includes a middle recessed portion and side portions laterally aligned with a remaining portion of the top surface of the first STI structure; the second portion of the top surface of the second STI structure consists essentially of a recessed portion; and a first spacing between the first and third gate structures along the first direction is greater than a second spacing between the second and fourth gate structures along the first direction.

4. The semiconductor device of claim 3, wherein the first gate structure includes a first high-k dielectric layer following a profile of the first portion of the top surface of the first STI structure, and the third gate structure includes a second high-k dielectric layer following a profile of the second portion of the top surface of the first STI structure.

5. The semiconductor device of claim 3, wherein the second gate structure includes a third high-k dielectric layer following a profile portion of the first portion of the top surface of the second STI structure, and the fourth gate structure includes a fourth high-k dielectric layer following a profile of the second portion of the top surface of the second STI structure.

6. The semiconductor device of claim 3, wherein each of the first and third gate structures has sidewalls, facing toward or away from the first direction, that are spaced from each other with a first distance, the first distance being greater than a width of the middle recessed portions of the top surface of the first STI structure along the first direction.

7. The semiconductor device of claim 3, wherein each of the second and fourth gate structures has sidewalls, facing toward or away from the first direction, that are spaced from each other with a second distance, the second distance being equal to a width of the recessed portions of the top surface of the second STI structure along the first direction.

8. The semiconductor device of claim 1, wherein a width of each of the side portions along the first direction is from 3 Å to 1000 Å.

9. A semiconductor device, comprising:
a substrate including a first area and a second area;
wherein the semiconductor device in the first area comprises:
a first fin that is formed over the substrate and extends along a first direction; and
a first gate structure that straddles the first fin and extends along a second direction perpendicular to the first direction;
wherein the first gate structure has a bottom surface that includes an extended middle portion adjacent at each end with a flat side portion, wherein the extended middle portion protrudes into a first isolation structure and the flat side portion of each end of the extended middle portion does not protrude into the first isolation structure; and
wherein the semiconductor device in the second area comprises:
a second fin that is formed over the substrate and extends along the first direction; and
a second gate structure that straddles the second fin and extends along the second direction; and
wherein the second gate structure has a bottom surface that consists essentially of an extended portion that protrudes into second isolation structure over an entire distance between side walls of the second gate structure.

10. The semiconductor device of claim 9, wherein a first density of transistors formed in the first area is greater than a second density of transistors formed in the second area, an average intergate distance between two adjacent gates of the transistors in the first area is from 10 nm to 500 nm and an average intergate distance between adjacent gates of the transistors in the second area is at least 5 nm greater than average intergate distance in the first area.

11. The semiconductor device of claim 9, wherein the first isolation structure, disposed on sides of the first isolation structure, disposed on sides of the first fin along the second direction, that embeds a lower portion of the first fin, and the second isolation structure, disposed on sides of the second fin along the second direction, that embeds a lowere portion of the second fin.

12. The semiconductor device of claim 9, wherein the bottom surface of the first gate structure includes a side portion not extending into the first isolation structure.

13. The semiconductor device of claim 12, wherein the first gate structure has sidewalls, facing toward or away from the first direction, that are connected to the side portion of the bottom surface of the first gate structure.

14. The semiconductor device of claim 12, wherein a width of the side portion along the first direction is from 3 Å to 1000 Å.

15. The semiconductor device of claim 9, wherein the bottom surface of the second gate structure includes no portion not extending into the second isolation structure.

16. The semiconductor device of claim 15, wherein the second gate structure has sidewalls, facing toward or away from the first direction, that are connected to the bottom surface of the second gate structure.

* * * * *

UNITED STATES PATENT AND TRADEMARK OFFICE
CERTIFICATE OF CORRECTION

PATENT NO. : 11,688,643 B2
APPLICATION NO. : 17/245537
DATED : June 27, 2023
INVENTOR(S) : Shih-Yao Lin, Hsiao Wen Lee and Chih-Han Lin It is certified that error appears in the above-identified patent and that said Letters Patent is hereby corrected as shown below:

In the Claims

Claim 2, Column 25, Line 45: "transitors" should be --transistors--

Claim 3, Column 25, Lines 55-56: delete "the second portion of the top surface of the first STI structure,"

Claim 9, Column 26, Line 53: insert --a-- between "into" and "second"

Claim 10, Column 26, Lines 63-64: insert --the-- between "than" and "average"

Claim 11, Column 27, Line 2: "lowere" should be --lower--

Signed and Sealed this
Nineteenth Day of November, 2024

Katherine Kelly Vidal
*Director of the United States Patent and Trademark Office*